United States Patent
Wolf et al.

(10) Patent No.: US 10,330,903 B2
(45) Date of Patent: Jun. 25, 2019

(54) IMAGING OPTICAL UNIT FOR IMAGING AN OBJECT FIELD INTO AN IMAGE FIELD, AND PROJECTION EXPOSURE APPARATUS INCLUDING SUCH AN IMAGING OPTICAL UNIT

(71) Applicant: Carl Zeiss SMT GmbH, Oberkochen (DE)

(72) Inventors: Alexander Wolf, Oberkochen (DE); Hans-Juergen Rostalski, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/966,947

(22) Filed: Apr. 30, 2018

(65) Prior Publication Data

US 2018/0252904 A1 Sep. 6, 2018

Related U.S. Application Data

(63) Continuation of application No. PCT/EP2016/076774, filed on Nov. 7, 2016.

(30) Foreign Application Priority Data

Nov. 9, 2015 (DE) .................. 10 2015 221 984

(51) Int. Cl.
*G03F 7/20* (2006.01)
*G02B 17/06* (2006.01)

(52) U.S. Cl.
CPC ..... *G02B 17/0642* (2013.01); *G02B 17/0663* (2013.01); *G03F 7/70233* (2013.01); *G03F 7/70316* (2013.01)

(58) Field of Classification Search
CPC ............ G03F 7/70233; G03F 7/70008; G03F 7/70791

(Continued)

(56) References Cited

U.S. PATENT DOCUMENTS

| 5,891,806 A | 4/1999 | Shibuya et al. |
| 2007/0058269 A1 | 3/2007 | Mann et al. |

(Continued)

FOREIGN PATENT DOCUMENTS

| DE | 101 55 711 A | 5/2003 |
| DE | 10 2009 045 096 A1 | 10/2010 |

(Continued)

OTHER PUBLICATIONS

Ulrich et al., "Trends in optical design of projection lenses for UV- and EUV-lithography," Optomechatronic Micro/Nano Devices and Components III : Oct. 8-10, 2007, Lausanne, Switzerland; [Proceedings of SPIE, ISSN 0277-786X], SPIE, Bellingham, Wash, vol. 4146, Aug. 3, 2000 (Aug. 3, 2000), pp. 13-24, XP008016224.

(Continued)

*Primary Examiner* — Hung Nguyen
(74) *Attorney, Agent, or Firm* — Fish & Richardson P.C.

(57) ABSTRACT

An imaging optical unit for projection lithography has a plurality of mirrors for guiding imaging light from an object field into an image field. The object field is spanned by a first, larger object field dimension and along a second, smaller object field dimension. The imaging optical unit has at least two GI mirrors and at least one NI mirror. The NI mirror is arranged between two GI mirrors in the imaging light beam path. A used reflection surface of the NI mirror has an aspect ratio between a surface dimension along a first reflection surface coordinate and a surface dimension along a second reflection coordinate parallel to the second object (Continued)

field dimension. The aspect ratio being less than 4.5. An imaging optical unit with reduced production costs emerges.

20 Claims, 16 Drawing Sheets

(58) Field of Classification Search
USPC .................................................. 355/53, 67
See application file for complete search history.

(56) References Cited

U.S. PATENT DOCUMENTS

| 2012/0224160 A1* | 9/2012 | Dodoc | G02B 17/0657 |
| | | | 355/66 |
| 2016/0085061 A1* | 3/2016 | Schwab | G03F 7/70233 |
| | | | 355/67 |

FOREIGN PATENT DOCUMENTS

| DE | 10 2014 208 770 A1 | 1/2015 |
| DE | 10 2015 209 827 A1 | 9/2015 |
| JP | 2002/048977 A | 2/2002 |
| WO | WO 2008/141686 A1 | 11/2008 |
| WO | WO 2012/126867 A | 9/2012 |
| WO | WO 2015/014753 A1 | 2/2015 |

OTHER PUBLICATIONS

German Examination Report, with translation thereof, for corresponding Appl No. 10 2015 221 984.4, dated Jul. 28, 2016.
International Search Report for corresponding Appl No. PCT/EP2016/076774, dated Jan. 30, 2017.

* cited by examiner

IMAGING OPTICAL UNIT FOR IMAGING AN OBJECT FIELD INTO AN IMAGE FIELD, AND PROJECTION EXPOSURE APPARATUS INCLUDING SUCH AN IMAGING OPTICAL UNIT

CROSS-REFERENCE TO RELATED APPLICATIONS

The present application is a continuation of, and claims benefit under 35 USC 120 to, international application PCT/EP2016/076774, filed Nov. 7, 2016, which claims benefit under 35 USC 119 of German Application No. 10 2015 221 984.4, filed Nov. 9, 2015. The entire disclosure of these applications are incorporated by reference herein.

FIELD

The disclosure relates to an imaging optical unit or projection optical unit for imaging an object field into an image field. Further, the disclosure relates to an optical system including such a projection optical unit, a projection exposure apparatus including such an optical system, a method for producing a microstructured or nanostructured component using such a projection exposure apparatus and a microstructured or nanostructured component produced by such a method.

BACKGROUND

Projection optical units are known from, for example, JP 2002/048977 A, U.S. Pat. No. 5,891,806, which describes a "proximity type" projection exposure apparatus, DE 10 2015 209 827 A1, WO 2008/141 686 A1 and WO 2015/014 753 A1.

SUMMARY

The present disclosure seeks to develop an imaging optical unit of the type set forth at the outset in such a way that the production costs thereof are reduced.

In one aspect, the disclosure provides an imaging optical unit for projection lithography. The imaging optical unit includes a plurality of mirrors for guiding imaging light from an object field in an object plane into an image field in an image plane along an imaging light beam path. The object field is spanned by a first Cartesian object field coordinate along a first, larger object field dimension and a second Cartesian object field coordinate along a second object field dimension that is smaller than the first object field dimension. The imaging optical unit has at least two GI mirrors. The imaging optical unit has at least one NI mirror, which is arranged between two GI mirrors in the imaging light beam path. A used reflection surface of the NI mirror has an aspect ratio between a surface dimension along a first reflection surface coordinate and a surface dimension along a second reflection surface coordinate parallel to the second object field dimension. The aspect ratio is less than 4.5.

The imaging optical unit is designed for use in projection lithography, in particular for use in EUV projection lithography.

The second object field dimension can extend parallel to a scanning direction of a projection exposure apparatus, in which the imaging optical unit is used. The first reflection surface coordinate of the NI mirror does not, as a rule, extend parallel to the first Cartesian object field coordinate.

The aspect ratio of the used reflection surface of the NI mirror can be 4.4. This aspect ratio can also be smaller and can be 4.3. This aspect ratio can also be smaller and can be 4.2 or 4.1. This aspect ratio can be less than 4, can be less than 3.8, can be less than 3.5, and can be 3.4. This aspect ratio can be less than 3.4, can be less than 3.3, can be less than 3.2, and can be 3.1.

In some embodiments, the imaging optical unit has at least four GI mirrors. Such embodiments were found to be particularly suitable.

In some embodiments, the imaging optical unit has at least three GI mirrors, wherein the used reflection surface of these three GI mirrors has an aspect ratio between a surface dimension along a first reflection surface coordinate and a surface dimension along a second reflection surface coordinate parallel to the second object field dimension, and wherein the aspect ratio is greater than one. Such embodiments can ensure that a reflection surface dimension in a folding plane of the GI mirror does not become too large there. The second object field dimension regularly lies in this folding plane.

In some embodiments, a greatest diameter of a used reflection surface of the GI mirrors of the imaging optical unit is less than 400 mm. Such embodiments lead to advantageously compact GI mirror dimensions. The condition for the largest diameter of the used reflection surface can apply to each GI mirror of the imaging optical unit. The largest diameter can be 397.5 mm. The largest diameter can be less than 380 mm, can be less than 370 mm, and can be 368.1 mm.

In some embodiments, a greatest diameter of a used reflection surface of each mirror of the imaging optical unit is less than 850 mm. Such embodiments lead to advantageously compact mirror dimensioning. The last mirror in the imaging light beam path in particular, which predetermines an image-side numerical aperture, is advantageously compact. The largest diameter can be 840.2 mm, can be less than 800 mm, and can be 797.2 mm.

In some embodiments, the used reflection surfaces of the mirrors of the imaging optical unit can be accommodated in a cuboid, the edge length of which in a direction of an image field coordinate that extends parallel to the second Cartesian object field coordinate is less than 2000 mm. Overall, such embodiments are advantageously compact in the direction of the dimension extending parallel to the second image field coordinate. This edge length parallel to the second object field coordinate can be less than 1800 mm and can be 1766 mm.

Image field dimensions of the imaging optical unit can be greater than 1 mm×10 mm and can be 1 mm×26 mm or 1.2 mm×26 mm, for example.

In some embodiments, the imaging optical unit has an image-side numerical aperture of at least 0.5. Such an image-side numerical aperture leads to a high structure resolution of the imaging optical unit. The image-side numerical aperture can be 0.55 or 0.6 and can be even greater.

In some embodiments, an optical system includes an imaging optical unit according to the present disclosure and an illumination optical unit for illuminating the object field with illumination light from a light source. The advantages of such embodiments correspond to those which have already been explained above with reference to the imaging optical unit.

The light source can be an EUV light source. Alternatively, use can also be made of a DUV light source, that is to say, for example, a light source with a wavelength of 193 nm.

In some embodiments, a projection exposure apparatus includes an optical system according to the present disclosure and a light source for producing the illumination light. The advantages of such a projection exposure apparatus, of a production method that uses such a projection exposure apparatus, and a microstructured or nanostructured component made by such a method, correspond to those which have already been explained above with reference to the imaging optical unit and the optical system. In particular, a semiconductor component, for example a memory chip, may be produced using the projection exposure apparatus.

BRIEF DESCRIPTION OF THE DRAWINGS

Exemplary embodiments of the disclosure are explained in greater detail below with reference to the drawings, in which.

DETAILED DESCRIPTION

Figure 1:
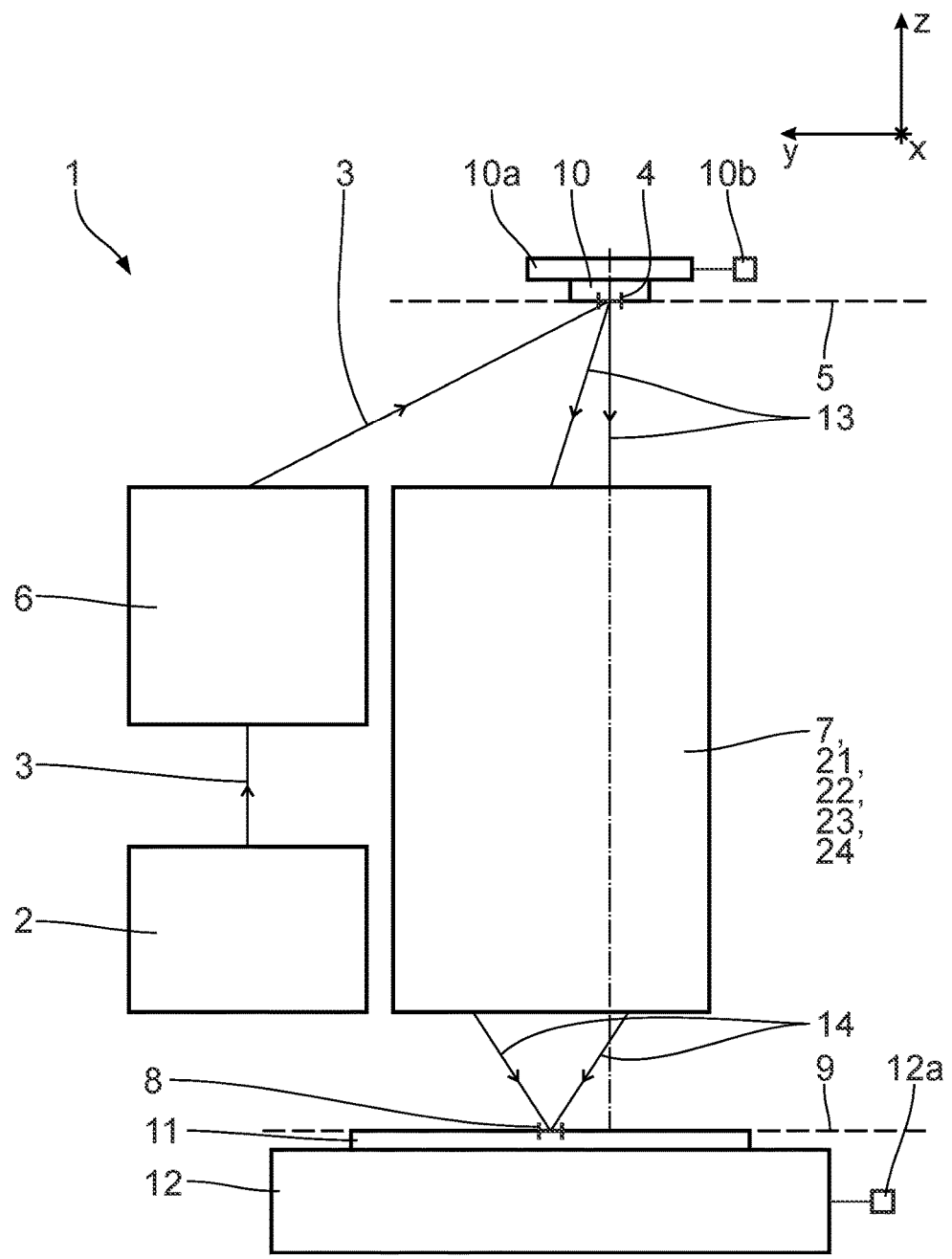
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. The light source 2 can be a plasma-based light source (laser-produced plasma (LPP), gas-discharge produced plasma (GDP)) or else a synchrotron-based light source, for example a free electron laser (FEL). In particular, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example, DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs toward the left, and the z-direction runs upward.

In the projection optical unit 7, the object field 4 and the image field 8 have a bent or curved embodiment and, in particular, an embodiment shaped like a partial ring. An absolute radius of curvature of the image field 8 is 81 mm. Alternatively, it is possible to embody the object field 4 and the image field 8 with a rectangular shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

Accordingly, the object field 4 is spanned by the first Cartesian object field coordinate x along the first, larger (longer) object field dimension and the second Cartesian object field coordinate y along the second, smaller (shorter) object field dimension. The third Cartesian coordinate z, which is perpendicular to these two object field coordinates x and y, is also referred to as normal coordinate below.

The first object field coordinate x and the normal coordinate z span a first imaging light plane xz, which is also referred to as sagittal plane below. The spanning coordinates x and z of the first imaging light plane xz contain the larger object field dimension x.

The second object field coordinate y and the normal coordinate z span a second imaging light plane xz, which is also referred to as meridional plane below.

Figure 2:
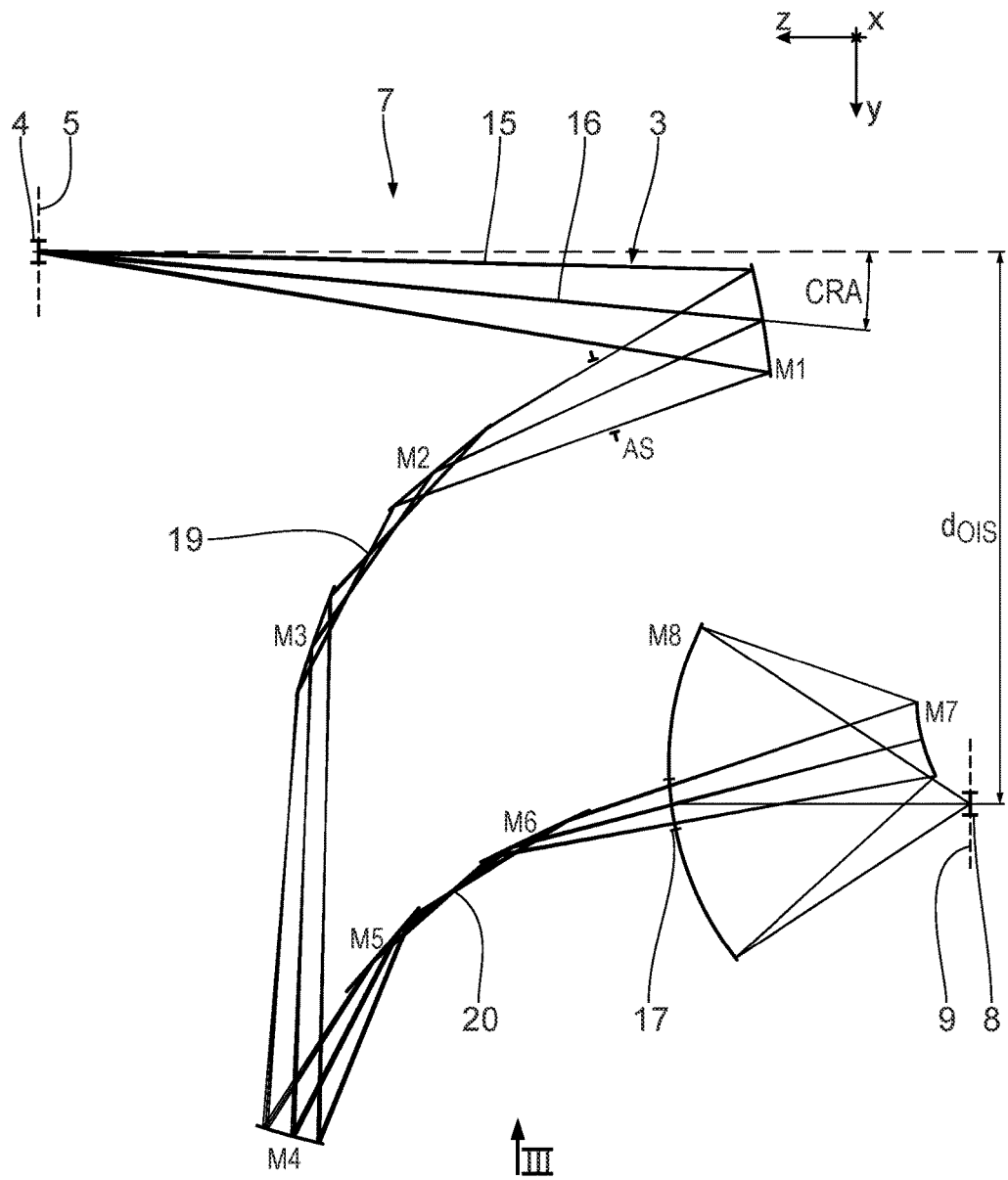
FIG. 2 shows, in a meridional section, an embodiment of an imaging optical unit which can be used as a projection lens in the projection exposure apparatus according to FIG. 1, wherein an imaging beam path for chief rays and for an upper coma ray and a lower coma ray of two selected field points is depicted.

One of the exemplary embodiments depicted in FIG. 2 et seq. can be used for the projection optical unit 7. The projection optical unit 7 according to FIG. 2 reduces by a factor of 4 in the first imaging light plane xz and reduces by factor of 8 in the second imaging light plane yz.

The projection optical unit 7 is an anamorphic projection optical unit. Other reduction scales in the two imaging light planes xz, yz are also possible, for example 3×, 5×, 6×, 7× or else reduction scales that are greater than 8×. Alternatively, the projection optical unit 7 may also have the respective same reduction scale in the two imaging light planes xz, yz, for example a reduction by a factor of 8. Then, other reduction scales are also possible, for example 4×, 5× or even reduction scales which are greater than 8×. The respective reduction scale may or may not bring about an image flip, which is subsequently also elucidated by an appropriate sign specification of the reduction scale.

In the embodiment of the projection optical unit 7 according to FIG. 2, the image plane 9 is arranged parallel to the object plane 5. What is imaged in this case is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

Figure 3:
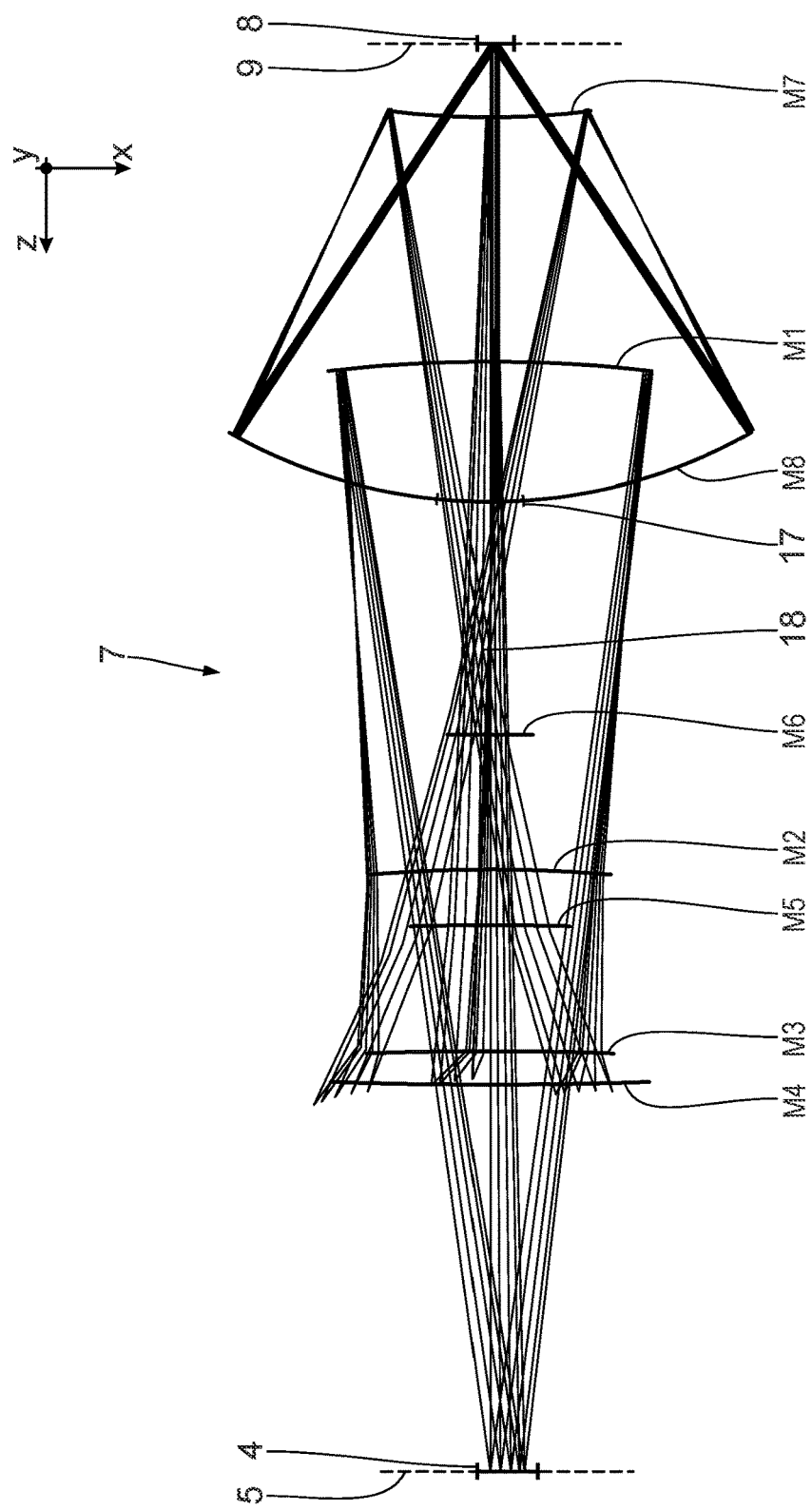
FIG. 3 shows a view of the imaging optical unit according to FIG. 2, as seen from the viewing direction III in FIG. 2.

FIGS. 2 and 3 show the optical design of a first embodiment of the projection optical unit 7. FIG. 2 shows the projection optical unit 7 in a meridional section, i.e. the beam path of the imaging light 3 in the yz plane. The meridional plane yz is also referred to as the second imaging light plane. FIG. 3 shows the imaging beam path of the projection optical unit 7 in the sagittal plane xz. A first imaging light plane $xz_{HR}$ is that plane which is spanned at the respective location of the beam path of the imaging light 3 by the first Cartesian object field coordinate x and a current imaging light main propagation direction $z_{HR}$. The imaging light main propagation direction $z_{HR}$ is the beam direction of a chief ray 16 of a central field point. As a rule, this imaging light main propagation direction $z_{HR}$ changes at each mirror reflection at the mirrors M1 to M8. This change can be described as a tilt of the current imaging light main propagation direction $z_{HR}$ about the first Cartesian object field coordinate x about a tilt angle which equals the deflection angle of this chief ray 16 of the central field point at the respectively considered mirror M1 to M8. Subsequently, the first imaging light plane $xz_{HR}$ is also referred to as first imaging light plane xz for simplification purposes.

The second imaging light plane yz likewise contains the imaging light main propagation direction $z_{HR}$ and is perpendicular to the first imaging light plane $xz_{HR}$.

Since the projection optical unit 7 is only folded in the meridional plane yz, the second imaging light plane yz coincides with the meridional plane.

FIG. 2 depicts the beam path of in each case three individual rays 15 emanating from five object field points which are spaced apart from one another in the y-direction in FIG. 2. What is depicted are chief rays 16, i.e. individual rays 15 which pass through the center of a pupil in a pupil plane of the projection optical unit 7, and in each case an upper coma ray and a lower coma ray of these two object field points. Proceeding from the object field 4, the chief rays 16 include an angle CRAO of 5.4° with a normal on the object plane 5.

The object plane 5 lies parallel to the image plane 9.

The projection optical unit 7 has an image-side numerical aperture of 0.55.

The projection optical unit 7 according to FIG. 2 has a total of eight mirrors, which, proceeding from the object field 4, are numbered M1 to M8 in the sequence of the beam path of the individual rays 15.

Figure 4:
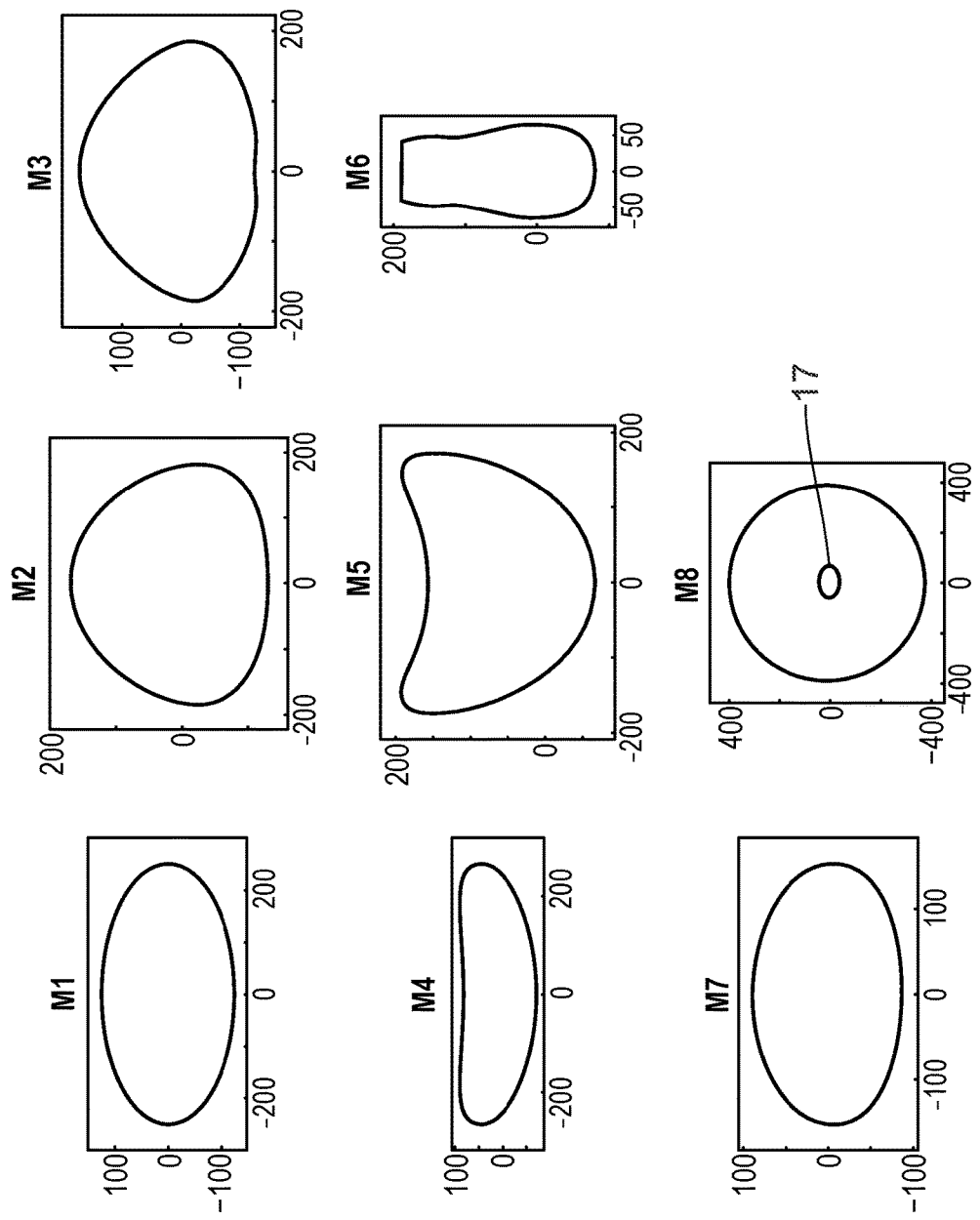
FIG. 4 shows plan views of marginal contours of optically used surfaces of the mirrors of the imaging optical unit according to FIGS. 2 and 3.

FIGS. 2 to 4 depict sections of the calculated reflection surfaces of the mirrors M1 to M8. A portion of these calculated reflection surfaces is used. Only this actually used region of the reflection surfaces, plus an overhang, is actually present in the real mirrors M1 to M8. These used reflection surfaces are carried in a known manner by mirror bodies.

In the projection optical unit 7 according to FIG. 2, the mirrors M1, M4, M7 and M8 are configured as mirrors for normal incidence, that is to say as mirrors onto which the imaging light 3 impinges with an angle of incidence that is smaller than 45°. Thus, overall, the projection optical unit 7 according to FIG. 2 has four mirrors M1, M4, M7 and M8 for normal incidence. These mirrors for normal incidence are also referred to as NI (normal incidence) mirrors.

The mirrors M2, M3, M5 and M6 are mirrors for grazing incidence of the illumination light 3, that is to say mirrors onto which the illumination light 3 impinges with angles of incidence that are greater than 60°. A typical angle of incidence of the individual rays 15 of the imaging light 3 on the mirrors M2, M3 and M5, M6 for grazing incidence lies in the region of 80°. Overall, the projection optical unit 7 according to FIG. 2 has exactly four mirrors M2, M3, M5 and M6 for grazing incidence. These mirrors for grazing incidence are also referred to as GI (grazing incidence) mirrors.

The mirrors M2 and M3 form a mirror pair arranged in succession directly in the beam path of the imaging light 3. The mirrors M5 and M6 also form a mirror pair arranged directly in succession in the beam path of the imaging light 3.

The mirror pairs M2, M3 on the one hand and M5, M6 on the other hand reflect the imaging light 3 in such a way that the angles of reflection of the individual rays 15 add up at the respective mirrors M2, M3 and M5, M6 of these two mirror pairs. Thus, the respective second mirror M3 and M6 of the respective mirror pair M2, M3 and M5, M6 increases a deflecting effect which the respective first mirror M2, M5 exerts on the respective individual ray 15. This arrangement of the mirrors of the mirror pairs M2, M3 and M5, M6 corresponds to that described in DE 10 2009 045 096 A1 for an illumination optical unit.

The mirrors M2, M3, M5 and M6 for grazing incidence each have very large absolute values for the radius, that is to say they have a relatively small deviation from a planar surface. These mirrors M2, M3, M5 and M6 for grazing incidence each have a comparatively weak refractive power, i.e. a lower beam-forming effect than a mirror which is concave or convex overall. The mirrors M2, M3, M5 and M6 contribute to a specific imaging aberration correction and, in particular, to a local imaging aberration correction.

A deflection direction is defined below on the basis of the respectively depicted meridional sections for the purposes of characterizing a deflecting effect of the mirrors of the projection optical unit 7. As seen in the respective incident beam direction in the meridional section, for example according to FIG. 2, a deflecting effect of the respective mirror in the clockwise direction, i.e. a deflection to the right, is denoted by the abbreviation "R". By way of example, the mirror M2 of the projection optical unit 7 has such a deflecting effect "R". A deflecting effect of a mirror in the counterclockwise direction, i.e. toward the left as seen from the beam direction respectively incident on this mirror, is denoted by the abbreviation "L". The mirrors M1 and M5 of the projection optical unit 7 are examples of the "L"

deflecting effect. A weakly deflecting effect, or an effect that does not deflect at all, of a mirror with a folding angle f, for which the following applies: $-1°<f<1°$, is denoted by the abbreviation "0". The mirror M7 of the projection optical unit 7 is an example for the "0" deflecting effect. Overall, the projection optical unit 7 for the mirrors M1 to M8 has the following sequence of deflecting effects: LRRRLL0R.

In principle, all described exemplary embodiments of the projection optical units can be mirrored about a plane extending parallel to the xz-plane without this changing fundamental imaging properties in the process. However, this naturally then changes the sequence of deflecting effects, which has the following sequence in the case of a projection optical unit which emerges by appropriate mirroring from the projection optical unit 7: RLLLRR0L.

A selection of the deflection effect, i.e. a selection of a direction of the respective incident beam, for example on the mirror M4, and a selection of a deflection direction of the mirror pairs M2, M3 and M5, M6, is respectively selected in such a way that an installation space that is available for the projection optical unit 7 is used efficiently.

The mirrors M1 to M8 carry a coating that optimizes the reflectivity of the mirrors M1 to M8 for the imaging light 3. This can be a ruthenium coating, a molybdenum coating or a molybdenum coating with an uppermost layer of ruthenium. In the mirrors M2, M3, M5 and M6 for grazing incidence, use can be made of a coating with e.g. one ply of molybdenum or ruthenium. These highly reflecting layers, in particular of the mirrors M1, M4, M7 and M8 for normal incidence, can be configured as multi-ply layers, wherein successive layers can be manufactured from different materials. Alternating material layers can also be used. A typical multi-ply layer can have fifty bilayers, respectively made of a layer of molybdenum and a layer of silicon.

For the purposes of calculating an overall reflectivity of the projection optical unit 7, a system transmission is calculated as follows: A mirror reflectivity is determined at each mirror surface depending on the angle of incidence of a guide ray, i.e. a chief ray of a central object field point, and combined by multiplication to form the system transmission.

Details in respect of calculating the reflectivity are explained in WO 2015/014 753 A1.

Further information concerning reflection at a GI mirror (grazing incidence mirror) can be found in WO 2012/126 867 A. Further information concerning the reflectivity of NI mirrors (normal incidence mirrors) can be found in DE 101 55 711 A.

An overall reflectivity or system transmission or overall transmission of the projection optical unit 7, emerging as a product of the reflectivities of all mirrors M1 to M8 of the projection optical unit 7, is approximately R=8%.

The mirror M8, that is to say the last mirror upstream of the image field 8 in the imaging beam path, has a passage opening 17 for the passage of the imaging light 3 which is reflected from the antepenultimate mirror M6 toward the penultimate mirror M7. The mirror M8 is used in a reflective manner around the passage opening 17. None of the other mirrors M1 to M7 have passage openings and the mirrors are used in a reflective manner in a continuous region without gaps.

In the first imaging light plane xz, the projection optical unit 7 has exactly one first plane intermediate image 18 in the imaging light beam path between the mirrors M6 and M7. This first plane intermediate image 18 lies in the region of the passage opening 17. A distance between the passage opening 17 and the image field 8 is more than four times greater than a distance between the passage opening 17 and the first plane intermediate image 18.

In the second imaging light plane yz that is perpendicular to the first imaging light plane xz (cf. FIG. 2), the imaging light 3 passes through exactly two second plane intermediate images 19 and 20. The first of these two second plane intermediate images 19 lies between the mirrors M2 and M3 in the imaging light beam path. The other of the two second plane intermediate images 20 lies between the mirrors M5 and M6 in the imaging beam path.

The number of the first plane intermediate images, i.e. exactly one first plane intermediate image in the projection optical unit 7, and the number of the second plane intermediate images, i.e. exactly two second plane intermediate images in the projection optical unit 7, differ from one another in the projection optical unit 7. In the projection optical unit 7, this number of intermediate images differs by exactly one.

The second imaging light plane yz, in which the greater number of intermediate images, namely the two second plane intermediate images 19 and 20, are present, coincides with the folding plane yz of the GI mirrors M2, M3 and M5, M6. The second plane intermediate images are not, as a rule, perpendicular to the chief ray 16 of the central field point which defines the imaging light main propagation direction $z_{HR}$. An intermediate image tilt angle, i.e. a deviation from this perpendicular arrangement, is arbitrary as a matter of principle and may lie between 0° and $+/-89°$.

Auxiliary devices 18a, 19a, 20a can be arranged in the region of the intermediate images 18, 19, 20. These auxiliary devices 18a to 20a can be field stops for defining, at least in sections, a boundary of the imaging light beam. A field intensity prescription device in the style of an UNICOM, in particular with finger stops staggered in the x-direction, can also be arranged in one of the intermediate image planes of the intermediate images 18 to 20.

The mirrors M1 to M8 are embodied as free-form surfaces which cannot be described by a rotationally symmetric function. Other embodiments of the projection optical unit 7, in which at least one of the mirrors M1 to M8 is embodied as a rotationally symmetric asphere, are also possible. It is also possible for all mirrors M1 to M8 to be embodied as such aspheres.

A free-form surface can be described by the following free-form surface equation (equation 1):

$$Z = \frac{c_x x^2 + c_y y^2}{1 + \sqrt{1 - (1+k_x)(c_x x)^2 - (1+k_y)(c_y y)^2}} + \quad (1)$$

$$C_1 x + C_2 y + C_3 x^2 + C_4 xy + C_5 y^2 + C_6 x^3 + \ldots +$$

$$C_9 y^3 + C_{10} x^4 + \ldots + C_{12} x^2 y^2 + \ldots + C_{14} y^4 + C_{15} x^5 +$$

$$\ldots + C_{20} y^5 + C_{21} x^6 + \ldots + C_{24} x^3 y^3 + \ldots + C_{27} y^6 + \ldots$$

The following applies to the parameters of this equation (1):

Z is the sag of the free-form surface at the point x, y, where $x^2+y^2=r^2$. Here, r is the distance from the reference axis of the free-form equation $(x=0; y=0)$.

In the free-form surface equation (1), $C_1$, $C_2$, $C_3$ . . . denote the coefficients of the free-form surface series expansion in powers of x and y.

In the case of a conical base area, $c_x$, $c_y$ is a constant corresponding to the vertex curvature of a corresponding asphere. Thus, $c_x=1/R_x$ and $c_y=1/R_y$ applies. Here, $k_x$ and $k_y$ each correspond to a conical constant of a corresponding asphere. Thus, equation (1) describes a biconical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and the differentiability thereof. Examples for this are analytical functions.

FIG. 4 shows marginal contours of the reflection surfaces in each case impinged upon by the imaging light 3 on the mirrors M1 to M8 of the projection optical unit 7, i.e. the so-called footprints of the mirrors M1 to M8. These marginal contours are in each case depicted in an x/y-diagram, which corresponds to the local x- and y-coordinates of the respective mirror M1 to M8. The illustrations are true to scale in millimeters. Moreover, the passage opening 17 is depicted in the illustration relating to the mirror M8.

The following table summarizes the parameters "maximum angle of incidence", "extent of the reflection surface in the x-direction", "extent of the reflection surface in the y-direction" and "maximum mirror diameter" for the mirrors M1 to M8:

|  | M1 | M2 | M3 | M4 | M5 | M6 | M7 | M8 |
|---|---|---|---|---|---|---|---|---|
| Maximum angle of incidence [°] | 16.8 | 82.6 | 79.3 | 14.4 | 83.3 | 83.6 | 20.0 | 8.6 |
| Extent of the reflection surface in the x-direction [mm] | 490.6 | 369.9 | 397.5 | 529.7 | 347.2 | 128.4 | 307.9 | 796.0 |
| Extent of the reflection surface in the y-direction [mm] | 248.5 | 298.7 | 269.3 | 157.5 | 258.6 | 279.3 | 177.6 | 778.5 |
| Maximum mirror diameter [mm] | 490.6 | 371.0 | 397.5 | 529.7 | 358.1 | 283.6 | 307.9 | 797.2 |

On account of the second plane intermediate images 19 and 20 in the region of the GI mirrors M2, M3, M5 and M6, these GI mirrors, too, do not have an extreme extent in the y-direction. A y/x-aspect ratio of corresponding surface dimension of the reflection surfaces of these GI mirrors M2, M3, M5 and M6 is only greater than 1 for the mirror M6 and is approximately 2.2 there. None of the GI mirrors has a y/x-aspect ratio that is greater than 2.2. The y/x-aspect ratio deviates most strongly from the value of 1 at the mirrors M4 in the case of the mirrors M1 to M8 of the projection optical unit 7 and there it has a value of approximately 1:3.4. In all other mirrors, the y/x-aspect ratio lies in the range between 2.25:1 and 1:2.25.

The mirror M8 that predetermines the image-side numerical aperture has the largest maximum mirror diameter with a diameter of 797.2 mm. None of the other mirrors M1 to M7 has a maximum diameter which is greater than 70% of the maximum mirror diameter of the mirror M8. Seven of the eight mirrors have a maximum diameter that is less than 530 mm. Six of the eight mirrors have a maximum diameter that is less than 400 mm. In particular, all four GI mirrors M2, M3, M5 and M6 of the projection optical unit 7 have a maximum diameter that is less than 400 mm.

A pupil-defining aperture stop AS is arranged in the imaging light beam path between the mirrors M1 and M2 in the projection optical unit 7. In the region of the aperture stop AS, the entire imaging light beam is accessible over its entire circumference.

The optical design data of the reflection surfaces of the mirrors M1 to M8 of the projection optical unit 7 can be gathered from the following tables. These optical design data in each case proceed from the image plane 9, i.e. describe the respective projection optical unit in the reverse propagation direction of the imaging light 3 between the image plane 9 and the object plane 5.

The first of these tables provides an overview of the design data of the projection optical unit 7 and summarizes the numerical aperture NA, the calculated design wavelength for the imaging light, the reduction factors βx and βy in the two imaging light planes xz and yz, the dimensions of the image field in the x-direction and y-direction, image field curvature, an image aberration value rms and a stop location. This curvature is defined as the inverse radius of curvature of the field. The image aberration value is specified in ma, (ml), i.e. it depends on the design wavelength. Here, this is the rms value of the wavefront aberration.

The second of these tables indicates vertex point radii (Radius_x=$R_x$, Radius_y=$R_y$) and refractive power values (Power_x, Power_y) for the optical surfaces of the optical components. Negative radii values denote curves that are concave toward the incident illumination light 3 at the intersection of the respective surface with the considered plane (xz, yz) that is spanned by a surface normal at the vertex point with the respective direction of curvature (x, y). The two radii Radius_x, Radius_y may have explicitly different signs.

The vertex points at each optical surface are defined as points of incidence of a guide ray which travels from an object field center to the image field 8 along a plane of symmetry x=0, i.e. the plane of the drawing of FIG. 2 (meridional plane).

The refractive powers Power_x ($P_x$), Power_y ($P_y$) at the vertex points are defined as:

$$P_x = -\frac{2 \cos AOI}{R_x}$$

$$P_y = -\frac{2}{R_y \cos AOI}$$

Here, AOI denotes an angle of incidence of the guide ray with respect to the surface normal.

The third table indicates for the mirrors M1 to M8 in mm the conic constants $k_x$ and $k_y$, the vertex point radius $R_x$ (=Radius_x) and the free-form surface coefficients $C_n$. Coefficients $C_n$ that are not tabulated have the value 0 in each case.

The fourth table still specifies the magnitude along which the respective mirror, proceeding from a reference surface, was decentered (DCY) in the y-direction, and displaced (DCZ) and tilted (TLA, TLC) in the z-direction. This corresponds to a parallel shift and a tilting in the case of the freeform surface design method. Here, a displacement is carried out in the y-direction and in the z-direction in mm, and tilting is carried out about the x-axis and about the z-axis. In this case, the angle of rotation is specified in degrees. Decentering is carried out first, followed by tilting. The reference surface during decentering is in each case the first surface of the specified optical design data. Decentering in the y-direction and in the z-direction is also specified for the object field 4. In addition to the surfaces assigned to the individual mirrors, the fourth table also tabulates the image plane as the first surface, the object plane as the last surface and optionally a stop surface (with the label "Stop").

The fifth table still specifies the transmission data of the mirrors M8 to M1, namely the reflectivity thereof for the angle of incidence of an illumination light ray incident centrally on the respective mirror. The overall transmission is specified as a proportional factor remaining from an incident intensity after reflection at all mirrors in the projection optical unit.

The sixth table specifies a boundary of the stop AS as a polygonal line in local coordinates xyz. As described above, the stop AS is decentered and tilted.

TABLE 1 for FIG. 2

| Exemplary embodiment | FIG. 2 |
|---|---|
| NA | 0.55 |
| Wavelength | 13.5 nm |
| beta_x | 4.0 |
| beta_y | −8.0 |
| Field dimension_x | 26.0 mm |
| Field dimension_y | 1.0 mm |
| Field curvature | 0.012345 1/mm |
| rms | 6.38 ml |
| Stop | AS |

Table 3a for FIG. 2

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −802.50220330 | 1243.50833900 | 22312.00679000 |
| C7 | 4.85422738e−09 | −1.10124327e−06 | 3.74610966e−08 |
| C9 | 7.18145215e−09 | −1.23749863e−06 | −2.8294067e−08 |
| C10 | −3.30933113e−11 | 1.13040963e−09 | 1.07114581e−10 |
| C12 | −6.07276398e−11 | 5.81614962e−09 | −1.47027594e−11 |
| C14 | −2.19699403e−11 | 5.41786865e−09 | −9.22980287e−11 |
| C16 | 1.2529286e−14 | −4.65721628e−12 | −2.44004417e−13 |
| C18 | 3.57525204e−14 | −2.17441266e−11 | 9.21757333e−14 |
| C20 | 1.54469467e−14 | −1.31152306e−11 | −2.16387941e−13 |
| C21 | −5.78496382e−17 | 3.79034877e−15 | −1.24133606e−15 |
| C23 | −1.75402378e−16 | 4.67344887e−14 | −5.28479755e−16 |
| C25 | −1.6867679e−16 | 1.0218487e−13 | −6.99885553e−16 |
| C27 | −5.0066194e−17 | 8.60105303e−14 | −6.14088227e−16 |
| C29 | 2.41962297e−20 | −3.41493347e−17 | −9.64493071e−18 |
| C31 | 9.54008439e−20 | −2.77443047e−16 | −1.10620144e−17 |
| C33 | 8.62911805e−20 | −4.27136772e−16 | −2.38591705e−18 |
| C35 | 3.06810403e−20 | −3.96481139e−16 | −1.52996781e−18 |
| C36 | −9.49878915e−23 | 2.56283044e−20 | 2.50941142e−19 |
| C38 | −4.04628869e−22 | 4.41860202e−19 | 2.15384959e−19 |
| C40 | −6.38784166e−22 | 1.97203693e−18 | 1.43829194e−19 |
| C42 | −4.24266693e−22 | 3.8723228e−18 | 1.83536295e−20 |
| C44 | −9.63539115e−23 | 2.09002325e−18 | −3.2343075e−21 |
| C46 | 4.27367614e−26 | −2.39900704e−22 | −1.5902046e−21 |
| C48 | 2.25739256e−25 | −3.94241942e−21 | 2.48435372e−21 |
| C50 | 3.40555516e−25 | −1.32645387e−20 | 1.50741344e−21 |
| C52 | 2.50767942e−25 | −2.41941145e−20 | 1.44847456e−23 |
| C54 | 6.31767248e−26 | −1.44567056e−20 | 1.36023061e−23 |
| C55 | −1.14156531e−28 | −3.59772628e−25 | −1.59047894e−22 |
| C57 | −7.04262728e−28 | 3.75691126e−24 | −3.64084904e−23 |
| C59 | −1.42525165e−27 | 2.65423247e−23 | −4.53171863e−24 |
| C61 | −1.36315348e−27 | 6.57151804e−23 | −5.32955976e−24 |
| C63 | −6.45715404e−28 | 2.90531881e−23 | −9.34085875e−25 |
| C65 | −1.40785044e−28 | 1.00456746e−22 | 1.82858911e−25 |
| C67 | 1.11172135e−31 | −3.93999722e−27 | 1.05351666e−24 |
| C69 | 5.99618803e−31 | −2.6778863e−26 | 8.43744328e−26 |
| C71 | 1.01644152e−30 | −5.75732629e−26 | −1.73430971e−25 |
| C73 | 8.91032389e−31 | 8.55034755e−26 | −7.84026675e−26 |
| C75 | 3.84721585e−31 | 5.76888561e−25 | −3.1275055e−27 |
| C77 | 6.45952447e−32 | 6.20707141e−25 | 6.92666259e−28 |
| C78 | −4.67456965e−34 | 1.31144272e−29 | 1.69211417e−26 |
| C80 | −2.64593025e−33 | 5.14418461e−29 | 1.74151568e−27 |
| C82 | −7.95615629e−33 | 3.36679465e−28 | 1.86625109e−27 |
| C84 | −1.3103537e−32 | 1.43843695e−27 | −6.28256188e−28 |
| C86 | −1.11888544e−32 | 3.37581122e−27 | −1.8204036e−28 |
| C88 | −4.79970403e−33 | 7.22562446e−27 | −7.64275523e−31 |
| C90 | −8.32563472e−34 | −6.07736036e−29 | 9.042147e−31 |
| C92 | −6.66723925e−38 | 2.69073098e−33 | 0 |
| C94 | −2.26214693e−37 | −1.22568055e−30 | 0 |
| C96 | 2.3985196e−37 | −9.01274512e−30 | 0 |
| C98 | 1.82545447e−36 | −3.75361828e−29 | 0 |
| C100 | 2.08198826e−36 | −9.53216447e−29 | 0 |
| C102 | 7.71704055e−37 | −1.32501141e−28 | 0 |
| C104 | 1.48278618e−37 | −8.71910506e−29 | 0 |
| C105 | 6.36031163e−40 | −1.17611618e−34 | 0 |
| C107 | 3.05864811e−39 | 6.89106973e−34 | 0 |

Table 2 for FIG. 2

| Surface | Radius_x [mm] | Power_x [1/mm] | Radius_y [mm] | Power_y [1/mm] | Operating |
|---|---|---|---|---|---|
| M8 | −802.5022033 | 0.0024725 | −736.5041758 | 0.0027372 | REFL |
| M7 | 1243.5083386 | −0.0016083 | 408.9827364 | −0.0048902 | REFL |
| M6 | 22312.0067884 | −0.0000171 | −16523.5937662 | 0.0006351 | REFL |
| M5 | 4163.9295323 | −0.0001084 | 18509.1514396 | −0.0004789 | REFL |
| M4 | −1806.9481349 | 0.0010804 | −1096.9073876 | 0.0018680 | REFL |
| M3 | 4670.5254167 | −0.0001206 | −2109.0449047 | 0.0033674 | REFL |
| M2 | 1429.2250169 | −0.0003655 | −7307.6455425 | 0.0010478 | REFL |
| M1 | −2048.6462811 | 0.0009424 | −1454.2373585 | 0.0014247 | REFL |

Table 3a for FIG. 2

| Coefficient | M8 | M7 | M6 |
|---|---|---|---|
| C109 | 1.19510104e−38 | 1.18211346e−32 | 0 |
| C111 | 3.26134462e−38 | 6.84415336e−32 | 0 |
| C113 | 4.54844445e−38 | 2.22650877e−31 | 0 |
| C115 | 3.1790603e−38 | 4.75226303e−31 | 0 |
| C117 | 1.11615375e−38 | 5.20368105e−31 | 0 |
| C119 | 1.7028603e−39 | 3.37791747e−31 | 0 |
| C121 | 7.09450969e−43 | 0 | 0 |
| C123 | 7.07503038e−42 | 0 | 0 |
| C125 | 2.01498298e−41 | 0 | 0 |
| C127 | 3.10462528e−41 | 0 | 0 |
| C129 | 2.89416996e−41 | 0 | 0 |
| C131 | 1.77146401e−41 | 0 | 0 |
| C133 | 7.32317896e−42 | 0 | 0 |
| C135 | 1.39621644e−42 | 0 | 0 |
| C136 | −2.96560175e−45 | 0 | 0 |
| C138 | −2.26575326e−44 | 0 | 0 |
| C140 | −8.91865658e−44 | 0 | 0 |
| C142 | −2.21194891e−43 | 0 | 0 |
| C144 | −3.36496878e−43 | 0 | 0 |
| C146 | −3.11967074e−43 | 0 | 0 |
| C148 | −1.70730657e−43 | 0 | 0 |
| C150 | −5.11020132e−44 | 0 | 0 |
| C152 | −6.67658875e−45 | 0 | 0 |

Table 3b for FIG. 2

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 4163.92953200 | −1806.94813500 | 4670.52541700 |
| C7 | −2.10132761e−08 | −1.96042016e−09 | 1.62660277e−07 |
| C9 | −5.5879311e−08 | 3.22887466e−07 | −8.79201149e−08 |
| C10 | 6.60356299e−11 | −3.81682851e−12 | 1.08915894e−10 |
| C12 | 2.48281963e−11 | −2.19025544e−11 | −1.3244389e−10 |
| C14 | 1.92771173e−10 | −1.41550222e−09 | 1.12386197e−10 |
| C16 | 7.70206237e−14 | 6.80369184e−15 | 4.0728942e−13 |
| C18 | 9.37492897e−14 | −1.78308403e−13 | −5.63814016e−13 |
| C20 | 6.37804542e−13 | 3.31994899e−12 | 2.99697615e−13 |
| C21 | −7.62109976e−16 | 1.52010309e−17 | −7.87021013e−16 |
| C23 | −2.31567068e−16 | 3.25142814e−17 | 3.28215159e−16 |
| C25 | 5.85177474e−16 | −2.09682708e−16 | −9.61071038e−16 |
| C27 | 2.99541817e−15 | −1.35100083e−14 | 7.32414862e−16 |
| C29 | −4.91106991e−18 | 4.99874737e−20 | −3.51025207e−19 |
| C31 | −9.27434598e−19 | −2.8099415e−19 | −3.82994126e−20 |
| C33 | 3.0221538e−18 | 1.63143999e−18 | −2.57263738e−18 |
| C35 | 1.40322409e−17 | 1.30314788e−17 | 7.96878133e−19 |
| C36 | −2.37319526e−21 | 2.28892392e−23 | −2.63311888e−21 |
| C38 | −2.43593156e−20 | −4.74899498e−22 | 1.49767874e−21 |
| C40 | −3.73597452e−20 | −2.71606304e−21 | 4.4850654e−21 |
| C42 | −2.75480203e−21 | −3.77947198e−20 | 9.97805784e−22 |
| C44 | 6.50052182e−20 | −2.66467491e−19 | 7.10627982e−21 |
| C46 | −9.92859949e−23 | 2.01370768e−25 | −6.42903854e−24 |
| C48 | −2.71002436e−22 | −3.80209813e−24 | −1.0454636e−23 |
| C50 | −5.85944963e−22 | −3.16816605e−23 | −1.77246378e−23 |
| C52 | −2.44401021e−24 | −5.86338683e−22 | −4.25156431e−23 |
| C54 | 3.13651795e−22 | 4.61395099e−21 | 7.27525754e−23 |
| C55 | −2.81447556e−25 | 2.93595222e−28 | −3.18477132e−27 |
| C57 | −1.25304807e−24 | 7.34416289e−27 | −2.66231286e−26 |
| C59 | −2.52989315e−24 | 1.71633598e−25 | 6.56672764e−26 |
| C61 | −3.04309752e−24 | 6.15735146e−25 | 1.49215316e−25 |
| C63 | 5.79561246e−25 | 5.66886933e−24 | −4.84841763e−25 |
| C65 | 1.26297109e−24 | 5.90956041e−23 | 2.21369837e−25 |
| C67 | −3.16492539e−27 | 2.45670952e−30 | −4.18839007e−29 |
| C69 | −7.1955939e−27 | 1.25097063e−28 | −1.06626833e−29 |
| C71 | −8.05663512e−27 | 2.5799422e−27 | 3.82609687e−28 |
| C73 | −6.16735799e−27 | 1.66088461e−26 | 1.27614952e−27 |
| C75 | 2.45791988e−27 | 1.60858762e−25 | −1.01011905e−27 |
| C77 | 3.34992721e−27 | 5.11099651e−25 | 2.17655593e−28 |
| C78 | 8.93661109e−31 | 1.54942222e−33 | −2.07565832e−31 |

Table 3b for FIG. 2

| Coefficient | M5 | M4 | M3 |
|---|---|---|---|
| C80 | −1.57719074e−29 | −2.59783981e−32 | 4.13101141e−31 |
| C82 | −1.39846025e−30 | −1.12125967e−30 | −1.39211849e−30 |
| C84 | −1.60155592e−29 | −1.08554078e−29 | −4.47749969e−30 |
| C86 | 7.83403749e−31 | 3.00541444e−29 | 6.80498312e−32 |
| C88 | 1.03927553e−30 | 1.01025288e−28 | 1.31408439e−30 |
| C90 | 4.40879896e−30 | −3.17393318e−27 | −2.41376037e−31 |
| C92 | 0 | 1.21290856e−35 | 0 |
| C94 | 0 | −6.97164866e−34 | 0 |
| C96 | 0 | −3.76392034e−32 | 0 |
| C98 | 0 | −3.9154796e−31 | 0 |
| C100 | 0 | −1.00983894e−30 | 0 |
| C102 | 0 | −1.17861553e−29 | 0 |
| C104 | 0 | −7.56974861e−29 | 0 |
| C105 | 0 | −5.03089559e−39 | 0 |
| C107 | 0 | 1.21893179e−37 | 0 |
| C109 | 0 | −3.79618188e−36 | 0 |
| C111 | 0 | −2.53653057e−34 | 0 |
| C113 | 0 | −1.36970492e−33 | 0 |
| C115 | 0 | −6.98012733e−33 | 0 |
| C117 | 0 | −5.26436344e−32 | 0 |
| C119 | 0 | −3.64914866e−31 | 0 |

Table 3c for FIG. 2

| Coefficient | M2 | M1 |
|---|---|---|
| KY | 0.00000000 | 0.00000000 |
| KX | 0.00000000 | 0.00000000 |
| RX | 1429.22501700 | −2048.64628100 |
| C7 | 7.4622147e−08 | −2.31373688e−08 |
| C9 | −8.10665986e−08 | 9.69618686e−08 |
| C10 | 2.3651995e−10 | 7.70563479e−11 |
| C12 | −1.35391995e−10 | 1.62407858e−10 |
| C14 | −8.60024366e−11 | −1.55949448e−10 |
| C16 | −3.44597706e−13 | −9.83300637e−14 |
| C18 | −2.48577607e−13 | −3.20060625e−14 |
| C20 | 2.16024415e−13 | 4.37205194e−13 |
| C21 | 4.67712475e−16 | 1.37083456e−16 |
| C23 | −1.29361412e−15 | 4.83890959e−16 |
| C25 | 1.11170813e−15 | 1.45379564e−15 |
| C27 | 1.17088742e−15 | −1.23794576e−15 |
| C29 | −1.99954811e−18 | −7.79973128e−20 |
| C31 | −6.26403797e−19 | 1.67798127e−18 |
| C33 | 7.9948687e−18 | −1.67559956e−18 |
| C35 | −1.23676777e−18 | 5.71118565e−18 |
| C36 | 2.41757429e−21 | 9.22440784e−23 |
| C38 | −6.33033004e−21 | 1.16466581e−21 |
| C40 | 9.08593022e−21 | −3.51002077e−21 |
| C42 | 7.91314282e−21 | −9.11809175e−21 |
| C44 | −2.59058326e−20 | −2.61095722e−20 |
| C46 | −1.69806535e−23 | −1.09576134e−24 |
| C48 | −4.33727594e−23 | −9.67843942e−25 |
| C50 | −4.22905968e−23 | −1.41219977e−23 |
| C52 | −1.50413625e−22 | −2.22956868e−23 |
| C54 | 5.31164199e−23 | 2.31646331e−22 |
| C55 | −3.21318676e−26 | 2.98282317e−27 |
| C57 | 8.72314313e−26 | −9.88569935e−28 |
| C59 | 1.89674196e−25 | −4.04215227e−26 |
| C61 | −1.40693088e−25 | 9.15739511e−26 |
| C63 | 2.35769523e−25 | 1.62156366e−24 |
| C65 | 8.29420086e−25 | −4.13233056e−25 |
| C67 | −4.29878349e−29 | 1.66584653e−29 |
| C69 | 2.38881015e−29 | 1.23079349e−28 |
| C71 | 1.28270131e−27 | 5.50642326e−28 |
| C73 | 4.01624753e−27 | 2.89609863e−27 |
| C75 | 5.98305592e−27 | −2.31029808e−27 |
| C77 | 1.38915802e−27 | −2.6679793e−27 |
| C78 | 1.04493779e−30 | −2.55298292e−32 |
| C80 | −1.58146043e−30 | 8.91180571e−32 |
| C82 | −1.56362155e−30 | 9.46761877e−31 |
| C84 | 5.63052564e−30 | 3.0711769e−30 |

Table 3c for FIG. 2

| Coefficient | M2 | M1 |
|---|---|---|
| C86 | 1.95541207e-29 | -1.75342289e-29 |
| C88 | 1.35361791e-29 | -6.61302266e-29 |
| C90 | -8.57848052e-31 | -3.62265578e-29 |
| C92 | 0 | -1.19933805e-34 |
| C94 | 0 | -7.79292368e-34 |
| C96 | 0 | -4.28319407e-33 |
| C98 | 0 | -2.0509339e-32 |
| C100 | 0 | -4.49301451e-32 |
| C102 | 0 | 1.02922373e-31 |
| C104 | 0 | 2.23284149e-31 |
| C105 | 0 | 8.94654006e-38 |
| C107 | 0 | -4.41662281e-37 |
| C109 | 0 | -1.03211557e-35 |
| C111 | 0 | -4.02647882e-35 |
| C113 | 0 | -1.78956629e-35 |
| C115 | 0 | 5.52147433e-34 |
| C117 | 0 | 1.15153432e-33 |
| C119 | 0 | 3.53557632e-34 |

Table 4a for FIG. 2

| Surface | DCX | DCY | DCZ |
|---|---|---|---|
| Image | 0.00000000 | 0.00000000 | 0.00000000 |
| M8 | 0.00000000 | 0.00000000 | 692.70142831 |
| M7 | 0.00000000 | -150.28584966 | 111.59359570 |
| M6 | 0.00000000 | 91.27036997 | 1045.61507253 |
| M5 | 0.00000000 | 306.22020224 | 1333.94328576 |
| M4 | 0.00000000 | 770.16161797 | 1574.59599473 |
| M3 | 0.00000000 | -374.43222682 | 1523.77570437 |
| M2 | 0.00000000 | -766.22921483 | 1249.46634114 |
| Stop | 0.00000000 | -952.91164371 | 850.45570284 |
| M1 | 0.00000000 | -1125.64750674 | 481.25412677 |
| Object | 0.00000000 | -1287.17833311 | 2159.96480376 |

Table 4b for FIG. 2

| Surface | TLA [deg] | TLB [deg] | TLC [deg] |
|---|---|---|---|
| Image | -0.00000000 | 0.00000000 | -0.00000000 |
| M8 | -7.25005294 | 0.00000000 | -0.00000000 |
| M7 | -14.50010589 | 180.00000000 | 0.00000000 |
| M6 | 64.39760913 | 0.00000000 | -0.00000000 |
| M5 | 40.35585328 | 0.00000000 | 180.00000000 |
| M4 | -75.02066924 | 0.00000000 | -0.00000000 |
| M3 | 18.76967537 | 0.00000000 | 180.00000000 |
| M2 | 49.96195183 | 0.00000000 | -0.00000000 |
| Stop | -16.29884106 | 180.00000000 | 0.00000000 |
| M1 | -9.78845456 | 180.00000000 | 0.00000000 |
| Object | -0.00374113 | 0.00000000 | -0.00000000 |

Table 5 for FIG. 2

| Surface | Angle of incidence [deg] | Reflectivity |
|---|---|---|
| M8 | 7.20888333 | 0.66016470 |
| M7 | 0.12960115 | 0.66566464 |
| M6 | 79.01248894 | 0.86504588 |
| M5 | 76.95981254 | 0.83543426 |
| M4 | 12.55617051 | 0.64772556 |
| M3 | 73.64353526 | 0.77974628 |
| M2 | 74.85892611 | 0.80146525 |
| M1 | 15.13099267 | 0.63853353 |
| Overall transmis- | | 0.0821 |

Table 6 for FIG. 2

| X [mm] | Y [mm] | Z [mm] |
|---|---|---|
| 0.00000000 | 82.43009082 | 0.00000000 |
| 31.79239431 | 81.29896143 | 0.00000000 |
| 62.83013696 | 77.93470818 | 0.00000000 |
| 92.36959037 | 72.42536601 | 0.00000000 |
| 119.68996413 | 64.92012578 | 0.00000000 |
| 144.10694307 | 55.63281166 | 0.00000000 |
| 164.98868473 | 44.84406140 | 0.00000000 |
| 181.77450930 | 32.89878215 | 0.00000000 |
| 193.99658660 | 20.19617811 | 0.00000000 |
| 201.30371857 | 7.17073797 | 0.00000000 |
| 203.48438474 | -5.73573759 | 0.00000000 |
| 200.48525652 | -18.10720836 | 0.00000000 |
| 192.42071841 | -29.58358391 | 0.00000000 |
| 179.56818162 | -39.88041272 | 0.00000000 |
| 162.34630896 | -48.79671362 | 0.00000000 |
| 141.28022436 | -56.21519078 | 0.00000000 |
| 116.96363543 | -62.09879565 | 0.00000000 |
| 90.02718200 | -66.48455774 | 0.00000000 |
| 61.11784172 | -69.47043875 | 0.00000000 |
| 30.88942232 | -71.18579378 | 0.00000000 |
| 0.00000000 | -71.74270619 | 0.00000000 |
| -30.88942232 | -71.18579378 | 0.00000000 |
| -61.11784172 | -69.47043875 | 0.00000000 |
| -90.02718200 | -66.48455774 | 0.00000000 |
| -116.96363543 | -62.09879565 | 0.00000000 |
| -141.28022436 | -56.21519078 | 0.00000000 |
| -162.34630896 | -48.79671362 | 0.00000000 |
| -179.56818162 | -39.88041272 | 0.00000000 |
| -192.42071841 | -29.58358391 | 0.00000000 |
| -200.48525652 | -18.10720836 | 0.00000000 |
| -203.48438474 | -5.73573759 | 0.00000000 |
| -201.30371857 | 7.17073797 | 0.00000000 |
| -193.99658660 | 20.19617811 | 0.00000000 |
| -181.77450930 | 32.89878215 | 0.00000000 |
| -164.98868473 | 44.84406140 | 0.00000000 |
| -144.10694307 | 55.63281166 | 0.00000000 |
| -119.68996413 | 64.92012578 | 0.00000000 |
| -92.36959037 | 72.42536601 | 0.00000000 |
| -62.83013696 | 77.93470818 | 0.00000000 |
| -31.79239431 | 81.29896143 | 0.00000000 |

An overall reflectivity of the projection optical unit 7 is approximately 8%.

The reference axes of the mirrors are generally tilted with respect to a normal of the image plane 9, as is made clear by the tilt values in the tables.

The image field 8 has an x-extent of two times 13 mm and a y-extent of 1 mm. The projection optical unit 7 is optimized for an operating wavelength of the illumination light 3 of 13.5 nm.

A boundary of a stop surface of the stop (cf., also, table 6 for FIG. 2) emerges from intersection points on the stop surface of all rays of the illumination light 3 which, on the image side, propagate at the field center point in the direction of the stop surface with a complete image-side telecentric aperture. When the stop is embodied as an aperture stop, the boundary is an inner boundary.

The stop AS can lie in a plane or else have a three-dimensional embodiment. The extent of the stop AS can be smaller in the scan direction (y) than in the cross scan direction (x).

An installation length of the projection optical unit 7 in the z-direction, i.e. a distance between the object plane 5 and the image plane 9, is approximately 2160 mm.

In the projection optical unit 7, a pupil obscuration is 18% of the entire aperture of the entry pupil. Thus, less than 18% of the numerical aperture is obscured as a result of the passage opening 17. The obscuration boundary is constructed in a manner analogous to the construction of the stop boundary explained above in conjunction with the stop 18. When embodied as an obscuration stop, the boundary is an outer boundary of the stop. In a system pupil of the projection optical unit 7, a surface which cannot be illuminated due to the obscuration is less than 0.18% of the surface of the overall system pupil. The non-illuminated surface within the system pupil can have a different extent in the x-direction than in the y-direction. The non-illuminated surface in the system pupil can be round, elliptical, square or rectangular. Moreover, this surface in the system pupil which cannot be illuminated can be decentered in the x-direction and/or in the y-direction in relation to a center of the system pupil.

A y-distance do's between a central object field point and a central image field point is approximately 1290 mm. A working distance between the mirror M7 and the image plane 9 is 80 mm.

The mirrors of the projection optical unit 7 can be accommodated in a cuboid with the xyz-edge lengths of 796 mm×2033 mm×1577 mm.

The projection optical unit 7 is approximately telecentric on the image side.

A mean wavefront aberration rms is 6.38 mλ.

Figure 6:
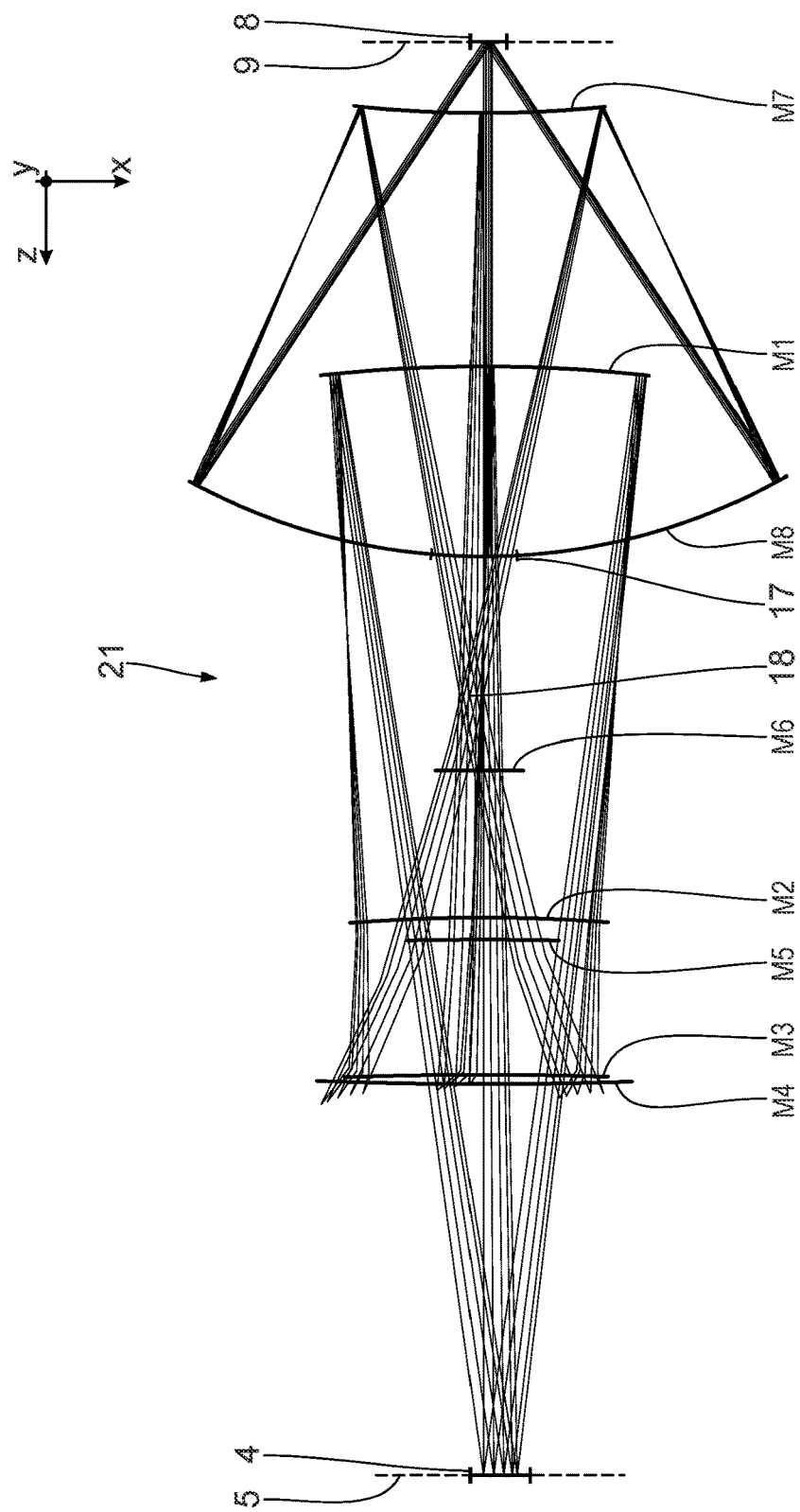
FIG. 6 shows a view of the imaging optical unit according to FIG. 5, as seen from the viewing direction VI in FIG. 5.
Figure 7:
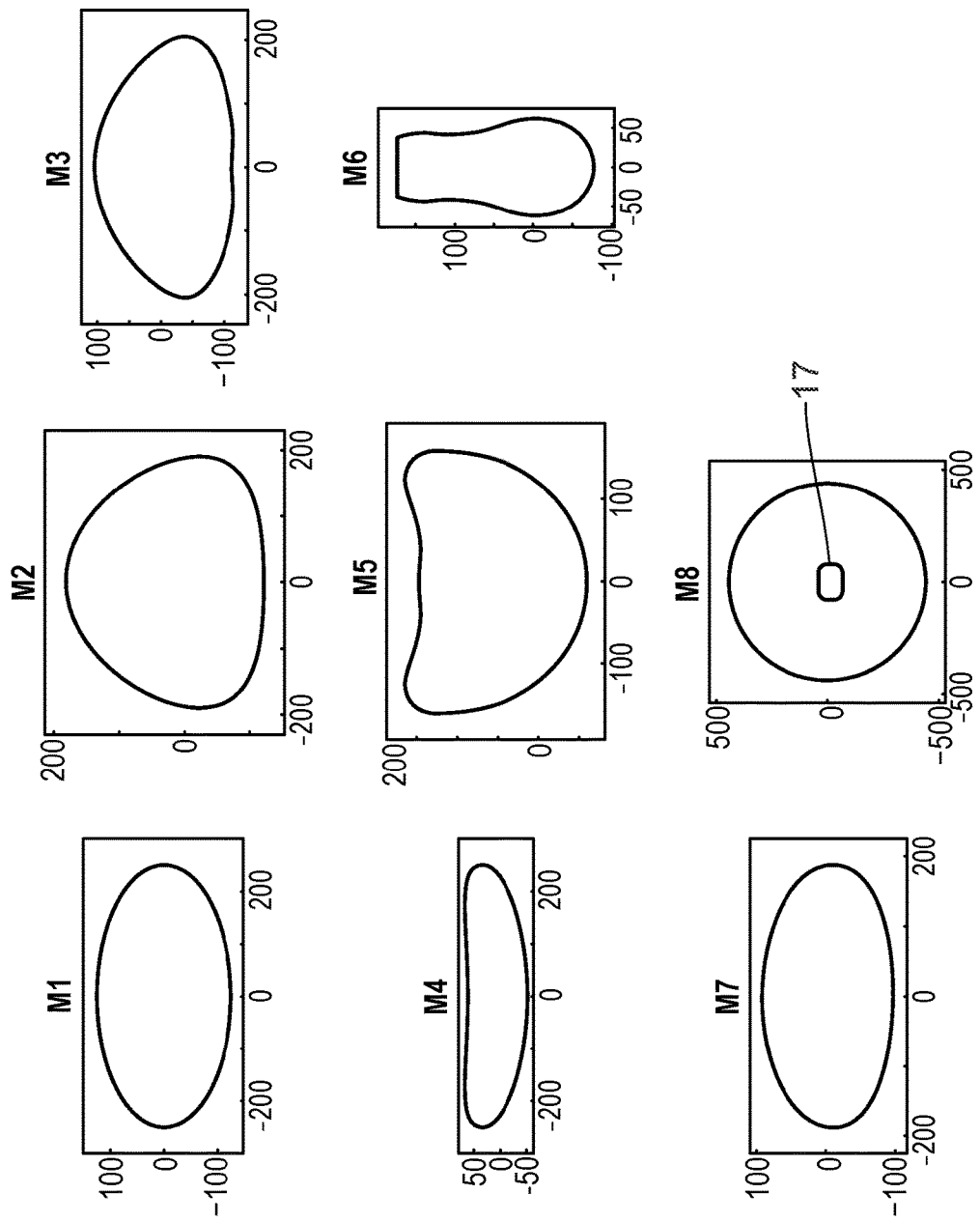
FIG. 7 shows plan views of marginal contours of optically used surfaces of the mirrors of the imaging optical unit according to FIGS. 5 and 6.

A further embodiment of a projection optical unit 21, which can be used in the projection exposure apparatus 1 according to FIG. 1 instead of the projection optical unit 7, is explained in the following text on the basis of FIGS. 5 to 7. Components and functions which have already been explained above in the context of FIGS. 1 to 4 are denoted, where applicable, by the same reference signs and are not discussed again in detail.

The mirrors M1 to M8 are once again embodied as free-form surface mirrors for which the free-form surface equation (1) indicated above holds true.

The following table once again shows the mirror parameters of mirrors M1 to M8 of the projection optical unit 21.

|  | M1 | M2 | M3 | M4 | M5 | M6 | M7 | M8 |
|---|---|---|---|---|---|---|---|---|
| Maximum angle of incidence [°] | 18.0 | 82.7 | 79.2 | 15.4 | 82.7 | 83.2 | 19.6 | 8.4 |
| Extent of the reflection surface in the x-direction [mm] | 500.0 | 387.8 | 412.1 | 495.9 | 320.5 | 123.3 | 377.8 | 909.0 |
| Extent of the reflection surface in the y-direction [mm] | 254.2 | 303.5 | 217.8 | 121.7 | 221.3 | 254.2 | 191.6 | 884.0 |
| Maximum mirror diameter [mm] | 500.1 | 390.0 | 412.2 | 496.1 | 326.3 | 258.1 | 378.0 | 909.4 |

Three of the four GI mirrors M2, M3, M5 and M6 have a y/x-aspect ratio of their respective reflection surface that is less than 1. The GI mirror M6 has a y/x-aspect ratio of its reflection surface that is less than 2.1. The mirror M4 has a y/x-aspect ratio of approximately 1:4.1.

Here too, the mirror M8 has the largest maximum mirror diameter, measuring 909.4 mm. The next largest mirror M1 has a maximum mirror diameter of 500.1 mm. All other mirrors M2 to M7 have a maximum mirror diameter that is less than 500 mm. Four of the eight mirrors have a mirror diameter that is less than 400 mm.

The optical design data from the projection optical unit 21 can be gathered from the following tables, which, in terms of their design, correspond to the tables for the projection optical unit 7 according to FIG. 2.

Figure 5:
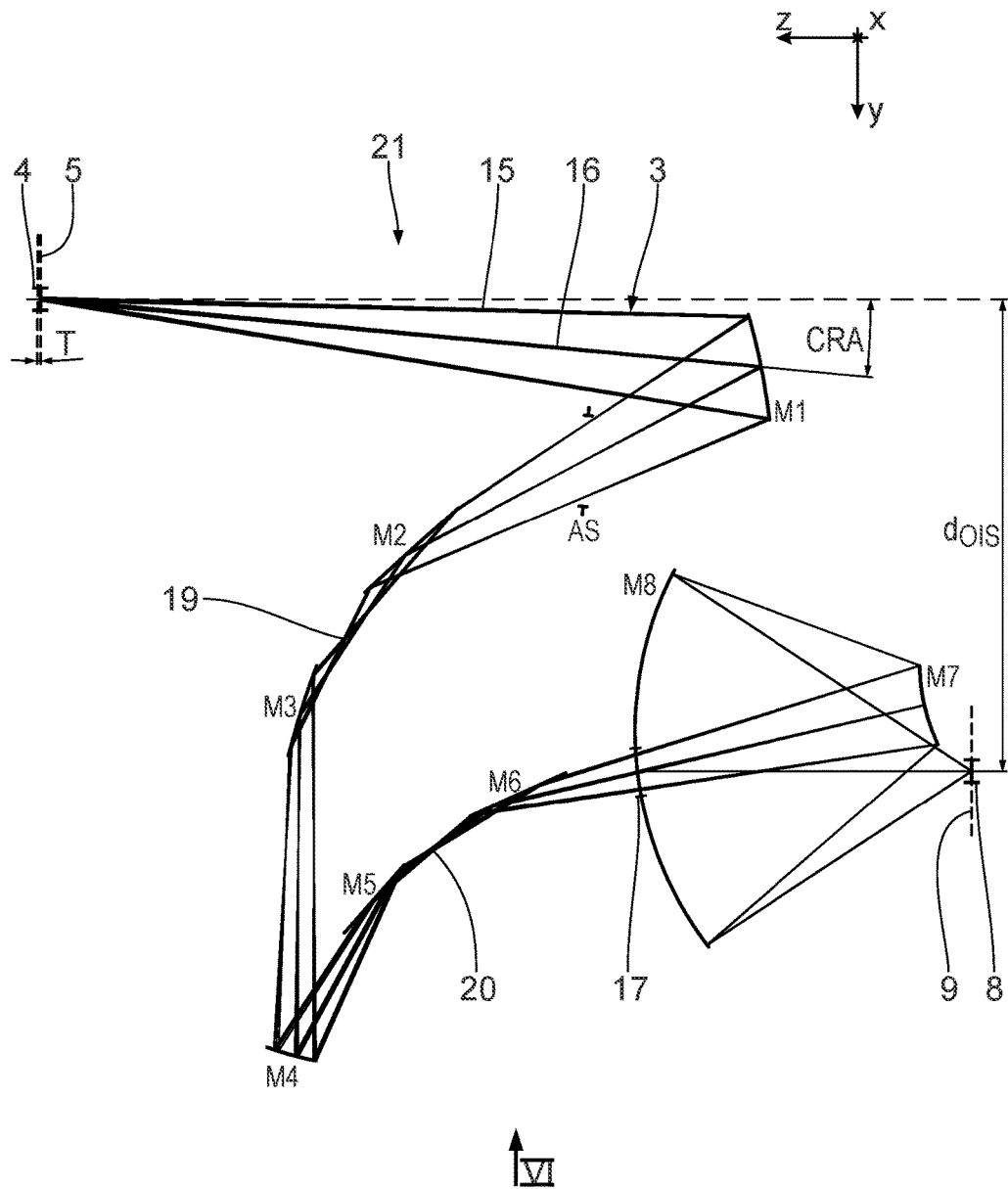
FIG. 5 shows, in an illustration similar to FIG. 2, a further embodiment of an imaging optical unit which can be used as a projection lens in the projection exposure apparatus according to FIG. 1.

Table 1 for FIG. 5

| Exemplary embodiment | FIG. 5 |
|---|---|
| NA | 0.55 |
| Wavelength | 13.5 nm |
| beta_x | 4.0 |
| beta_y | −8.0 |
| Field dimension_x | 26.0 mm |
| Field dimension_y | 1.2 mm |
| Field curvature | 0.012345 1/mm |
| rms | 7.32 ml |
| Stop | AS |

Table 2 for FIG. 5

| Surface | Radius_x [mm] | Power_x [1/mm] | Radius_y [mm] | Power_y [1/mm] | Operating |
|---|---|---|---|---|---|
| M8 | −940.0617618 | 0.0021140 | −840.2295581 | 0.0023956 | REFL |
| M7 | 1928.9734306 | −0.0010368 | 451.1570534 | −0.0044331 | REFL |
| M6 | 67185.8399361 | −0.0000058 | −95593.5289239 | 0.0001069 | REFL |
| M5 | 3969.9634388 | −0.0001127 | −26268.2463111 | 0.0003405 | REFL |
| M4 | −1644.4855893 | 0.0011803 | −936.8967374 | 0.0021995 | REFL |
| M3 | 5545.7476060 | −0.0001019 | −1763.0659005 | 0.0040141 | REFL |
| M2 | 1750.6743811 | −0.0002831 | −7605.8431739 | 0.0010610 | REFL |
| M1 | −2196.1980747 | 0.0008724 | −1547.9396447 | 0.0013487 | REFL |

Table 3a for FIG. 5

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −940.06176180 | 1928.97343100 | 67185.83994000 |
| C7 | 7.62497428e−09 | −8.57639147e−07 | 1.54886469e−08 |
| C9 | 4.97628952e−09 | −9.99097263e−07 | 1.7981249e−08 |
| C10 | −1.78774467e−11 | 5.98726407e−10 | 1.27739073e−10 |
| C12 | −3.68949094e−11 | 3.30093917e−09 | −4.54971207e−11 |
| C14 | −1.48006849e−11 | 4.48291579e−09 | 2.61502943e−11 |
| C16 | 1.19469362e−14 | −1.97262516e−12 | −1.86187323e−13 |
| C18 | 2.06260918e−14 | −1.13369576e−11 | −5.16762903e−14 |
| C20 | 6.73188531e−15 | −6.84864355e−12 | 1.59975109e−13 |
| C21 | −2.442351e−17 | 1.30460398e−15 | 2.24463245e−16 |
| C23 | −8.05572299e−17 | 1.71660461e−14 | −1.20746517e−15 |
| C25 | −8.37074918e−17 | 5.32208098e−14 | −9.94385751e−16 |
| C27 | −2.52600807e−17 | 5.44225377e−14 | 1.1700494e−15 |
| C29 | 1.49720569e−20 | −9.38573354e−18 | −3.76248016e−17 |
| C31 | 4.41397537e−20 | −9.78201006e−17 | 7.24046077e−18 |
| C33 | 3.44595455e−20 | −2.08907367e−16 | −9.14462766e−19 |

Table 3a for FIG. 5

| Coefficient | M8 | M7 | M6 |
|---|---|---|---|
| C35 | 1.00184621e−20 | −1.67962928e−16 | 7.77909486e−18 |
| C36 | −3.04471535e−23 | 4.75208488e−21 | −4.46742594e−19 |
| C38 | −1.38182759e−22 | 9.81780945e−20 | 1.30465357e−18 |
| C40 | −2.32391801e−22 | 6.07471253e−19 | 2.32156832e−19 |
| C42 | −1.58479253e−22 | 1.30152795e−18 | −1.30550515e−20 |
| C44 | −3.55412325e−23 | 7.68316032e−19 | 2.70030383e−20 |
| C46 | 1.9389914e−26 | −4.01545245e−23 | 1.26802584e−20 |
| C48 | 7.59407934e−26 | −6.65432869e−22 | −7.05217687e−21 |
| C50 | 9.45028792e−26 | −2.26535734e−21 | −1.71513506e−21 |
| C52 | 5.81726748e−26 | −3.4567483e−21 | −8.2060824e−22 |
| C54 | 1.26116442e−26 | −1.37469551e−21 | −2.24584841e−23 |
| C55 | −2.99356247e−29 | −4.50986103e−27 | 3.72162755e−23 |
| C57 | −1.79943344e−28 | 6.84634464e−25 | −4.02496029e−22 |
| C59 | −3.79371622e−28 | 5.60548802e−24 | −8.19691792e−23 |
| C61 | −4.01438917e−28 | 1.4529786e−23 | −1.32329541e−23 |
| C63 | −2.15579655e−28 | 1.08042106e−23 | −7.08574489e−24 |
| C65 | −4.64996596e−29 | 1.80236429e−23 | −5.54040576e−25 |
| C67 | 2.02091944e−32 | −5.63995413e−28 | −4.97720727e−25 |
| C69 | 1.31010773e−31 | −9.26319661e−27 | 1.65961753e−24 |
| C71 | 2.69538916e−31 | −6.51166229e−26 | 4.74689338e−25 |
| C73 | 2.82179482e−31 | −1.98884581e−25 | 8.24977258e−26 |
| C75 | 1.39901502e−31 | −2.38611223e−25 | −2.61713331e−26 |
| C77 | 2.8801261e−32 | −9.27090584e−26 | −1.84248153e−27 |
| C78 | −7.2976325e−35 | 4.2747446e−31 | −4.46147518e−27 |
| C80 | −4.8441275e−34 | 5.6322151e−30 | 2.64999204e−26 |
| C82 | −1.72032993e−33 | 6.81159649e−29 | 1.77710333e−26 |
| C84 | −2.82560075e−33 | 4.14104646e−28 | 3.15445422e−27 |
| C86 | −2.19501492e−33 | 1.13243636e−27 | 4.52014997e−28 |
| C88 | −8.08969738e−34 | 1.51509437e−27 | −4.20751415e−29 |
| C90 | −1.23421096e−34 | 5.43162152e−28 | −1.9482289e−30 |
| C92 | 4.3661147e−38 | 6.39314773e−34 | 0 |
| C94 | 1.2948377e−37 | −5.09327657e−32 | 0 |
| C96 | 1.56475778e−37 | −2.70270623e−31 | 0 |
| C98 | 1.17135874e−37 | −4.17109526e−31 | 0 |
| C100 | −2.2164768e−39 | −2.83826635e−31 | 0 |
| C102 | −5.09426132e−38 | −3.86051226e−31 | 0 |
| C104 | −2.25621183e−38 | 1.2451787e−31 | 0 |
| C105 | 5.21451219e−41 | −1.15450758e−36 | 0 |
| C107 | 3.69839027e−40 | 4.98860771e−35 | 0 |
| C109 | 2.39074148e−39 | 4.57400102e−34 | 0 |
| C111 | 6.40693939e−39 | 1.17311174e−33 | 0 |
| C113 | 7.52463073e−39 | 6.69924954e−34 | 0 |
| C115 | 4.13779574e−39 | −1.76196881e−33 | 0 |
| C117 | 1.05974458e−39 | 1.36394362e−36 | 0 |
| C119 | 1.18135063e−40 | 5.46823374e−34 | 0 |
| C121 | 1.50128376e−44 | 0 | 0 |
| C123 | 5.71442659e−43 | 0 | 0 |
| C125 | 2.03807113e−42 | 0 | 0 |
| C127 | 3.64316795e−42 | 0 | 0 |
| C129 | 3.90631453e−42 | 0 | 0 |
| C131 | 2.5122016e−42 | 0 | 0 |
| C133 | 9.10058853e−43 | 0 | 0 |
| C135 | 1.50573991e−43 | 0 | 0 |
| C136 | −2.58023942e−46 | 0 | 0 |
| C138 | −2.24059058e−45 | 0 | 0 |
| C140 | −1.06043362e−44 | 0 | 0 |
| C142 | −2.84523862e−44 | 0 | 0 |
| C144 | −4.27367363e−44 | 0 | 0 |
| C146 | −3.71965178e−44 | 0 | 0 |
| C148 | −1.8721749e−44 | 0 | 0 |
| C150 | −5.20772272e−45 | 0 | 0 |
| C152 | −6.31758988e−46 | 0 | 0 |

Table 3b for FIG. 5

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 3969.96343900 | −1644.48558900 | 5545.74760600 |
| C7 | −6.39513036e−08 | 4.59950055e−09 | 1.80743263e−07 |
| C9 | −1.5017407e−07 | 6.28364058e−07 | −1.10965537e−07 |
| C10 | 8.52587701e−11 | −5.06881673e−12 | 3.95138036e−11 |
| C12 | −2.47660778e−11 | 5.37301883e−12 | −2.06666309e−10 |
| C14 | 3.74198936e−11 | −2.5397412e−09 | 2.40085756e−10 |
| C16 | 1.29736535e−13 | 1.08572755e−14 | 3.5701404e−13 |
| C18 | −8.68563834e−14 | −4.93480814e−13 | −9.1790881e−13 |
| C20 | −2.50836675e−13 | 7.09853994e−12 | 4.67116604e−13 |
| C21 | −9.77703397e−16 | 2.60781551e−17 | −6.7114944e−16 |
| C23 | 2.38813114e−16 | −7.06272175e−18 | 2.45838924e−16 |
| C25 | −1.04147534e−16 | −1.45243395e−15 | −1.02545139e−15 |
| C27 | −4.16728425e−16 | −1.23708615e−14 | 7.89225583e−16 |
| C29 | −4.96986975e−18 | 1.11248771e−19 | −1.26267243e−19 |
| C31 | 3.31558149e−18 | −9.04095469e−19 | −1.36495548e−18 |
| C33 | 2.53002417e−18 | 4.85763094e−18 | −5.58121292e−19 |
| C35 | −2.50118694e−18 | 2.27833008e−16 | −1.87848367e−18 |
| C36 | 2.09216699e−22 | 1.72943619e−23 | −1.73254351e−21 |
| C38 | 5.38097573e−21 | −2.36222205e−21 | 2.05861283e−21 |
| C40 | 1.4856735e−20 | −2.02482242e−20 | −4.31771208e−21 |
| C42 | 6.07086976e−21 | 9.96632775e−20 | 1.14114612e−20 |
| C44 | −4.31290448e−20 | 3.49660054e−18 | 2.11906577e−20 |
| C46 | −5.18098806e−23 | −5.53662398e−25 | −2.99015703e−24 |
| C48 | −2.99253322e−22 | −2.23394881e−23 | −3.9876167e−24 |
| C50 | −1.38543108e−22 | −2.24614331e−22 | −3.67713989e−23 |
| C52 | −3.53076267e−22 | 2.83176923e−21 | −2.6203102e−22 |
| C54 | −2.09030917e−22 | 5.21734292e−20 | 2.95685809e−22 |
| C55 | −2.82529552e−25 | 8.53661206e−28 | −3.35005205e−27 |
| C57 | −3.58319443e−24 | 5.0364398e−26 | −1.96477668e−26 |
| C59 | −4.29933193e−24 | 7.27741408e−25 | 1.34877357e−25 |
| C61 | −4.35164002e−25 | −3.70172805e−25 | 9.08466291e−25 |
| C63 | −4.31612597e−24 | −1.65512418e−23 | −1.15821486e−24 |
| C65 | 5.74566859e−25 | −3.54839213e−22 | 9.75105989e−25 |
| C67 | −8.31856725e−27 | 2.23913867e−29 | −7.53092542e−30 |
| C69 | −3.03135923e−26 | 9.24067287e−28 | 6.97106649e−29 |
| C71 | −6.34159858e−27 | 1.29441651e−26 | 2.59341661e−28 |
| C73 | −1.45964284e−27 | 7.21404487e−26 | 2.42170553e−27 |
| C75 | −1.93255602e−26 | −5.34524622e−25 | 6.10793347e−27 |
| C77 | 7.65786113e−27 | −7.05057312e−24 | −7.52722442e−27 |
| C78 | −9.6627035e−31 | −2.01181857e−33 | −1.18301807e−31 |
| C80 | −4.64023731e−29 | −2.2908469e−31 | 2.05691034e−31 |
| C82 | −4.21140793e−29 | −9.08557064e−30 | −2.86985661e−30 |
| C84 | 1.14175315e−29 | 1.81010784e−31 | −8.51064858e−30 |
| C86 | −7.952672e−30 | 1.14283042e−27 | −2.99648638e−29 |
| C88 | −3.06560926e−29 | 2.97065585e−27 | 3.1957382e−29 |
| C90 | 1.739769e−29 | −1.53356387e−26 | −5.55236415e−29 |
| C92 | 0 | −9.35479925e−35 | 0 |
| C94 | 0 | −1.11066562e−32 | 0 |
| C96 | 0 | −2.7117545e−31 | 0 |
| C98 | 0 | −2.16812021e−30 | 0 |
| C100 | 0 | 6.49579619e−30 | 0 |
| C102 | 0 | 8.30122741e−29 | 0 |
| C104 | 0 | 1.33368175e−28 | 0 |
| C105 | 0 | 7.63062872e−39 | 0 |
| C107 | 0 | −1.33707919e−36 | 0 |
| C109 | 0 | −6.17114636e−35 | 0 |
| C111 | 0 | −1.93752659e−33 | 0 |
| C113 | 0 | −1.47555389e−32 | 0 |
| C115 | 0 | 1.51767677e−32 | 0 |
| C117 | 0 | 3.13470054e−31 | 0 |
| C119 | 0 | −4.06330463e−32 | 0 |

Table 3c for FIG. 5

| Coefficient | M2 | M1 |
|---|---|---|
| KY | 0.00000000 | 0.00000000 |
| KX | 0.00000000 | 0.00000000 |
| RX | 1750.67438100 | −2196.19807500 |
| C7 | 4.7297134e−09 | −4.86481906e−09 |
| C9 | −5.36155645e−08 | 6.01275614e−08 |
| C10 | 1.59151467e−10 | 7.46596389e−11 |
| C12 | −2.02398537e−10 | 1.45342585e−10 |
| C14 | 3.12252434e−11 | −1.08723836e−10 |

-continued

Table 3c for FIG. 5

| Coefficient | M2 | M1 |
|---|---|---|
| C16 | −3.31390341e−13 | −9.34448438e−14 |
| C18 | −2.42004872e−14 | −7.70625615e−14 |
| C20 | 4.45566248e−13 | 1.57106949e−13 |
| C21 | 3.80206914e−16 | 8.49056831e−17 |
| C23 | −9.56343255e−16 | 3.07262613e−16 |
| C25 | 1.45687793e−15 | 4.12831935e−16 |
| C27 | 9.96110057e−16 | −6.78360599e−16 |
| C29 | −1.35242776e−18 | −8.09472368e−20 |
| C31 | 3.878658e−19 | 8.74413523e−19 |
| C33 | 5.84002502e−18 | −7.39905067e−20 |
| C35 | 4.45642888e−19 | 2.28066485e−18 |
| C36 | 1.95686187e−21 | 7.10067552e−23 |
| C38 | −1.88113443e−21 | 1.34398924e−21 |
| C40 | 7.17808853e−21 | 4.93020658e−22 |
| C42 | 1.48440454e−20 | −1.09302223e−21 |
| C44 | −1.8863007e−20 | −6.93027773e−21 |
| C46 | −1.4738118e−23 | −9.80248468e−25 |
| C48 | −2.76214199e−23 | −1.05148019e−23 |
| C50 | 1.62454625e−23 | −5.72823473e−23 |
| C52 | 1.6767595e−24 | −8.17398356e−23 |
| C54 | −5.46813238e−23 | 8.69674176e−23 |
| C55 | −2.01826152e−26 | 2.31220573e−28 |
| C57 | 2.24379893e−26 | −1.69336589e−26 |
| C59 | 1.46483916e−25 | −1.55947876e−25 |
| C61 | 2.76717073e−25 | −3.16491948e−25 |
| C63 | 3.60699347e−25 | 2.52372061e−25 |
| C65 | 6.49680396e−25 | −4.13953744e−25 |
| C67 | −7.2725905e−30 | 1.76604001e−29 |
| C69 | 2.64991096e−28 | 1.97905218e−28 |
| C71 | 9.95789009e−28 | 1.53395973e−27 |
| C73 | 2.1901547e−27 | 5.10156455e−27 |
| C75 | 3.93340903e−27 | 3.79217645e−27 |
| C77 | 4.25386162e−27 | −2.13756483e−28 |
| C78 | 5.51457855e−31 | 1.73082408e−33 |
| C80 | −6.10075425e−31 | 2.51373647e−31 |
| C82 | −5.64817815e−31 | 2.65475898e−30 |
| C84 | 1.48472093e−30 | 1.19081526e−29 |
| C86 | 5.14461598e−30 | 1.48221822e−29 |
| C88 | 9.48397385e−30 | −3.58732144e−30 |
| C90 | 7.31964218e−30 | 8.78094036e−30 |
| C92 | 0 | −1.05729528e−34 |
| C94 | 0 | −1.18735654e−33 |
| C96 | 0 | −1.1292592e−32 |
| C98 | 0 | −5.84661259e−32 |
| C100 | 0 | −1.20686328e−31 |
| C102 | 0 | −7.00065014e−32 |
| C104 | 0 | 7.63092948e−33 |
| C105 | 0 | −2.71068349e−38 |
| C107 | 0 | −1.37360137e−36 |
| C109 | 0 | −1.78911485e−35 |
| C111 | 0 | −1.11895866e−34 |
| C113 | 0 | −3.08686012e−34 |
| C115 | 0 | −3.09249328e−34 |
| C117 | 0 | −4.89479255e−35 |
| C119 | 0 | −2.12968606e−34 |

Table 4a for FIG. 5

| Surface | DCX | DCY | DCZ |
|---|---|---|---|
| Stop plane | 0.00000000 | 0.00000000 | 0.00000000 |
| M8 | 0.00000000 | 0.00000000 | 789.65404564 |
| M7 | 0.00000000 | −156.74162415 | 111.54216970 |
| M6 | 0.00000000 | 75.82209555 | 1117.68346177 |
| M5 | 0.00000000 | 264.33972449 | 1378.11700369 |
| M4 | 0.00000000 | 672.72538896 | 1599.35824164 |
| M3 | 0.00000000 | −141.59750086 | 1584.88117058 |
| M2 | 0.00000000 | −505.63142958 | 1344.24717896 |
| Stop | 0.00000000 | −737.61173826 | 911.36439031 |
| M1 | 0.00000000 | −958.90354606 | 498.42669138 |
| Object | 0.00000000 | −1120.89995218 | 2199.99050736 |

Table 4b for FIG. 5

| Surface | TLA [deg] | TLB [deg] | TLC [deg] |
|---|---|---|---|
| Stop plane | −0.00000000 | 0.00000000 | −0.00000000 |
| M8 | −6.50750638 | 0.00000000 | −0.00000000 |
| M7 | −13.01501276 | 180.00000000 | 0.00000000 |
| M6 | 65.54284117 | 0.00000000 | −0.00000000 |
| M5 | 41.27356560 | 0.00000000 | 180.00000000 |
| M4 | −75.26753205 | 0.00000000 | −0.00000000 |
| M3 | 17.24201595 | 0.00000000 | 180.00000000 |
| M2 | 47.63941851 | 0.00000000 | −0.00000000 |
| Stop | 3.43166576 | 180.00000000 | 0.00000000 |
| M1 | −11.37413742 | 180.00000000 | 0.00000000 |
| Object | −0.06157975 | 0.00000000 | −0.00000000 |

TABLE 5 for FIG. 5

| Surface | Angle of incidence [deg] | Reflectivity |
|---|---|---|
| M8 | 6.47147520 | 0.66128118 |
| M7 | 0.11653216 | 0.66566419 |
| M6 | 78.70978085 | 0.86086591 |
| M5 | 77.07792270 | 0.83722518 |
| M4 | 13.94320818 | 0.64306998 |
| M3 | 73.58463359 | 0.77865080 |
| M2 | 75.65025415 | 0.81475558 |
| M1 | 16.66193250 | 0.63186641 |
| Overall transmis- | | 0.0818 |

TABLE 6 for FIG. 5

| X[mm] | Y[mm] | Z[mm] |
|---|---|---|
| 0.00000000 | 89.66980683 | 0.00000000 |
| 32.26933636 | 88.49883199 | 0.00000000 |
| 63.80242161 | 85.00678770 | 0.00000000 |
| 93.86826885 | 79.25859655 | 0.00000000 |
| 121.74851975 | 71.36984717 | 0.00000000 |
| 146.74869993 | 61.51615592 | 0.00000000 |
| 168.21452338 | 49.94208075 | 0.00000000 |
| 185.55384755 | 36.96581320 | 0.00000000 |
| 198.26379471 | 22.97584784 | 0.00000000 |
| 205.96026358 | 8.41653940 | 0.00000000 |
| 208.40508531 | −6.23816130 | 0.00000000 |
| 205.52599380 | −20.51954235 | 0.00000000 |
| 197.42538052 | −33.99995929 | 0.00000000 |
| 184.37470881 | −46.32063692 | 0.00000000 |
| 166.79373383 | −57.20679974 | 0.00000000 |
| 145.21783608 | −66.47143800 | 0.00000000 |
| 120.26075163 | −74.01138993 | 0.00000000 |
| 92.58074849 | −79.79782652 | 0.00000000 |
| 62.85560742 | −83.85970028 | 0.00000000 |
| 31.76805617 | −86.25747226 | 0.00000000 |
| 0.00000000 | −87.04886980 | 0.00000000 |
| −31.76805617 | −86.25747226 | 0.00000000 |
| −62.85560742 | −83.85970028 | 0.00000000 |
| −92.58074849 | −79.79782652 | 0.00000000 |
| −120.26075163 | −74.01138993 | 0.00000000 |
| −145.21783608 | −66.47143800 | 0.00000000 |
| −166.79373383 | −57.20679974 | 0.00000000 |
| −184.37470881 | −46.32063692 | 0.00000000 |
| −197.42538052 | −33.99995929 | 0.00000000 |
| −205.52599380 | −20.51954235 | 0.00000000 |
| −208.40508531 | −6.23816130 | 0.00000000 |
| −205.96026358 | 8.41653940 | 0.00000000 |
| −198.26379471 | 22.97584784 | 0.00000000 |
| −185.55384755 | 36.96581320 | 0.00000000 |
| −168.21452338 | 49.94208075 | 0.00000000 |
| −146.74869993 | 61.51615592 | 0.00000000 |
| −121.74851975 | 71.36984717 | 0.00000000 |
| −93.86826885 | 79.25859655 | 0.00000000 |

TABLE 6-continued for FIG. 5

| X[mm] | Y[mm] | Z[mm] |
|---|---|---|
| −63.80242161 | 85.00678770 | 0.00000000 |
| −32.26933636 | 88.49883199 | 0.00000000 |

An overall reflectivity of the projection optical unit 21 is approximately 8%.

The projection optical unit 21 has an image field 8 with an x-dimension of 2×13 mm and a y-dimension of 1.2 mm. The image field is present with an absolute radius of curvature of 81 mm. The projection optical unit 21 has an image-side numerical aperture of 0.55. In the first imaging light plane xz, the projection optical unit 21 has a reduction factor $\beta_x$ of 4.00. In the second imaging light plane yz, the projection optical unit 21 has a reduction factor $\beta_y$ of 8.00. An object-side chief ray angle is 5.4°. A pupil obscuration is 15%. An object-image offset $d_{OIS}$ is approximately 1120 mm. The mirrors of the projection optical unit 21 can be accommodated in a cuboid having xyz-edge lengths of 909 mm×1766 mm×1584 mm.

The reticle 10 and hence the object plane 5 are tilted at an angle T of −0.1° about the x-axis. This tilt angle T is indicated in FIG. 5.

A working distance between the mirror M7 closest to the wafer and the image plane 9 is approximately 80 mm. A mean wavefront aberration rms is 7.32 mλ.

FIG. 7 shows, once again, the marginal contours of the reflection surfaces of the mirrors M1 to M8 of the projection optical unit 21.

Figure 9:
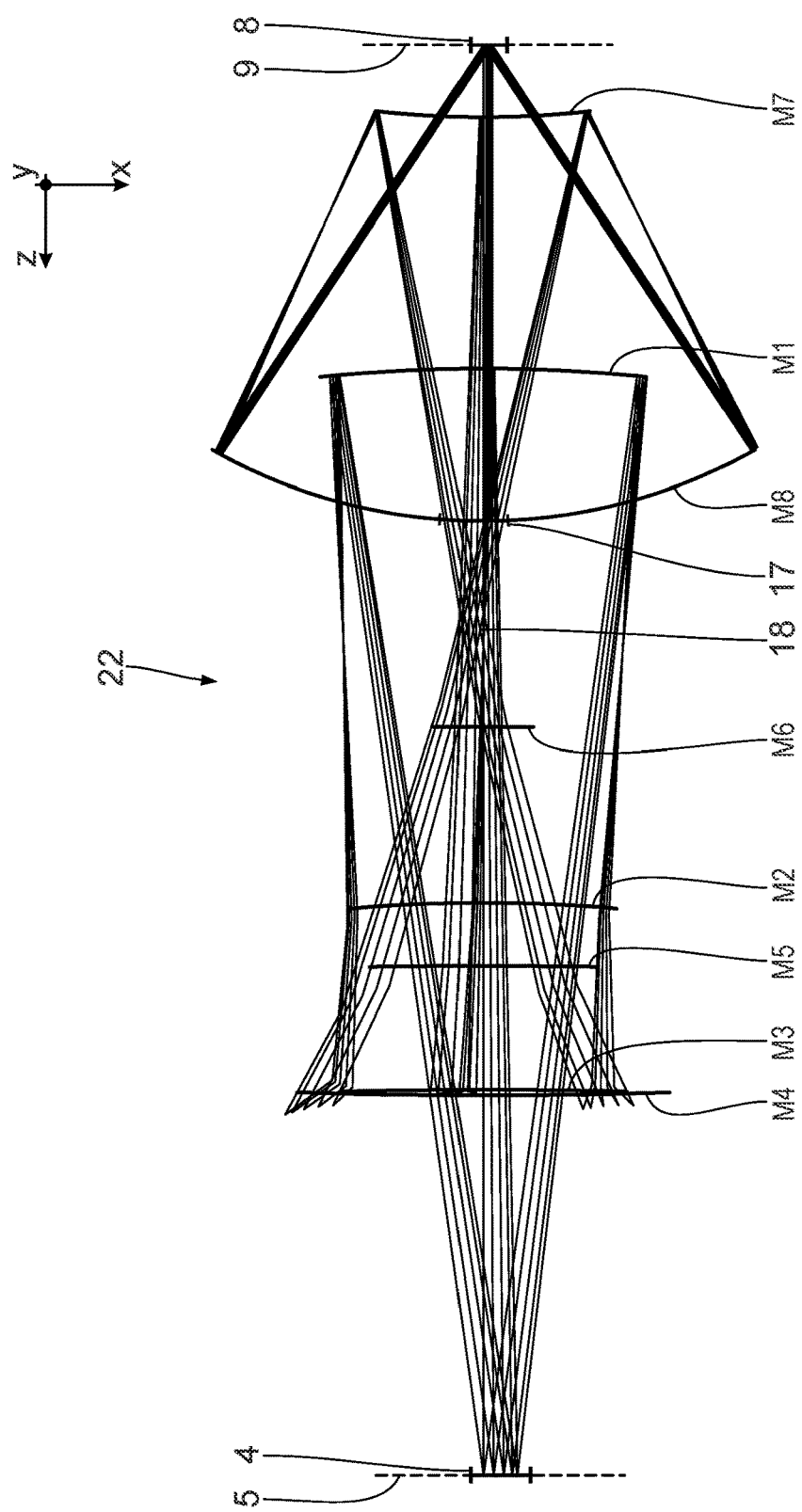
Figure 10:
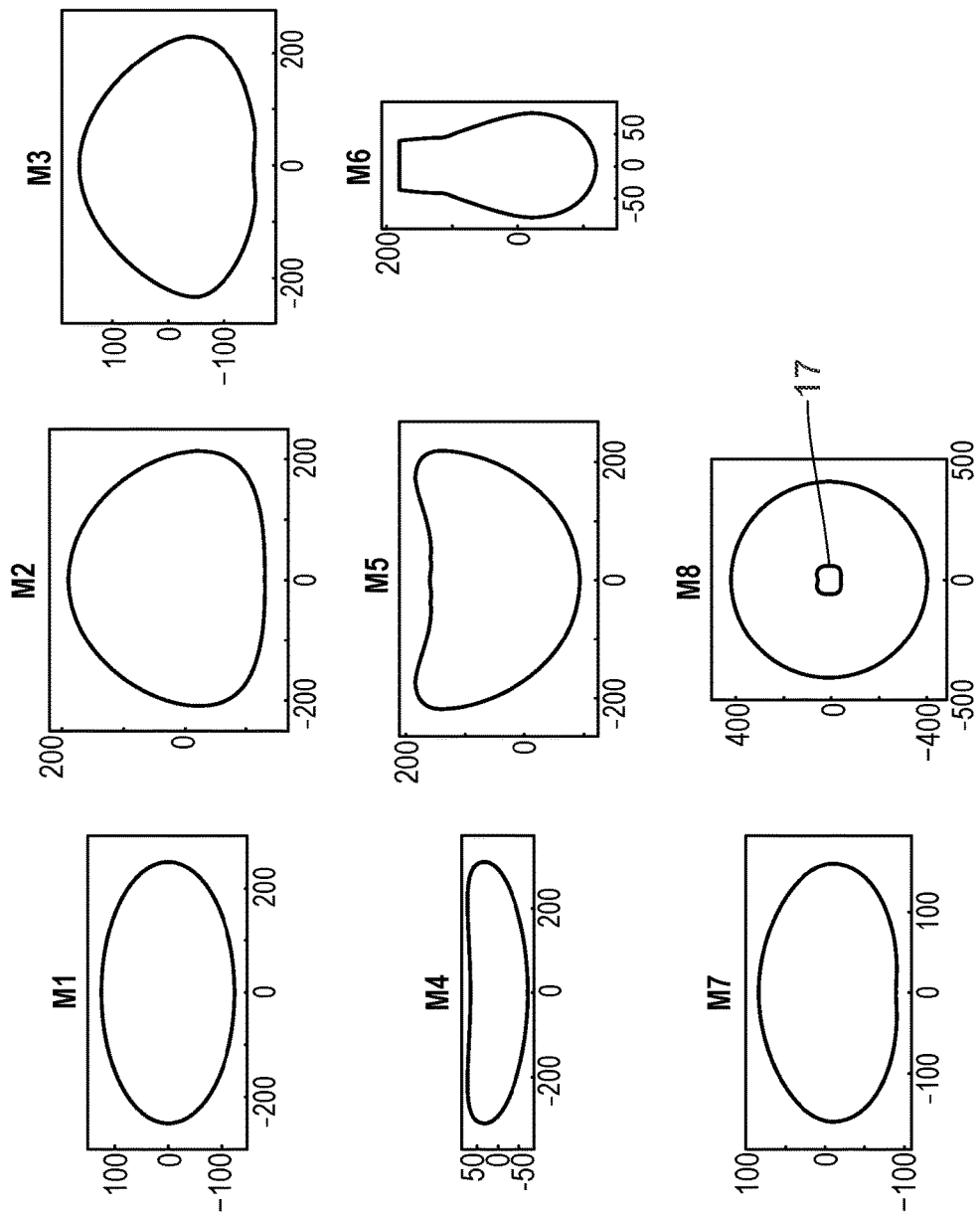

A further embodiment of a projection optical unit 22, which can be used in the projection exposure apparatus 1 according to FIG. 1 instead of the projection optical unit 7, is explained in the following text on the basis of FIGS. 8 to 10. Components and functions which have already been explained above in the context of FIGS. 1 to 7 are denoted, where applicable, by the same reference signs and are not discussed again in detail.

Once again, the free-form surface equation (1) specified above applies to the mirrors M1 to M8.

The following table once again shows the mirror parameters of mirrors M1 to M8 of the projection optical unit 22.

| | M1 | M2 | M3 | M4 | M5 | M6 | M7 | M8 |
|---|---|---|---|---|---|---|---|---|
| Maximum angle of incidence [°] | 19.4 | 83.2 | 78.9 | 14.6 | 83.4 | 81.3 | 20.4 | 8.4 |
| Extent of the reflection surface in the x-direction [mm] | 500.6 | 415.3 | 464.4 | 608.0 | 438.7 | 157.9 | 331.3 | 839.6 |
| Extent of the reflection surface in the y-direction [mm] | 258.0 | 319.6 | 315.9 | 139.9 | 276.0 | 289.4 | 175.9 | 821.2 |
| Maximum mirror diameter [mm] | 500.7 | 416.9 | 464.4 | 608.1 | 440.2 | 293.8 | 331.3 | 840.2 |

Once again, the last mirror in the imaging beam path M8 has the largest mirror diameter in this case, measuring 840.2 mm. The mirror M4 has the next largest maximum mirror diameter, measuring 608.1 mm. The mirror M1 has the next largest maximum mirror diameter, measuring 500.7 mm. The mirror diameters of the further mirrors M2, M3, and M5 to M7 are less than 500 mm in each case.

The NI mirror M4 has an x/y-aspect ratio of approximately 4.3:1. The x/y-aspect ratio of three of the four GI mirrors, specifically of the mirrors M2, M3, and M5, is greater than 1 in each case.

FIG. 10 shows, once again, the marginal contours of the reflection surfaces of the mirrors M1 to M8 of the projection optical unit 22.

The optical design data from the projection optical unit 22 can be gathered from the following tables, which, in terms of their design, correspond to the tables for the projection optical unit 7 according to FIG. 2.

Figure 8:
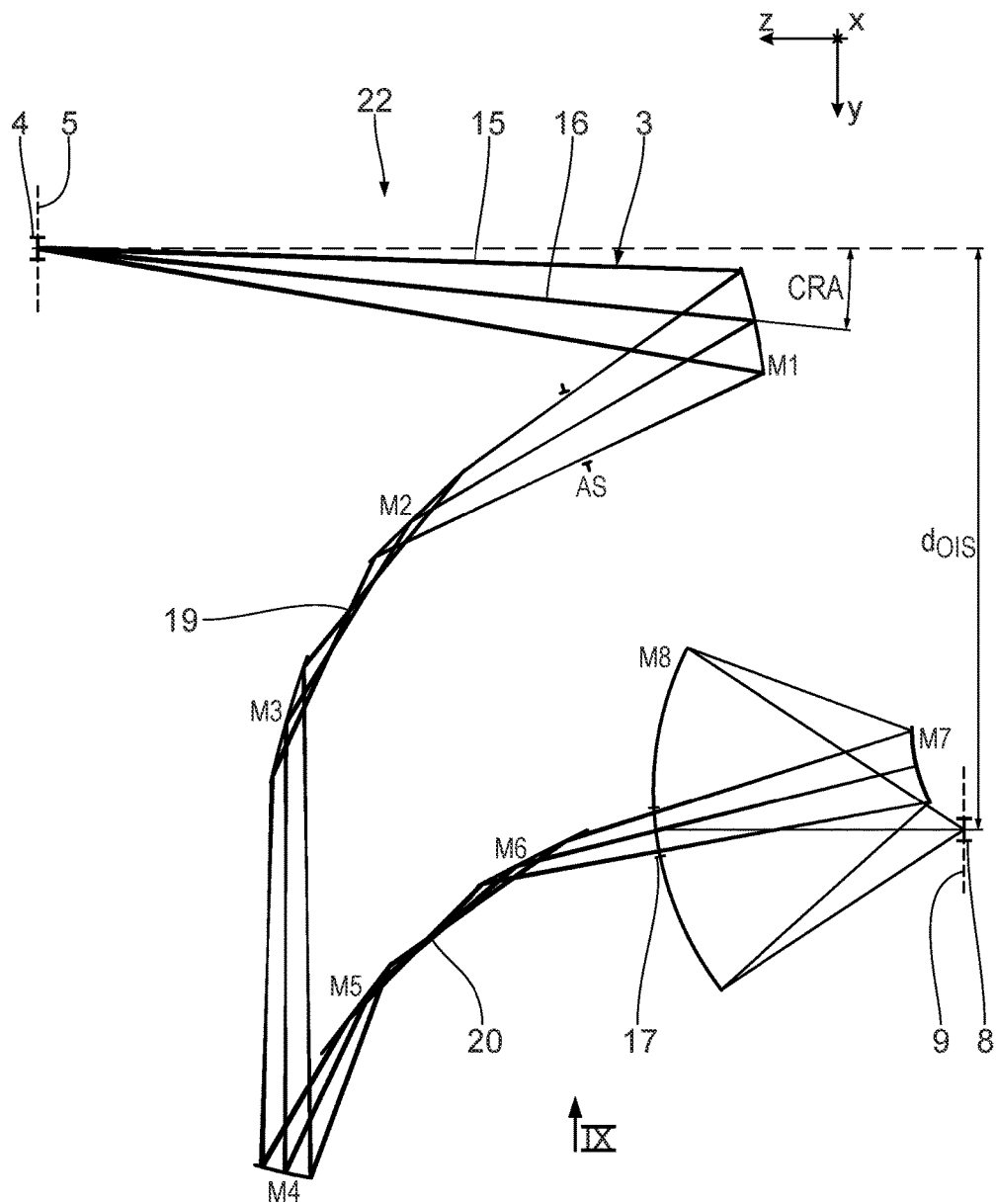
FIGS. 8-16 show, in illustrations respectively similar to FIGS. 5 to 7, further embodiments of an imaging optical unit which can be used as a projection lens in the projection exposure apparatus according to FIG. 1.

TABLE 1 for FIG. 8

| Exemplary embodiment | FIG. 8 |
|---|---|
| NA | 0.55 |
| Wavelength | 13.5 nm |
| beta_x | 4.0 |
| beta_y | −8.0 |
| Field dimension_x | 26.0 mm |
| Field dimension_y | 1.2 mm |
| Field curvature | 0.012345 1/mm |
| rms | 6.32 ml |
| Stop | AS |

TABLE 2 for FIG. 8

| Surface | Radius_x[mm] | Power_x[1/mm] | Radius_y[mm] | Power_y[1/mm] | Operating |
|---|---|---|---|---|---|
| M8 | −851.0361523 | 0.0023330 | −772.1034778 | 0.0026093 | REFL |
| M7 | 1546.8239627 | −0.0012930 | 394.6694678 | −0.0050675 | REFL |
| M6 | — | 0.0000022 | −10187.2890997 | 0.0008677 | REFL |
| M5 | 8912.8787588 | −0.0000480 | 169600.7233122 | −0.0000551 | REFL |
| M4 | −1924.8246697 | 0.0010145 | −1122.2826293 | 0.0018252 | REFL |
| M3 | 8381.6578186 | −0.0000650 | −2584.1884987 | 0.0028424 | REFL |
| M2 | 1663.9595421 | −0.0002907 | −9018.2564818 | 0.0009168 | REFL |
| M1 | −2366.4461630 | 0.0008036 | −1573.3008227 | 0.0013369 | REFL |

TABLE 3a for FIG. 8

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −851.03615230 | 1546.82396300 | −202333.14570000 |
| C7 | 8.22353195e−09 | −1.1254404e−06 | 5.70321402e−08 |
| C9 | 1.06800922e−08 | −1.61066543e−06 | −4.04332858e−08 |
| C10 | −2.32081625e−11 | 9.01260368e−10 | 9.97049994e−11 |
| C12 | −4.81965523e−11 | 5.41498721e−09 | −3.87882762e−11 |
| C14 | −1.78337439e−11 | 6.95736847e−09 | −8.07590068e−11 |
| C16 | 1.53703977e−14 | −3.72727079e−12 | −2.22606408e−13 |
| C18 | 3.92824351e−14 | −2.3049091e−11 | 1.39174244e−13 |
| C20 | 1.41211822e−14 | −1.33256083e−11 | −1.58580213e−13 |
| C21 | −3.81721312e−17 | 2.57394252e−15 | −1.15923561e−15 |
| C23 | −1.24510595e−16 | 3.79123979e−14 | 6.26522278e−16 |
| C25 | −1.24327748e−16 | 1.02191353e−13 | −3.15498125e−16 |
| C27 | −4.02771064e−17 | 1.05686173e−13 | 8.01345954e−17 |
| C29 | 2.36036771e−20 | −2.32704295e−17 | 2.86986088e−18 |
| C31 | 9.23476141e−20 | −2.50971866e−16 | −6.31866033e−18 |
| C33 | 7.42391485e−20 | −4.69584608e−16 | −1.77467853e−18 |
| C35 | 2.13920436e−20 | −4.20709884e−16 | 1.93080313e−18 |
| C36 | −5.75028905e−23 | 1.36974288e−20 | 1.20047411e−19 |
| C38 | −2.56478559e−22 | 2.99082116e−19 | 1.58313804e−19 |
| C40 | −4.17528537e−22 | 1.63802081e−18 | 3.48230344e−20 |
| C42 | −2.93237802e−22 | 3.53149682e−18 | −1.30664337e−20 |
| C44 | −6.5240127e−23 | 2.22557903e−18 | 9.34200365e−21 |
| C46 | 3.26730959e−26 | −1.31769525e−22 | 1.87467922e−22 |
| C48 | 1.65647684e−25 | −2.54108407e−21 | −9.7459547e−23 |
| C50 | 2.06003704e−25 | −8.02218967e−21 | 4.24535452e−22 |
| C52 | 1.25828823e−25 | −1.08154448e−20 | −3.60660032e−23 |
| C54 | 2.94874126e−26 | −4.52045601e−21 | 3.08426535e−23 |
| C55 | −6.97828495e−29 | −8.04789954e−27 | −3.02842858e−23 |
| C57 | −3.93224712e−28 | 2.36826803e−24 | −3.05704402e−23 |
| C59 | −8.5715617e−28 | 1.91225859e−23 | −1.61986274e−23 |
| C61 | −9.44354252e−28 | 5.47973494e−23 | −5.89325036e−25 |
| C63 | −4.92557976e−28 | 5.42718964e−23 | 1.75162691e−25 |
| C65 | −9.53675468e−29 | −2.41144334e−23 | 1.37982154e−25 |
| C67 | 8.56161307e−32 | −2.13597878e−27 | 1.42425027e−25 |
| C69 | 5.45793082e−31 | −3.1078544e−26 | 1.57057755e−25 |
| C71 | 1.08872714e−30 | −1.66326237e−25 | −3.00238819e−26 |
| C73 | 1.12115534e−30 | −6.38207957e−25 | −1.34557376e−26 |
| C75 | 6.11516854e−31 | −1.02076137e−24 | 3.36558839e−27 |
| C77 | 1.73978227e−31 | −1.03262553e−24 | 2.84928864e−28 |
| C78 | −2.15434724e−34 | 2.23358192e−30 | 1.67334485e−27 |
| C80 | −1.42981408e−33 | 2.69345444e−29 | −7.09831855e−29 |
| C82 | −4.31511841e−33 | 3.21344558e−28 | 9.35814833e−28 |
| C84 | −6.50204276e−33 | 1.66879067e−27 | 5.92963244e−28 |
| C86 | −4.98319988e−33 | 4.54510687e−27 | −5.80186138e−29 |
| C88 | −1.71245423e−33 | 4.96070699e−27 | 1.15834488e−29 |
| C90 | −2.25973101e−34 | 1.01639976e−26 | −5.5330398e−32 |
| C92 | −4.67191518e−38 | −6.25563325e−33 | 0 |
| C94 | −5.22713002e−37 | −4.34830237e−31 | 0 |
| C96 | −1.89944414e−36 | −3.56929016e−30 | 0 |
| C98 | −2.81867609e−36 | −1.11408817e−29 | 0 |
| C100 | −2.00885345e−36 | −3.36202301e−30 | 0 |
| C102 | −9.14331673e−37 | 1.99813966e−29 | 0 |
| C104 | −3.93192552e−37 | 5.1763834e−29 | 0 |
| C105 | 2.59858488e−40 | −1.30912151e−35 | 0 |
| C107 | 1.91340725e−39 | 2.51076736e−34 | 0 |
| C109 | 7.28860105e−39 | 3.88659065e−33 | 0 |
| C111 | 1.43323996e−38 | 1.93195701e−32 | 0 |
| C113 | 1.56110989e−38 | 3.48086283e−32 | 0 |
| C115 | 8.98701927e−39 | −5.48720528e−32 | 0 |
| C117 | 1.6511978e−39 | −1.29982627e−31 | 0 |
| C119 | −1.30949821e−40 | −4.96284696e−31 | 0 |
| C121 | 4.23660664e−43 | 0 | 0 |
| C123 | 4.15160139e−42 | 0 | 0 |
| C125 | 1.39771326e−41 | 0 | 0 |
| C127 | 2.53124046e−41 | 0 | 0 |
| C129 | 2.68371578e−41 | 0 | 0 |
| C131 | 1.59135165e−41 | 0 | 0 |
| C133 | 5.46251923e−42 | 0 | 0 |
| C135 | 1.15209039e−42 | 0 | 0 |
| C136 | −1.17664747e−45 | 0 | 0 |
| C138 | −1.02663575e−44 | 0 | 0 |
| C140 | −4.20279722e−44 | 0 | 0 |
| C142 | −9.68210854e−44 | 0 | 0 |
| C144 | −1.33553594e−43 | 0 | 0 |

TABLE 3a-continued for FIG. 8

| Coefficient | M8 | M7 | M6 |
|---|---|---|---|
| C146 | −1.14971336e−43 | 0 | 0 |
| C148 | −5.92069859e−44 | 0 | 0 |
| C150 | −1.53968726e−44 | 0 | 0 |
| C152 | −1.21262169e−45 | 0 | 0 |

TABLE 3b for FIG. 8

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 8912.87875900 | −1924.82467000 | 8381.65781900 |
| C7 | −8.57268768e−08 | 2.54807038e−08 | 1.55608617e−07 |
| C9 | −6.40759103e−08 | 5.25166423e−07 | −7.37308994e−08 |
| C10 | 2.6897543e−11 | −5.54870269e−13 | −2.18140873e−11 |
| C12 | −2.7546226e−11 | −4.63238035e−11 | −6.24966108e−12 |
| C14 | 1.73068149e−10 | −2.87565404e−09 | 4.78306365e−11 |
| C16 | −2.16934555e−14 | 2.88286746e−14 | 1.42144476e−13 |
| C18 | −3.78830935e−14 | −1.16294514e−13 | −2.62164582e−13 |
| C20 | 2.23511026e−13 | 1.06010033e−11 | 1.19479387e−13 |
| C21 | −2.93742356e−16 | 1.20280745e−17 | −4.13931787e−16 |
| C23 | 1.03921979e−16 | −8.1527366e−17 | 2.34105392e−16 |
| C25 | −1.01100395e−16 | 2.07655296e−16 | −4.5300826e−16 |
| C27 | 1.02450572e−15 | −2.86240941e−14 | −2.49592968e−17 |
| C29 | −1.10251956e−18 | 3.89793994e−20 | −3.28703583e−19 |
| C31 | 6.87189608e−19 | 3.58723632e−19 | 2.34944949e−19 |
| C33 | −9.50730177e−19 | 2.17310978e−17 | 2.18611821e−19 |
| C35 | 2.23205339e−18 | 1.22715871e−16 | 3.44365927e−20 |
| C36 | −2.99662129e−22 | 1.5227569e−23 | −8.39841059e−22 |
| C38 | −2.28852461e−21 | −2.49850063e−22 | 4.49849691e−23 |
| C40 | −6.61286925e−21 | 3.66778349e−21 | −1.00697786e−21 |
| C42 | −6.83118232e−21 | −7.87351542e−20 | −1.93220209e−21 |
| C44 | 4.74805065e−21 | −1.20795235e−18 | 1.39567847e−21 |
| C46 | −6.19052002e−24 | −2.95842767e−27 | −8.0421363e−25 |
| C48 | −4.53218038e−23 | −1.86701681e−24 | −7.51188458e−26 |
| C50 | −3.53355801e−23 | −1.94682324e−22 | 6.58138946e−24 |
| C52 | 9.66685993e−24 | −2.54695991e−21 | −2.24468037e−23 |
| C54 | 4.68338408e−23 | 1.56039907e−20 | 2.3689314e−23 |
| C55 | −3.36029673e−27 | 3.64770651e−29 | −1.64579218e−27 |
| C57 | −1.50039295e−25 | 2.97142578e−27 | −4.39616284e−27 |
| C59 | −1.58152693e−25 | −9.31466014e−27 | −3.28807432e−27 |
| C61 | 1.40480231e−25 | −5.43887391e−25 | 9.68467712e−26 |
| C63 | 3.42078317e−25 | −7.81685653e−24 | −1.21580745e−25 |
| C65 | 3.34544742e−25 | 2.49081993e−22 | 5.2524997e−26 |
| C67 | −1.91985692e−28 | 1.23915532e−30 | −4.34996752e−30 |
| C69 | −6.19652043e−28 | 5.59164321e−29 | 1.1395921e−29 |
| C71 | 5.78399459e−28 | 2.46635389e−27 | −6.03194547e−29 |
| C73 | 6.06143848e−28 | 6.4010328e−26 | 3.18629423e−28 |
| C75 | 2.14114816e−27 | 5.89668384e−25 | 2.4585905e−29 |
| C77 | 8.34473509e−28 | −3.8312013e−25 | −3.30336043e−28 |
| C78 | −2.63013498e−32 | −3.04381081e−35 | 1.90506513e−33 |
| C80 | −8.58668923e−31 | −5.52823344e−33 | 2.0730057e−32 |
| C82 | 3.6604218e−31 | 1.5262269e−31 | −7.57202598e−32 |
| C84 | 1.22304772e−30 | 1.81454202e−29 | −8.86741054e−31 |
| C86 | 3.96796879e−31 | 2.84600101e−28 | −5.95886159e−31 |
| C88 | 4.7506545e−30 | 3.52745373e−27 | 9.5255502e−31 |
| C90 | 1.01760514e−31 | −5.7803578e−26 | −1.26507199e−30 |
| C92 | 0 | 1.87739314e−36 | 0 |
| C94 | 0 | −2.22865742e−34 | 0 |
| C96 | 0 | −1.0891435e−32 | 0 |
| C98 | 0 | −4.24411917e−31 | 0 |
| C100 | 0 | −6.24102946e−30 | 0 |
| C102 | 0 | −4.91277622e−29 | 0 |
| C104 | 0 | −1.05847058e−28 | 0 |
| C105 | 0 | 2.44803895e−40 | 0 |
| C107 | 0 | 3.63856827e−38 | 0 |
| C109 | 0 | −9.85256801e−37 | 0 |
| C111 | 0 | −1.48844151e−34 | 0 |
| C113 | 0 | −3.24054187e−33 | 0 |

TABLE 3b-continued for FIG. 8

| Coefficient | M5 | M4 | M3 |
|---|---|---|---|
| C115 | 0 | −4.83253562e−32 | 0 |
| C117 | 0 | −4.56856787e−31 | 0 |
| C119 | 0 | 2.64024429e−30 | 0 |

TABLE 3c for FIG. 8

| Coefficient | M2 | M1 |
|---|---|---|
| KY | 0.00000000 | 0.00000000 |
| KX | 0.00000000 | 0.00000000 |
| RX | 1663.95954200 | −2366.44616300 |
| C7 | −2.6256998e−08 | −1.88881955e−08 |
| C9 | −4.49213586e−08 | 6.43389667e−08 |
| C10 | 1.54586082e−10 | 6.46192823e−11 |
| C12 | −1.21371886e−10 | 1.31169767e−10 |
| C14 | −4.33390669e−11 | −1.78376811e−10 |
| C16 | −2.73749675e−13 | −8.16202701e−14 |
| C18 | −2.92834639e−13 | −1.77336534e−13 |
| C20 | 5.30808959e−13 | 1.28125779e−13 |
| C21 | 3.92239718e−16 | 7.7481034e−17 |
| C23 | −7.40201663e−16 | 2.19947215e−16 |
| C25 | 1.08355999e−15 | 8.51061497e−16 |
| C27 | 2.44427707e−15 | −7.69477857e−16 |
| C29 | −1.06269965e−18 | −5.04698618e−20 |
| C31 | −4.88332067e−19 | 1.20045157e−18 |
| C33 | 9.46993181e−18 | −1.0606871e−18 |
| C35 | 3.12945049e−18 | 4.10938248e−18 |
| C36 | 1.53705534e−21 | 4.30277308e−23 |
| C38 | −1.32914259e−21 | 1.09041364e−21 |
| C40 | 9.35384761e−21 | 1.32436368e−22 |
| C42 | 1.83272246e−20 | 5.94189415e−21 |
| C44 | −1.6258077e−20 | −1.73278155e−20 |
| C46 | −8.69830376e−24 | −8.70142065e−25 |
| C48 | −1.83642254e−23 | −4.10900663e−24 |
| C50 | 7.81204363e−24 | −3.66083552e−23 |
| C52 | −7.6675503e−23 | −1.57882422e−22 |
| C54 | −7.16811746e−24 | 1.75681164e−22 |
| C55 | 1.00553344e−27 | 1.85224361e−28 |
| C57 | 9.61086623e−27 | −9.92933564e−27 |
| C59 | 9.22836469e−26 | −9.27618468e−26 |
| C61 | 5.03417067e−26 | −3.91366057e−25 |
| C63 | 8.18957345e−26 | 3.55969196e−26 |
| C65 | 5.4051668e−25 | −2.60900198e−25 |
| C67 | −4.59015691e−29 | 1.5260942e−29 |
| C69 | 5.56437743e−29 | 1.29590808e−28 |
| C71 | 5.74425184e−28 | 5.1841973e−28 |
| C73 | 1.78819681e−27 | 3.0919993e−27 |
| C75 | 3.84503995e−27 | 5.78715704e−27 |
| C77 | 1.77868051e−27 | −1.1835767e−27 |
| C78 | 7.746135e−32 | −6.58196385e−34 |
| C80 | −6.03716849e−32 | 1.87038385e−31 |
| C82 | 1.75693025e−32 | 1.10323344e−30 |
| C84 | 9.46185586e−31 | 6.41534647e−30 |
| C86 | 6.92515865e−30 | 1.83718563e−29 |
| C88 | 9.33866138e−30 | 2.26352334e−29 |
| C90 | 1.35684272e−30 | −8.39131456e−30 |
| C92 | 0 | −7.45481971e−35 |
| C94 | 0 | −9.20444921e−34 |
| C96 | 0 | −3.82571455e−33 |
| C98 | 0 | −2.02038771e−32 |
| C100 | 0 | −4.58610144e−32 |
| C102 | 0 | −2.19149074e−31 |
| C104 | 0 | 1.21942322e−31 |
| C105 | 0 | −2.04017375e−39 |
| C107 | 0 | −1.13152305e−36 |
| C109 | 0 | −8.67384688e−36 |
| C111 | 0 | −3.73813523e−35 |
| C113 | 0 | −1.42966936e−34 |
| C115 | 0 | −5.28437513e−34 |
| C117 | 0 | 5.05058256e−36 |
| C119 | 0 | −4.57963592e−34 |

TABLE 4a for FIG. 8

| Surface | DCX | DCY | DCZ |
|---|---|---|---|
| Stop plane | 0.00000000 | 0.00000000 | 0.00000000 |
| M8 | 0.00000000 | 0.00000000 | 730.47846317 |
| M7 | 0.00000000 | −152.90056746 | 112.82201342 |
| M6 | 0.00000000 | 78.36865349 | 1047.05612597 |
| M5 | 0.00000000 | 389.10924804 | 1414.16174057 |
| M4 | 0.00000000 | 812.27571998 | 1612.23227806 |
| M3 | 0.00000000 | −265.50935323 | 1603.53836219 |
| M2 | 0.00000000 | −726.85543010 | 1316.88850383 |
| Stop | 0.00000000 | −960.14137189 | 921.36601541 |
| M1 | 0.00000000 | −1210.40105284 | 497.06555821 |
| Object | 0.00000000 | −1383.95499737 | 2195.69303406 |

TABLE 4b for FIG. 8

| Surface | TLA[deg] | TLB[deg] | TLC[deg] |
|---|---|---|---|
| Stop plane | −0.00000000 | 0.00000000 | −0.00000000 |
| M8 | −6.95201256 | 0.00000000 | −0.00000000 |
| M7 | −13.90402511 | 180.00000000 | 0.00000000 |
| M6 | 62.92468079 | 0.00000000 | −0.00000000 |
| M5 | 37.41808021 | 0.00000000 | 180.00000000 |
| M4 | −77.22753094 | 0.00000000 | −0.00000000 |
| M3 | 16.15812057 | 0.00000000 | 180.00000000 |
| M2 | 45.66062220 | 0.00000000 | −0.00000000 |
| Stop | −17.71808396 | 180.00000000 | 0.00000000 |
| M1 | −12.34949612 | 180.00000000 | 0.00000000 |
| Object | 0.33384010 | 0.00000000 | −0.00000000 |

TABLE 5 for FIG. 8

| Surface | Angle of incidence[deg] | Reflectivity |
|---|---|---|
| M8 | 6.91276625 | 0.66062902 |
| M7 | 0.12878534 | 0.66566461 |
| M6 | 76.92252636 | 0.83486647 |
| M5 | 77.65337591 | 0.84578931 |
| M4 | 12.48133148 | 0.64795820 |
| M3 | 74.19981712 | 0.78989266 |
| M2 | 76.00169981 | 0.82045940 |
| M1 | 18.03253830 | 0.62503760 |
| Overall transmis- | | 0.0815 |

TABLE 6 for FIG. 8

| X[mm] | Y[mm] | Z[mm] |
|---|---|---|
| 0.00000000 | 79.44891448 | 0.00000000 |
| 33.44609853 | 78.35210193 | 0.00000000 |
| 66.09827943 | 75.08959780 | 0.00000000 |
| 97.17379795 | 69.74566864 | 0.00000000 |
| 125.91323007 | 62.46267647 | 0.00000000 |
| 151.59477634 | 53.44369041 | 0.00000000 |
| 173.55179314 | 42.95465388 | 0.00000000 |
| 191.19420271 | 31.32416265 | 0.00000000 |
| 204.03313655 | 18.93717691 | 0.00000000 |
| 211.70619028 | 6.21863897 | 0.00000000 |
| 213.99952587 | −6.39415339 | 0.00000000 |
| 210.86350256 | −18.48584486 | 0.00000000 |
| 202.41900580 | −29.69478411 | 0.00000000 |
| 188.95119114 | −39.73468794 | 0.00000000 |
| 170.88870987 | −48.40435562 | 0.00000000 |
| 148.77113918 | −55.58900603 | 0.00000000 |
| 123.21255397 | −61.25733366 | 0.00000000 |
| 94.87031062 | −65.45439617 | 0.00000000 |
| 64.42418298 | −68.28828106 | 0.00000000 |
| 32.56662812 | −69.90208600 | 0.00000000 |
| 0.00000000 | −70.42283034 | 0.00000000 |
| −32.56662812 | −69.90208600 | 0.00000000 |
| −64.42418298 | −68.28828106 | 0.00000000 |
| −94.87031062 | −65.45439617 | 0.00000000 |
| −123.21255397 | −61.25733366 | 0.00000000 |
| −148.77113918 | −55.58900603 | 0.00000000 |
| −170.88870987 | −48.40435562 | 0.00000000 |
| −188.95119114 | −39.73468794 | 0.00000000 |
| −202.41900580 | −29.69478411 | 0.00000000 |
| −210.86350256 | −18.48584486 | 0.00000000 |
| −213.99952587 | −6.39415339 | 0.00000000 |
| −211.70619028 | 6.21863897 | 0.00000000 |
| −204.03313655 | 18.93717691 | 0.00000000 |
| −191.19420271 | 31.32416265 | 0.00000000 |
| −173.55179314 | 42.95465388 | 0.00000000 |
| −151.59477634 | 53.44369041 | 0.00000000 |
| −125.91323007 | 62.46267647 | 0.00000000 |
| −97.17379795 | 69.74566864 | 0.00000000 |
| −66.09827943 | 75.08959780 | 0.00000000 |
| −33.44609853 | 78.35210193 | 0.00000000 |

An overall reflectivity of the projection optical unit 22 is approximately 8%.

The projection optical unit 22 has an image field 8 with an x-dimension of 2×13 mm and a y-dimension of 1.2 mm. The image field is present curved with an absolute radius of curvature of 81 mm. The projection optical unit 22 has a numerical aperture of 0.55. A reduction factor is 4.0 ($\beta_x$) in the first imaging light plane xz and −8.0 ($\beta_y$) in the second imaging light plane yz. A chief ray angle CRA in relation to a normal on the object field 4 is 5.4°. A maximum pupil obscuration is 16%. An object-image offset $d_{OIS}$ is approximately 1380 mm. The mirrors of the projection optical unit 22 can be accommodated in a cuboid having xyz-edge lengths of 840 mm×2160 mm×1598 mm.

The object plane 5 and the image plane 9 extend at an angle of 0.3° in relation to one another.

A working distance between the mirror M5 closest to the wafer and the image plane 9 is 81 mm. A mean wavefront aberration rms is 6.32 mλ.

Figure 12:
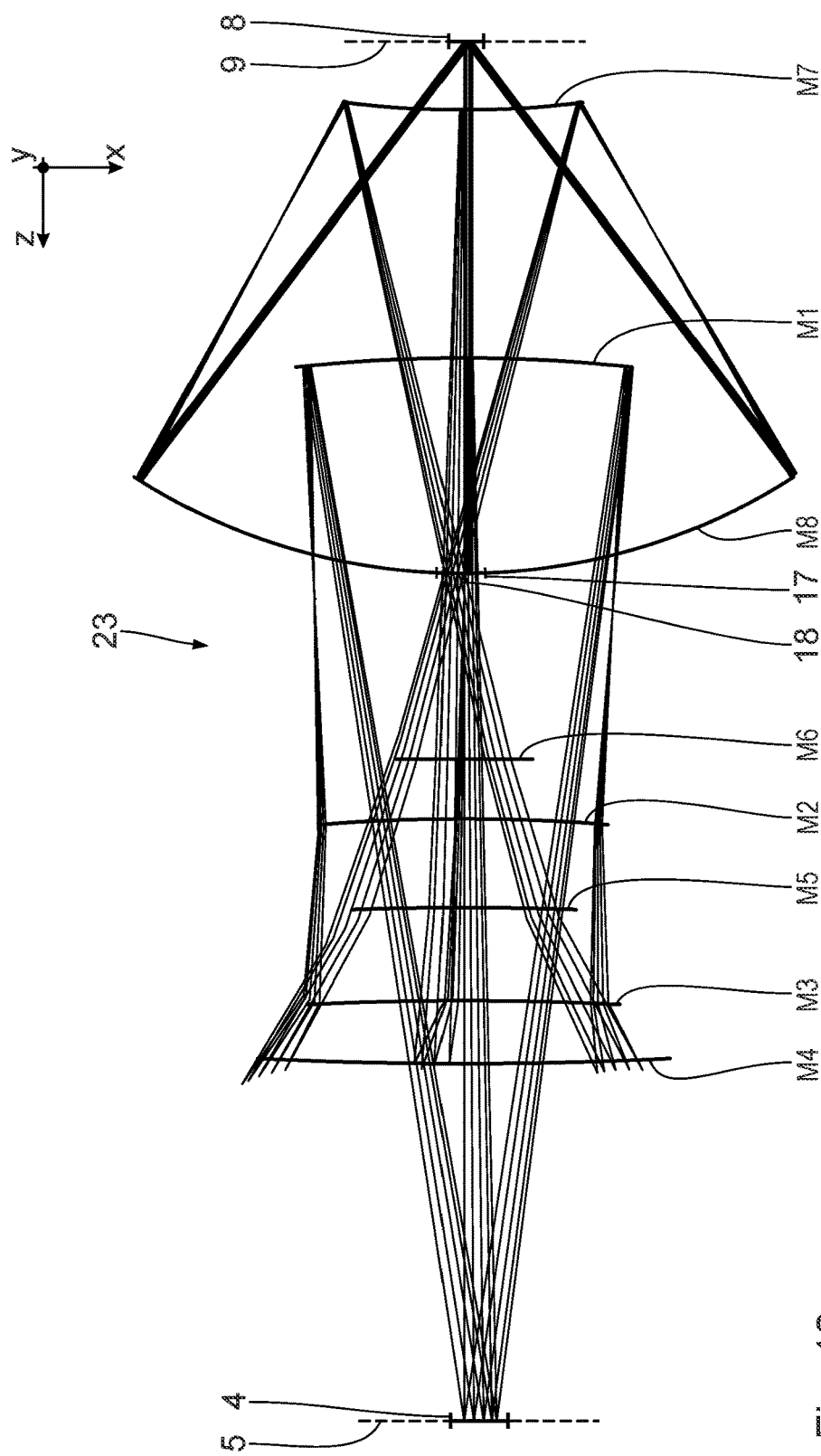
Figure 13:
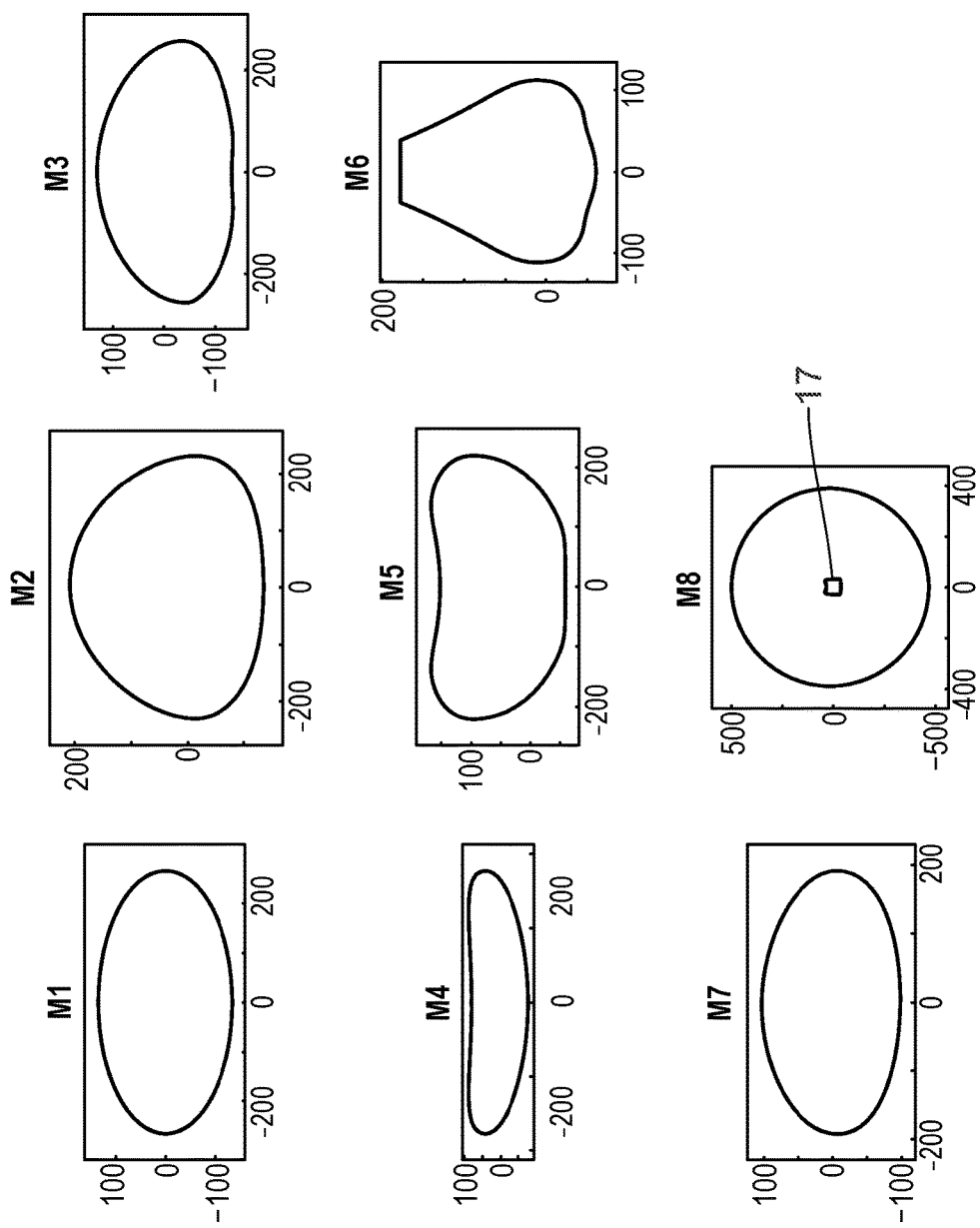

A further embodiment of a projection optical unit 23, which can be used in the projection exposure apparatus 1 according to FIG. 1 instead of the projection optical unit 7, is explained in the following text on the basis of FIGS. 11 to 13. Components and functions which have already been explained above in the context of FIGS. 1 to 10 are denoted, where applicable, by the same reference signs and are not discussed again in detail.

The mirrors M1 to M8 are once again configured as free-form surfaces for which the free-form surface equation (1) indicated above holds true.

The following table once again shows the mirror parameters of mirrors M1 to M8 of the projection optical unit 23.

| | M1 | M2 | M3 | M4 | M5 | M6 | M7 | M8 |
|---|---|---|---|---|---|---|---|---|
| Maximum angle of incidence [°] | 16.8 | 83.8 | 79.4 | 13.7 | 82.6 | 83.7 | 23.2 | 7.8 |
| Extent of the reflection surface in the x-direction [mm] | 537.0 | 463.6 | 511.9 | 707.8 | 437.8 | 222.7 | 382.8 | 1060.2 |
| Extent of the reflection surface in the y-direction [mm] | 272.8 | 340.3 | 266.9 | 160.1 | 223.6 | 233.2 | 201.1 | 1038.2 |
| Maximum mirror diameter [mm] | 537.1 | 463.9 | 512.0 | 707.8 | 438.1 | 252.4 | 382.9 | 1060.6 |

Three of the four GI mirrors have an x/y-aspect ratio that is greater than 1. The NI mirror M4 has an x/y-aspect ratio of approximately 4.4.

Once again, the last mirror in the imaging light beam path, mirror M8, has the largest mirror diameter, measuring 1060 mm. The mirror M4 has the next largest mirror diameter with a maximum mirror diameter of 707.8 mm. The other mirrors M1 to M3 and M5 to M7 each have a maximum mirror diameter that is less than 550 mm. Four of the eight mirrors have a maximum mirror diameter that is less than 500 mm.

FIG. 13 shows, once again, the marginal contours of the reflection surfaces of the mirrors M1 to M8.

The optical design data from the projection optical unit 23 can be gathered from the following tables, which, in terms of their design, correspond to the tables for the projection optical unit 7 according to FIG. 2.

Figure 11:
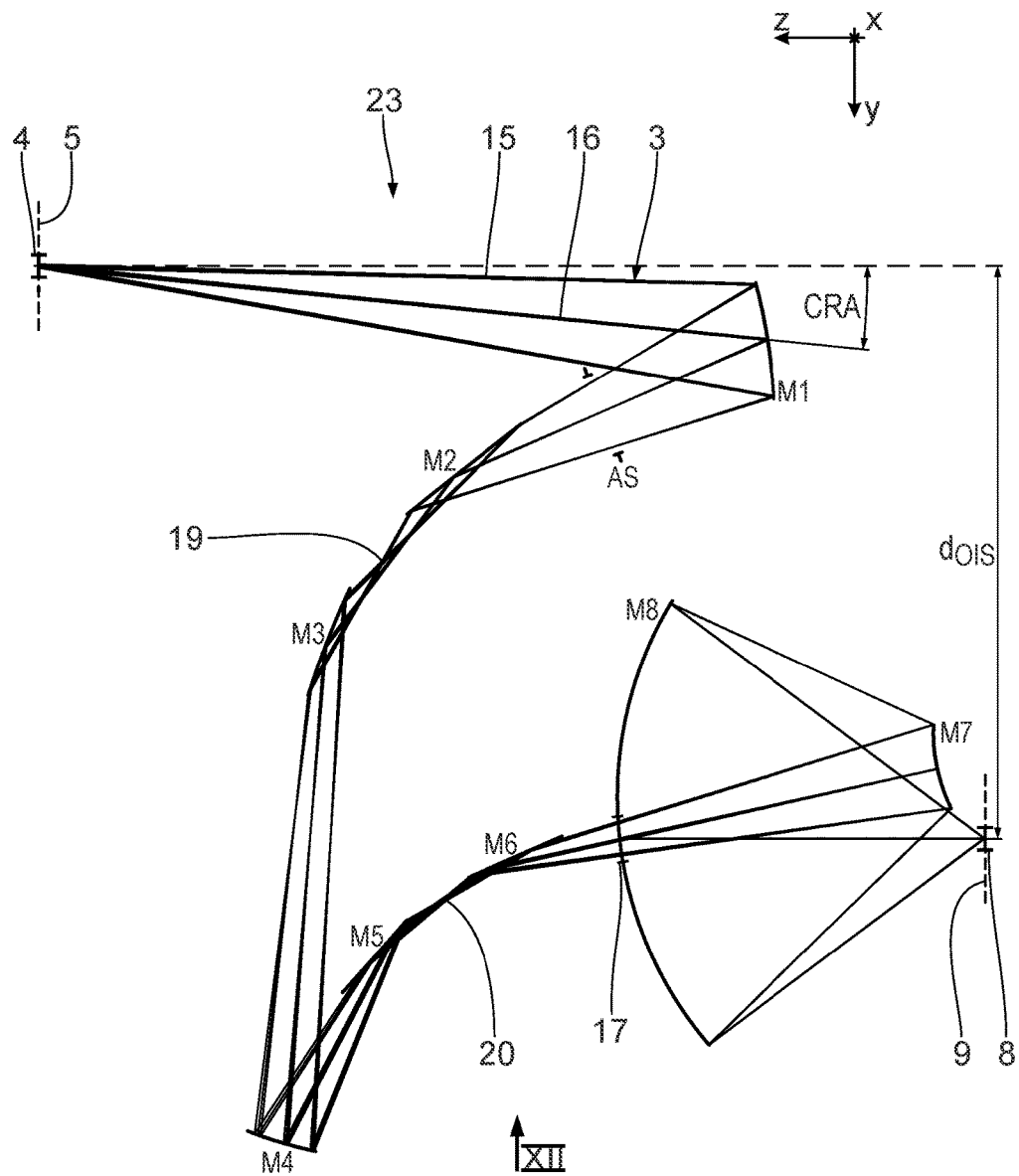

TABLE 1 for FIG. 11

| Exemplary embodiment | FIG. 11 |
|---|---|
| NA | 0.6 |
| Wavelength | 13.5 nm |
| beta_x | 4.0 |
| beta_y | −8.0 |
| Field dimension_x | 26.0 mm |
| Field dimension_y | 1.0 mm |
| Field curvature | 0.012345 1/mm |
| rms | 7.69 ml |
| Stop | AS |

TABLE 2 for FIG. 11

| Surface | Radius_x[mm] | Power_x[1/mm] | Radius_y[mm] | Power_y[1/mm] | Operating |
|---|---|---|---|---|---|
| M8 | −976.0549264 | 0.0020372 | −893.9607135 | 0.0022503 | REFL |
| M7 | 1605.4488755 | −0.0012457 | 413.7247105 | −0.0048341 | REFL |
| M6 | 10301.5015885 | −0.0000380 | −21202.8072073 | 0.0004824 | REFL |
| M5 | 3635.0365565 | −0.0001307 | 16701.6709302 | −0.0005042 | REFL |
| M4 | −1820.9646398 | 0.0010765 | −1080.2806166 | 0.0018888 | REFL |
| M3 | 4841.0405977 | −0.0001159 | −2073.3089952 | 0.0034384 | REFL |
| M2 | 1827.2419697 | −0.0002758 | −14444.8000814 | 0.0005495 | REFL |
| M1 | −2377.3222124 | 0.0008136 | −1375.5962463 | 0.0015034 | REFL |

TABLE 3a for FIG. 11

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −976.05492640 | 1605.44887500 | 10301.50159000 |
| C7 | 2.19828378e−10 | −6.36356922e−07 | 4.00562767e−08 |
| C9 | −9.98389871e−10 | −3.65016004e−07 | −4.12528422e−08 |
| C10 | −1.45764106e−11 | 5.71969655e−10 | 1.08957891e−10 |
| C12 | −2.52771135e−11 | 2.46670725e−09 | −4.70662581e−11 |
| C14 | −1.02760462e−11 | 3.54420919e−09 | −1.39245857e−10 |
| C16 | 2.03106665e−15 | −1.54734742e−12 | −5.12435244e−13 |
| C18 | 2.6654738e−15 | −7.13079933e−12 | 1.30925964e−13 |
| C20 | 1.17154825e−15 | −4.75131372e−12 | −4.62559187e−13 |
| C21 | −1.63294322e−17 | 6.02217641e−16 | −8.74551041e−16 |
| C23 | −5.13321666e−17 | 1.70725636e−14 | 2.05417956e−15 |
| C25 | −5.16679749e−17 | 5.1300394e−14 | 2.82778542e−16 |
| C27 | −1.52982188e−17 | 5.95502512e−14 | −1.76294366e−15 |
| C29 | 2.34938434e−21 | −5.87047318e−18 | 1.79292389e−17 |
| C31 | 9.53875955e−21 | −8.02159693e−17 | 3.53677984e−18 |
| C33 | 7.41837531e−21 | −1.44760898e−16 | 4.75224443e−18 |
| C35 | 3.17781966e−21 | −1.53389098e−16 | −8.67749489e−18 |
| C36 | −1.74669803e−23 | 4.64238531e−21 | 4.46663739e−20 |
| C38 | −8.12917271e−23 | 7.97874167e−20 | −9.13846086e−20 |
| C40 | −1.33686469e−22 | 5.38558802e−19 | 4.82591287e−20 |
| C42 | −8.89282942e−23 | 1.35242561e−18 | −1.72228538e−20 |
| C44 | −2.11369558e−23 | 1.03204921e−18 | −4.12209424e−20 |
| C46 | 3.70185157e−27 | −1.50196108e−23 | −1.29159987e−21 |
| C48 | 1.71782297e−26 | −6.95842931e−22 | −1.39616084e−21 |
| C50 | 2.22143444e−26 | −3.09804936e−21 | −2.08627777e−21 |
| C52 | 1.53089006e−26 | −6.98533988e−21 | −9.76842727e−22 |
| C54 | 4.26761031e−27 | −7.26036629e−21 | 2.22191067e−23 |
| C55 | −1.41052783e−29 | 1.46190475e−26 | −2.60137326e−24 |
| C57 | −7.4039309e−29 | 8.85137564e−25 | 4.26678678e−24 |
| C59 | −1.55590461e−28 | 4.9319069e−24 | −1.47414496e−23 |
| C61 | −1.53106603e−28 | 1.54676307e−23 | −9.68568796e−24 |
| C63 | −7.24629635e−29 | 2.28420484e−23 | −8.46512694e−24 |
| C65 | −1.29675849e−29 | 1.32974652e−23 | 1.94534917e−24 |
| C67 | 3.92163993e−33 | −3.06130187e−28 | 4.60816293e−26 |
| C69 | 3.32571387e−32 | −2.585229e−27 | 7.15189958e−26 |
| C71 | 6.41931602e−32 | 6.54914392e−27 | 1.76430762e−25 |
| C73 | 7.54394662e−32 | 3.13410623e−26 | 6.6239737e−26 |
| C75 | 4.59718108e−32 | 1.00112056e−25 | −3.27980476e−26 |
| C77 | 1.13027094e−32 | 3.27676767e−25 | 1.06724729e−26 |
| C78 | −4.10206054e−35 | −8.70027245e−31 | 3.4135289e−29 |
| C80 | −3.39233217e−34 | −3.89320993e−30 | −1.06150735e−28 |
| C82 | −1.03021092e−33 | 5.93753999e−30 | 1.02974453e−27 |
| C84 | −1.56850907e−33 | 1.90450094e−28 | 9.23265145e−28 |
| C86 | −1.28386624e−33 | 5.05025861e−28 | 3.74030197e−28 |
| C88 | −5.48685031e−34 | 3.6172057e−28 | −5.51970409e−29 |
| C90 | −9.80914435e−35 | 1.01240632e−27 | 1.89034544e−29 |
| C92 | −1.39157061e−39 | −4.57873831e−33 | 0 |
| C94 | −4.31708386e−39 | −8.382893e−32 | 0 |
| C96 | −3.44448678e−38 | −1.07210993e−30 | 0 |
| C98 | −8.25658658e−38 | −5.03791613e−30 | 0 |
| C100 | −1.01825796e−37 | −1.28669615e−29 | 0 |
| C102 | −6.84513059e−38 | −1.76911459e−29 | 0 |
| C104 | −1.711747e−38 | −1.82821708e−29 | 0 |
| C105 | 4.649962e−41 | 8.1726139e−36 | 0 |
| C107 | 4.70430643e−40 | 1.10616456e−34 | 0 |
| C109 | 1.81720607e−39 | 1.18250099e−33 | 0 |

TABLE 3a-continued for FIG. 11

| Coefficient | M8 | M7 | M6 |
|---|---|---|---|
| C111 | 3.65304902e−39 | 6.82975313e−33 | 0 |
| C113 | 4.19723988e−39 | 2.53159388e−32 | 0 |
| C115 | 2.7839518e−39 | 5.81649573e−32 | 0 |
| C117 | 1.01869286e−39 | 8.98654673e−32 | 0 |
| C119 | 1.61205615e−40 | 5.72497092e−33 | 0 |
| C121 | 2.29413381e−44 | 0 | 0 |
| C123 | 1.71241151e−43 | 0 | 0 |
| C125 | 5.53566908e−43 | 0 | 0 |
| C127 | 1.03511867e−42 | 0 | 0 |
| C129 | 1.16673722e−42 | 0 | 0 |
| C131 | 8.00578935e−43 | 0 | 0 |
| C133 | 3.25315947e−43 | 0 | 0 |
| C135 | 5.89466945e−44 | 0 | 0 |
| C136 | −1.11109234e−46 | 0 | 0 |
| C138 | −1.20653366e−45 | 0 | 0 |
| C140 | −5.12337794e−45 | 0 | 0 |
| C142 | −1.18813824e−44 | 0 | 0 |
| C144 | −1.67120445e−44 | 0 | 0 |
| C146 | −1.47117042e−44 | 0 | 0 |
| C148 | −7.95032735e−45 | 0 | 0 |
| C150 | −2.44327164e−45 | 0 | 0 |
| C152 | −3.25752244e−46 | 0 | 0 |

TABLE 3b for FIG. 11

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 3635.03655600 | −1820.96464000 | 4841.04059800 |
| C7 | 2.57009749e−08 | −2.1294935e−08 | 1.36712069e−07 |
| C9 | −3.72582374e−08 | 1.93421757e−07 | −8.74500595e−08 |
| C10 | 7.8233734e−11 | −5.89084686e−12 | 8.62494237e−11 |
| C12 | 8.02780698e−11 | −3.37543666e−11 | −1.7088634e−10 |
| C14 | 2.61049117e−10 | −1.32261075e−09 | 4.48492651e−11 |
| C16 | 3.09661447e−13 | −1.58818149e−14 | 2.77450683e−13 |
| C18 | 2.10045635e−13 | −2.15865369e−13 | −3.34113276e−13 |
| C20 | 1.21021701e−12 | 1.15393712e−12 | −5.85921541e−15 |
| C21 | −2.41896476e−16 | 4.65141242e−18 | −5.50559018e−16 |
| C23 | 9.52938781e−16 | −1.35366331e−17 | −5.52843264e−17 |
| C25 | 1.39124833e−15 | −1.67400723e−15 | −4.64366814e−17 |
| C27 | 6.63375073e−15 | −1.05535916e−14 | 2.5490439e−18 |
| C29 | −8.16482841e−19 | 8.38156716e−21 | −7.32373211e−19 |
| C31 | 3.59438789e−18 | −6.23501959e−19 | −9.06845758e−19 |
| C33 | 8.86781642e−18 | −3.90825082e−18 | −3.35013376e−19 |
| C35 | 3.76466129e−17 | 5.37595901e−17 | −7.91688697e−19 |
| C36 | −1.28304836e−21 | 1.03112096e−23 | −9.50827489e−22 |
| C38 | −4.52259774e−21 | −4.62084609e−23 | −6.54130884e−22 |
| C40 | 1.56604929e−20 | −2.7292065e−21 | −8.74034942e−23 |
| C42 | 3.88773358e−20 | 2.03483548e−20 | −6.5838669e−22 |
| C44 | 1.67428046e−19 | 2.93995381e−20 | −2.53948758e−21 |
| C46 | −3.0360884e−23 | 5.21312924e−26 | −2.68013198e−24 |
| C48 | −7.21185982e−23 | −1.33972726e−24 | −4.9222184e−24 |
| C50 | 5.18088318e−23 | −1.24105283e−24 | −4.7933984e−24 |
| C52 | 6.16975585e−23 | 3.06933511e−23 | −1.70412044e−23 |
| C54 | 4.24660998e−22 | −5.64955517e−22 | 6.4347066e−24 |
| C55 | −1.6271291e−26 | 4.63650557e−29 | −3.42069517e−27 |
| C57 | −3.57240815e−25 | 5.55114689e−28 | 2.25863769e−27 |
| C59 | −6.31556667e−25 | −1.84905509e−26 | 9.28486516e−27 |
| C61 | 4.61447251e−25 | −3.08585922e−25 | 8.51712637e−26 |
| C63 | −3.71561263e−25 | −3.12378903e−24 | 1.7529979e−25 |
| C65 | 9.5860185e−26 | −1.8010687e−23 | 6.62427176e−26 |
| C67 | −2.47265617e−28 | 5.41712208e−31 | −1.55256743e−29 |
| C69 | −2.06239914e−27 | −2.35057884e−30 | 1.99164113e−29 |
| C71 | −1.5921589e−27 | −1.41339304e−28 | 9.91860891e−29 |
| C73 | 3.03522588e−27 | −9.69554851e−28 | 1.00634728e−28 |
| C75 | −2.62981493e−27 | 2.0508857e−27 | 9.00855813e−28 |
| C77 | −2.18840864e−27 | 6.06084993e−26 | −8.26691103e−28 |
| C78 | −1.17239422e−32 | 4.89119743e−35 | 5.58604671e−33 |
| C80 | −1.16854407e−30 | −2.02407723e−33 | −3.28747822e−32 |
| C82 | −3.08998618e−30 | −2.20096684e−32 | −1.14542118e−31 |

TABLE 3b-continued for FIG. 11

| Coefficient | M5 | M4 | M3 |
|---|---|---|---|
| C84 | −7.89273413e−31 | 2.74906624e−30 | −6.79261258e−31 |
| C86 | 6.84152967e−30 | 3.72337204e−29 | −3.89967939e−30 |
| C88 | −5.7080773e−30 | 2.22680476e−28 | −1.91337022e−30 |
| C90 | −3.51317215e−30 | 3.87680038e−28 | −5.50880595e−30 |
| C92 | 0 | −8.38453643e−37 | 0 |
| C94 | 0 | −3.55006604e−35 | 0 |
| C96 | 0 | 1.26938434e−33 | 0 |
| C98 | 0 | 2.33863016e−32 | 0 |
| C100 | 0 | 2.18103556e−31 | 0 |
| C102 | 0 | 5.016293e−31 | 0 |
| C104 | 0 | 3.62790298e−31 | 0 |
| C105 | 0 | 1.09066038e−40 | 0 |
| C107 | 0 | −7.25422962e−39 | 0 |
| C109 | 0 | 2.22890362e−37 | 0 |
| C111 | 0 | 6.88589895e−37 | 0 |
| C113 | 0 | 4.02220615e−35 | 0 |
| C115 | 0 | −1.2216709e−34 | 0 |
| C117 | 0 | −7.73545378e−34 | 0 |
| C119 | 0 | 1.85443438e−34 | 0 |

TABLE 3c for FIG. 11

| Coefficient | M2 | M1 |
|---|---|---|
| KY | 0.00000000 | 0.00000000 |
| KX | 0.00000000 | 0.00000000 |
| RX | 1827.24197000 | −2377.32221200 |
| C7 | 1.56502368e−09 | −7.13513756e−08 |
| C9 | −6.26911734e−08 | 9.17471292e−08 |
| C10 | 1.41230769e−10 | 8.40766962e−11 |
| C12 | −3.04910182e−10 | 2.91023473e−10 |
| C14 | −2.30510407e−11 | 4.31755807e−12 |
| C16 | −3.52691423e−13 | −4.53670074e−14 |
| C18 | −1.0320651e−13 | −5.95941991e−14 |
| C20 | −9.51064717e−14 | 1.66558381e−13 |
| C21 | 9.84316426e−17 | 1.66149114e−16 |
| C23 | −1.35395637e−15 | 1.32371152e−16 |
| C25 | 1.21597267e−15 | 5.833456e−16 |
| C27 | −1.1674039e−15 | −3.68408362e−17 |
| C29 | −7.74261965e−19 | −2.40580867e−19 |
| C31 | −2.76522987e−19 | 1.65773059e−18 |
| C33 | 1.05241218e−18 | 5.48856019e−20 |
| C35 | −5.10437615e−18 | −4.42162143e−19 |
| C36 | −3.81741873e−22 | 2.43979093e−23 |
| C38 | −2.88594691e−21 | 1.66336126e−21 |
| C40 | 5.24127138e−21 | −3.88130319e−21 |
| C42 | −3.41854736e−21 | −1.10874925e−20 |
| C44 | −1.25112141e−20 | −4.08279493e−21 |
| C46 | −4.9140382e−24 | −2.57343371e−25 |
| C48 | −1.97383935e−24 | −1.97810927e−24 |
| C50 | 1.54345126e−23 | 7.29885252e−24 |
| C52 | −2.12401718e−23 | 4.19211248e−23 |
| C54 | −2.0430002e−23 | 9.62634178e−23 |
| C55 | 1.23131058e−26 | −6.15974781e−28 |
| C57 | −2.05893454e−26 | −9.39989994e−27 |
| C59 | 1.38955401e−26 | 2.09944038e−26 |
| C61 | 3.74456493e−26 | 2.7448534e−25 |
| C63 | 1.73774336e−26 | 1.00440987e−24 |
| C65 | 1.25560997e−25 | 8.58767365e−25 |
| C67 | −3.17910229e−30 | 6.91958428e−31 |
| C69 | −4.10898094e−29 | 4.696358e−29 |
| C71 | 1.75258658e−29 | 6.04823906e−29 |
| C73 | −1.04296772e−28 | 4.77800782e−28 |
| C75 | 6.93775083e−28 | −6.02584377e−29 |
| C77 | 9.48135271e−28 | −6.53478917e−27 |
| C78 | −1.23543362e−31 | 1.39551165e−32 |
| C80 | 2.24525835e−31 | 1.34737938e−31 |
| C82 | 5.09289774e−31 | 1.31968764e−32 |
| C84 | 3.55196448e−31 | −2.26117025e−30 |
| C86 | −6.08086773e−32 | −1.48860877e−29 |
| C88 | 1.95350165e−30 | −4.62935115e−29 |
| C90 | 1.69949878e−30 | −1.38625073e−29 |
| C92 | 0 | 1.78614456e−35 |
| C94 | 0 | −1.46012632e−34 |
| C96 | 0 | 1.16037236e−34 |
| C98 | 0 | 8.65517951e−34 |
| C100 | 0 | −3.13867819e−33 |
| C102 | 0 | 3.97265573e−32 |
| C104 | 0 | 9.3511929e−32 |
| C105 | 0 | −4.77493951e−38 |
| C107 | 0 | −7.34006931e−37 |
| C109 | 0 | −1.17359681e−36 |
| C111 | 0 | 7.86504888e−36 |
| C113 | 0 | 6.86341896e−35 |
| C115 | 0 | 3.49056747e−34 |
| C117 | 0 | 7.18775288e−34 |
| C119 | 0 | 2.32566387e−34 |

TABLE 4a for FIG. 11

| Surface | DCX | DCY | DCZ |
|---|---|---|---|
| Stop plane | 0.00000000 | 0.00000000 | 0.00000000 |
| M8 | 0.00000000 | 0.00000000 | 848.28205269 |
| M7 | 0.00000000 | −162.88773890 | 109.30511934 |
| M6 | 0.00000000 | 65.26456604 | 1144.36946351 |
| M5 | 0.00000000 | 232.71909805 | 1381.58868170 |
| M4 | 0.00000000 | 709.32039347 | 1630.18877097 |
| M3 | 0.00000000 | −458.15012351 | 1529.45343974 |
| M2 | 0.00000000 | −838.71048856 | 1239.83802566 |
| Stop | 0.00000000 | −994.31028446 | 889.36154956 |
| M1 | 0.00000000 | −1164.93718040 | 505.03769572 |
| Object | 0.00000000 | −1338.70151052 | 2200.17508279 |

TABLE 4b for FIG. 11

| Surface | TLA[deg] | TLB[deg] | TLC[deg] |
|---|---|---|---|
| Stop plane | −0.00000000 | 0.00000000 | −0.00000000 |
| M8 | −6.21527522 | 0.00000000 | −0.00000000 |

TABLE 4b-continued for FIG. 11

| Surface | TLA[deg] | TLB[deg] | TLC[deg] |
|---|---|---|---|
| M7 | −12.43055045 | 180.00000000 | 0.00000000 |
| M6 | 66.17547111 | 0.00000000 | −0.00000000 |
| M5 | 41.16424832 | 0.00000000 | 180.00000000 |
| M4 | −73.76071870 | 0.00000000 | −0.00000000 |
| M3 | 21.10177461 | 0.00000000 | 180.00000000 |
| M2 | 51.66618772 | 0.00000000 | −0.00000000 |
| Stop | −21.28832791 | 180.00000000 | 0.00000000 |
| M1 | −9.04340489 | 180.00000000 | 0.00000000 |
| Object | 0.35280539 | 0.00000000 | −0.00000000 |

TABLE 5 for FIG. 11

| Surface | Angle of incidence [deg] | Reflectivity |
|---|---|---|
| M8 | 6.18142908 | 0.66168421 |
| M7 | 0.11878457 | 0.66566427 |
| M6 | 78.72475666 | 0.86107409 |
| M5 | 76.26057332 | 0.82458650 |
| M4 | 11.42975349 | 0.65103680 |
| M3 | 73.70682018 | 0.78091870 |
| M2 | 75.40680465 | 0.81073422 |
| M1 | 14.74080091 | 0.64008245 |
| Overall transmis- | | 0.0825 |

TABLE 6 for FIG. 11

| X[mm] | Y[mm] | Z[mm] |
|---|---|---|
| 0.00000000 | 86.20922226 | 0.00000000 |
| 36.72382480 | 84.97541559 | 0.00000000 |
| 72.60627184 | 81.30635297 | 0.00000000 |
| 106.81704274 | 75.30020814 | 0.00000000 |
| 138.54746210 | 67.12445749 | 0.00000000 |
| 167.02142858 | 57.02095116 | 0.00000000 |
| 191.50920870 | 45.30980142 | 0.00000000 |
| 211.34639358 | 32.38840096 | 0.00000000 |
| 225.95894895 | 18.72172915 | 0.00000000 |
| 234.89419168 | 4.82024813 | 0.00000000 |
| 237.85573593 | −8.79637599 | 0.00000000 |
| 234.73598499 | −21.64530437 | 0.00000000 |
| 225.63532277 | −33.32461514 | 0.00000000 |
| 210.85823653 | −43.54394285 | 0.00000000 |
| 190.88425204 | −52.13722338 | 0.00000000 |
| 166.32148117 | −59.05987397 | 0.00000000 |
| 137.85765833 | −64.37417564 | 0.00000000 |
| 106.22378637 | −68.22254961 | 0.00000000 |
| 72.17738489 | −70.78761836 | 0.00000000 |
| 36.50050531 | −72.24403204 | 0.00000000 |
| 0.00000000 | −72.71484378 | 0.00000000 |
| −36.50050531 | −72.24403204 | 0.00000000 |
| −72.17738489 | −70.78761836 | 0.00000000 |
| −106.22378637 | −68.22254961 | 0.00000000 |
| −137.85765833 | −64.37417564 | 0.00000000 |
| −166.32148117 | −59.05987397 | 0.00000000 |
| −190.88425204 | −52.13722338 | 0.00000000 |
| −210.85823653 | −43.54394285 | 0.00000000 |
| −225.63532277 | −33.32461514 | 0.00000000 |
| −234.73598499 | −21.64530437 | 0.00000000 |
| −237.85573593 | −8.79637599 | 0.00000000 |
| −234.89419168 | 4.82024813 | 0.00000000 |
| −225.95894895 | 18.72172915 | 0.00000000 |
| −211.34639358 | 32.38840096 | 0.00000000 |
| −191.50920870 | 45.30980142 | 0.00000000 |
| −167.02142858 | 57.02095116 | 0.00000000 |
| −138.54746210 | 67.12445749 | 0.00000000 |
| −106.81704274 | 75.30020814 | 0.00000000 |

TABLE 6-continued for FIG. 11

| X[mm] | Y[mm] | Z[mm] |
|---|---|---|
| −72.60627184 | 81.30635297 | 0.00000000 |
| −36.72382480 | 84.97541559 | 0.00000000 |

The projection optical unit 23 has an overall transmission of approximately 8%.

The projection optical unit 23 has an image field 8 with an x-dimension of 2 times 13 mm and a y-dimension of 1.0 mm. The image field is present with an absolute radius of curvature of 81 mm. The projection optical unit 23 has an image-side numerical aperture of 0.60.

In the first imaging light plane xz, the reduction factor $\beta_x$ is 4.00. In the second imaging light plane yz, the reduction factor $\beta_y$ is −8.00. An object-field-side chief ray angle is 5.4°.

A maximum pupil obscuration is 11%. The projection optical unit 23 has an overall transmission of approximately 6.8%.

An object-image offset $d_{OIS}$ is approximately 1340 mm. The mirrors of the projection optical unit 23 can be accommodated in a cuboid having xyz-edge lengths of 1060 mm×2025 mm×1634 mm.

In the projection optical unit 23, the object plane 5 and the image plane 9 are at an angle of 0.4° in relation to one another. A working distance between the mirror M7 closest to the wafer and the image plane 9 is 77 mm. A mean wavefront aberration rms is approximately 7.69 mλ.

A further embodiment of a projection optical unit 24, which can be used in the projection exposure apparatus 1 according to FIG. 1 instead of the projection optical unit 7, is explained in the following text on the basis of FIGS. 14 to 16.

Components and functions which have already been explained above in the context of FIGS. 1 to 13 are denoted, where applicable, by the same reference signs and are not discussed again in detail.

The mirrors M1 to M8 are once again embodied as free-form surface mirrors for which the free-form surface equation (1) indicated above holds true.

The following table once again shows the mirror parameters of mirrors M1 to M8 of the projection optical unit 24.

The mirror M4 has an x/y-aspect ratio of approximately 3.1.

| | M1 | M2 | M3 | M4 | M5 | M6 | M7 | M8 |
|---|---|---|---|---|---|---|---|---|
| Maximum angle of incidence [°] | 18.2 | 82.1 | 80.4 | 12.9 | 83.8 | 81.7 | 20.6 | 7.8 |
| Extent of the reflection surface in the x-direction [mm] | 469.6 | 320.2 | 364.3 | 579.8 | 330.3 | 162.0 | 273.1 | 871.9 |
| Extent of the reflection surface in the y-direction [mm] | 237.5 | 354.0 | 308.4 | 190.1 | 255.4 | 257.5 | 206.0 | 857.9 |
| Maximum mirror diameter [mm] | 469.8 | 368.1 | 364.8 | 579.9 | 338.1 | 266.6 | 273.2 | 872.3 |

The last mirror M8 has the largest mirror diameter, measuring approximately 872.3 mm. None of the other mirrors M1 to M7 has a larger diameter than 580 mm. Five of the seven mirrors have a maximum diameter smaller than 350 mm. None of the GI mirrors has a maximum mirror diameter that is greater than 370 mm.

Figure 16:
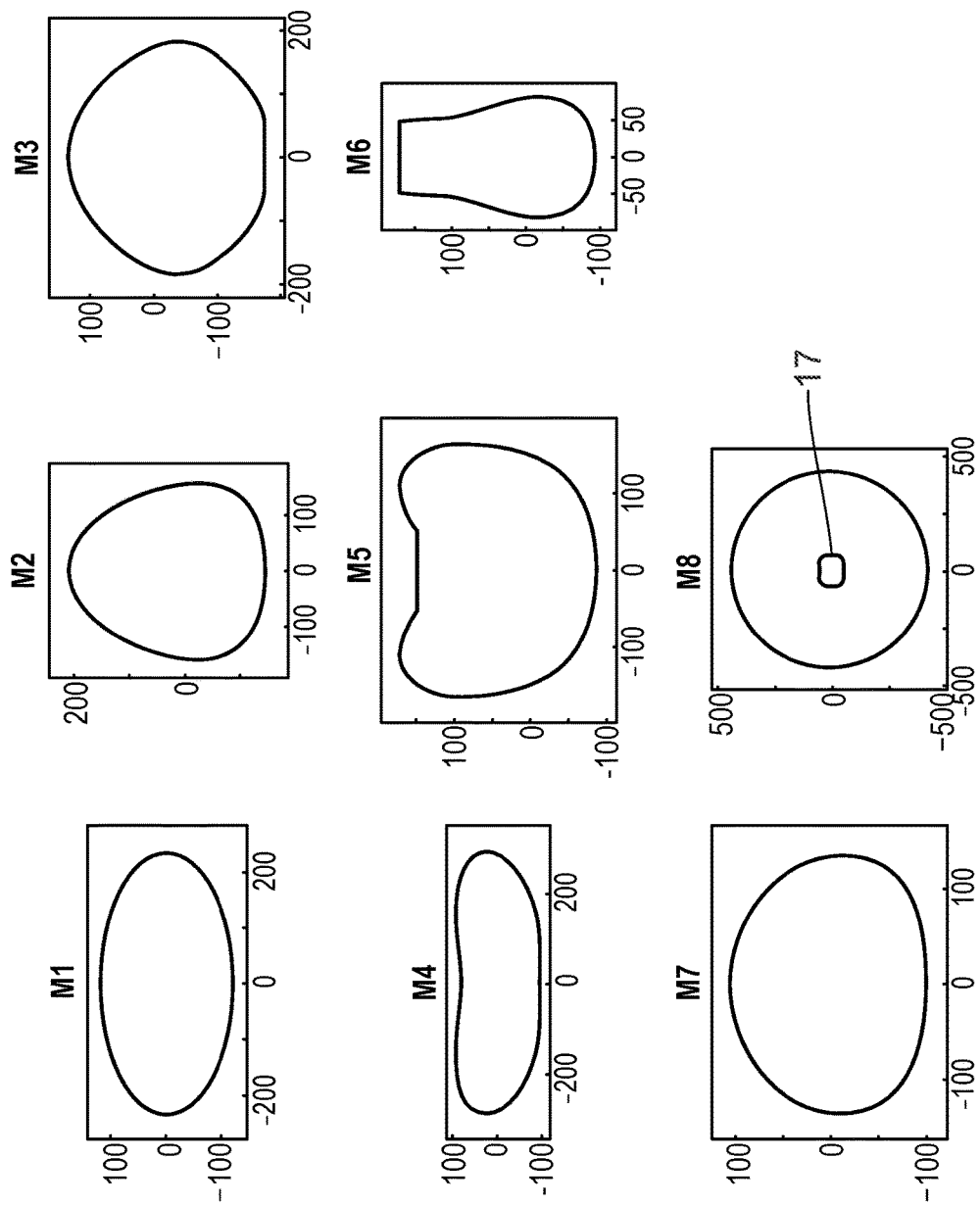

FIG. 16 shows the marginal contours of the reflection surfaces of the mirrors M1 to M8.

The optical design data from the projection optical unit 24 can be gathered from the following tables, which, in terms of their design, correspond to the tables for the projection optical unit 7 according to FIG. 2.

Figure 14:
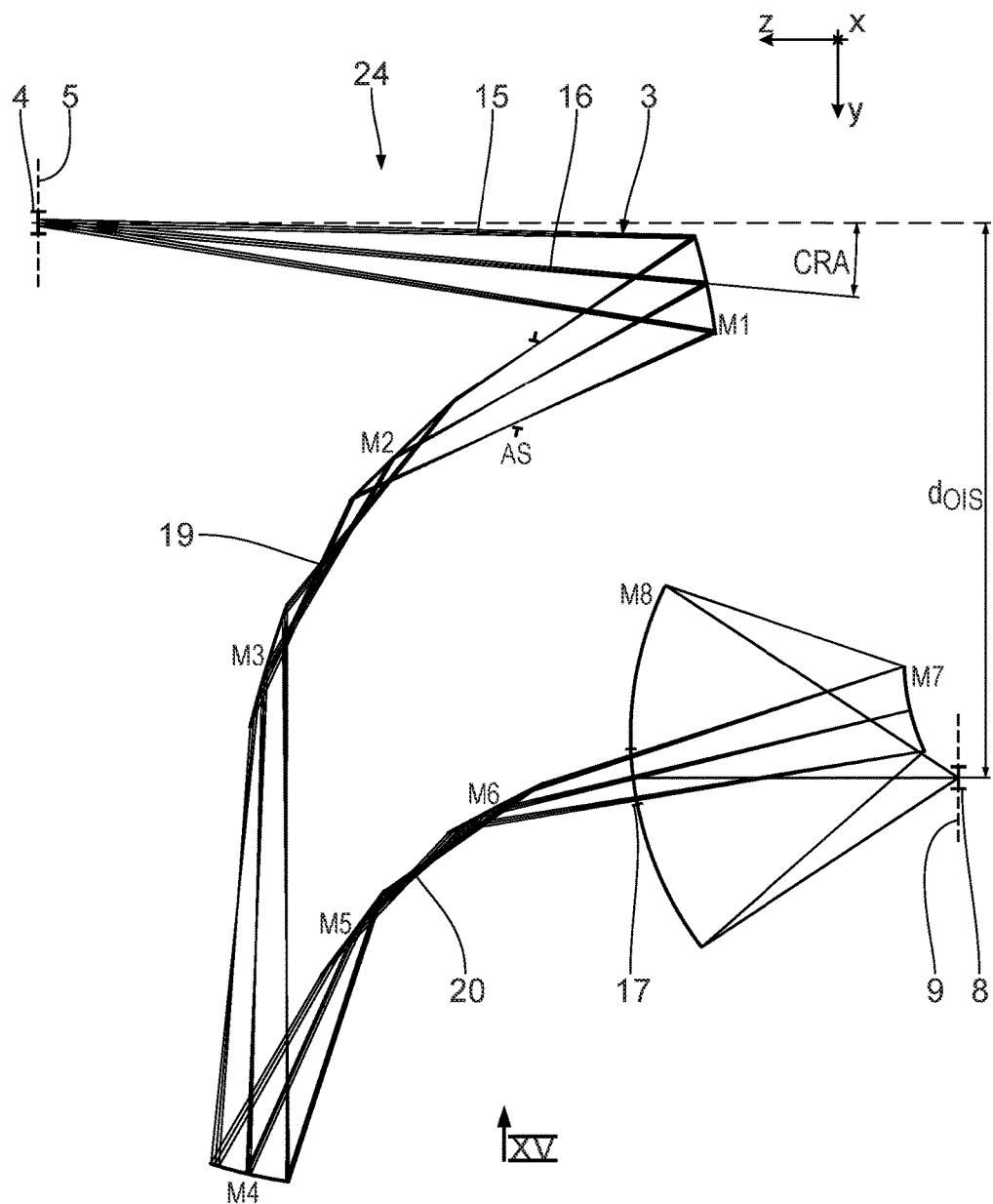
Figure 15:
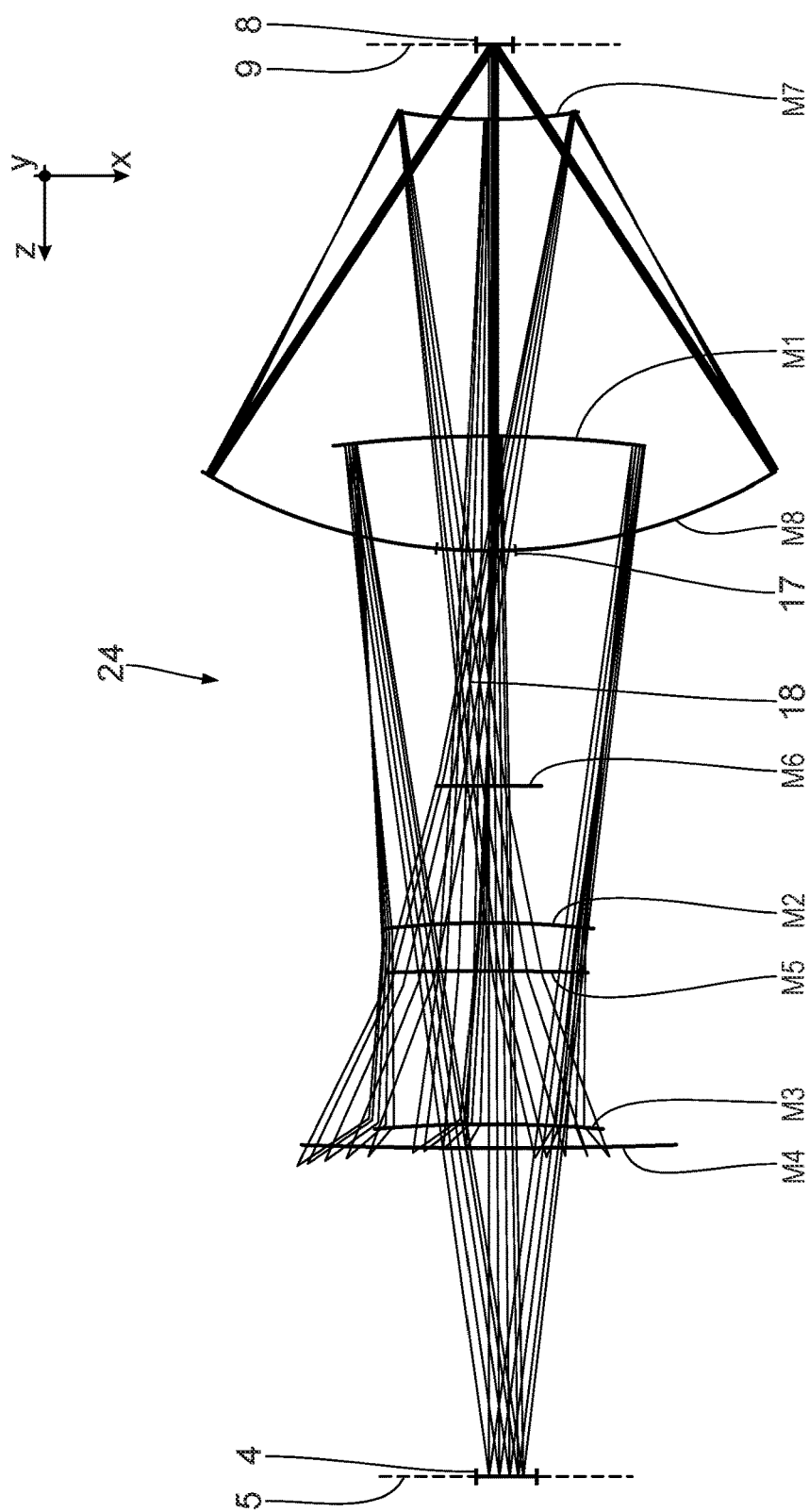

TABLE 1 for FIG. 14

| Exemplary embodiment | FIG. 14 |
|---|---|
| NA | 0.55 |
| Wavelength | 13.5 nm |

TABLE 1-continued for FIG. 14

| Exemplary embodiment | FIG. 14 | |
|---|---|---|
| beta_x | 4.0 | |
| beta_y | −8.0 | |
| Field dimension_x | 26.0 | mm |
| Field dimension_y | 1.2 | mm |
| Field curvature | 0.012345 | 1/mm |
| rms | 7.7 | ml |
| Stop | AS | |

TABLE 2 for FIG. 14

| Surface | Radius_x[mm] | Power_x[1/mm] | Radius_y[mm] | Power_y[1/mm] | Operating |
|---|---|---|---|---|---|
| M8 | −846.9724012 | 0.0023447 | −826.8226473 | 0.0024360 | REFL |
| M7 | 853.1079988 | −0.0023444 | 521.1284629 | −0.0038378 | REFL |
| M6 | 12387.0674460 | −0.0000385 | −7874.4479637 | 0.0010664 | REFL |
| M5 | 3684.7892162 | −0.0001153 | −415388.1158876 | 0.0000227 | REFL |
| M4 | −1890.0093745 | 0.0010377 | −1179.0939089 | 0.0017297 | REFL |
| M3 | 1914.3380123 | −0.0002630 | −3265.5960252 | 0.0024327 | REFL |
| M2 | 1009.3281633 | −0.0005199 | −8476.1578337 | 0.0008993 | REFL |
| M1 | −1839.1919908 | 0.0010399 | −1533.5196808 | 0.0013638 | REFL |

TABLE 3a for FIG. 14

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −846.97240120 | 853.10799880 | 12387.06745000 |
| C7 | 1.2320395e−08 | −1.10223453e−06 | 4.71730563e−08 |
| C9 | −1.16005845e−09 | −2.98278131e−07 | −5.3389029e−08 |
| C10 | −2.04236611e−11 | 1.78106299e−09 | 9.05156021e−11 |
| C12 | −4.54132962e−11 | 6.12353711e−09 | −1.03359082e−11 |
| C14 | −2.40367475e−11 | 5.08477087e−09 | −1.64730548e−10 |
| C16 | 1.77843692e−14 | −8.07912869e−12 | −5.57266573e−14 |
| C18 | 2.01124106e−14 | −1.6167378e−11 | −9.91603275e−14 |
| C20 | 4.10729539e−15 | −7.35914115e−12 | −4.67930188e−13 |
| C21 | −3.20814752e−17 | 9.41630194e−15 | −7.15980298e−16 |
| C23 | −1.06488731e−16 | 6.39117479e−14 | 1.38110923e−16 |
| C25 | −1.14439569e−16 | 1.06117399e−13 | −1.04361583e−15 |
| C27 | −3.77999342e−17 | 4.96949958e−14 | 1.73894357e−16 |
| C29 | 2.60054296e−20 | −8.06963682e−17 | 2.75272685e−18 |
| C31 | 5.50028986e−20 | −2.96316741e−16 | −7.50105218e−18 |
| C33 | 3.70562779e−20 | −3.00433027e−16 | −6.94368156e−19 |
| C35 | 1.42854705e−20 | −2.29648711e−16 | 4.26271462e−18 |
| C36 | −4.60596848e−23 | 6.92131411e−20 | 9.05436047e−21 |
| C38 | −2.05873444e−22 | 7.7464303e−19 | −1.33099001e−19 |
| C40 | −3.3383545e−22 | 2.15541971e−18 | −4.18111548e−20 |
| C42 | −2.27079989e−22 | 2.70298127e−18 | −5.40235414e−21 |
| C44 | −6.30295138e−23 | 1.40217381e−18 | −2.84168534e−20 |
| C46 | 3.75400319e−26 | −1.14341942e−21 | −6.32863915e−22 |
| C48 | 1.10078875e−25 | −5.43635692e−21 | 4.69331841e−22 |
| C50 | 1.26265607e−25 | −9.32893259e−21 | 5.77175439e−22 |
| C52 | 8.33497479e−26 | −1.13644482e−20 | −2.98864274e−22 |
| C54 | 2.00021285e−26 | −6.04762304e−21 | −2.34720669e−22 |
| C55 | −5.91182486e−29 | 1.16957749e−24 | 7.21565155e−24 |
| C57 | −3.1494251e−28 | 1.22796411e−23 | −1.28570543e−25 |
| C59 | −6.57074254e−28 | 3.55297455e−23 | 2.24855854e−23 |
| C61 | −6.6062298e−28 | 5.08203578e−23 | −1.55822253e−25 |
| C63 | −3.3623666e−28 | 2.31215095e−23 | −6.517115e−25 |
| C65 | −6.04041979e−29 | −1.25746228e−23 | 9.46438643e−25 |
| C67 | 7.42620668e−32 | −5.15614263e−28 | 1.11822802e−25 |

TABLE 3a-continued for FIG. 14

| Coefficient | M8 | M7 | M6 |
|---|---|---|---|
| C69 | 3.03590667e−31 | −5.75779942e−26 | −2.24690875e−26 |
| C71 | 5.33963015e−31 | −2.80774548e−25 | −6.01942492e−27 |
| C73 | 5.21323573e−31 | −7.52374968e−25 | −2.19602179e−26 |
| C75 | 2.59187184e−31 | −8.50473137e−25 | 1.43241195e−26 |
| C77 | −8.62385553e−33 | 1.13161567e−25 | 1.02565112e−26 |
| C78 | −1.46891831e−34 | 8.75817967e−32 | −1.38339869e−27 |
| C80 | −1.00682817e−33 | 1.87433e−29 | 3.62550261e−28 |
| C82 | −2.88560889e−33 | 1.00248412e−27 | −5.85727759e−28 |
| C84 | −4.13548699e−33 | 4.67230535e−27 | −5.29132467e−28 |
| C86 | −3.3652948e−33 | 9.51617567e−27 | 1.70844702e−29 |
| C88 | −1.60170466e−33 | 9.06067387e−27 | 5.25684627e−29 |
| C90 | −2.60609186e−34 | 3.37692234e−27 | 2.06314078e−29 |
| C92 | −2.01160817e−38 | −5.48890415e−31 | 0 |
| C94 | −1.07137119e−37 | −3.31305082e−30 | 0 |
| C96 | −3.65980529e−37 | −5.7458122e−30 | 0 |
| C98 | −5.30998728e−37 | −2.43038114e−30 | 0 |
| C100 | −5.48265982e−37 | 2.81796705e−29 | 0 |
| C102 | −4.91185122e−37 | 6.15964021e−29 | 0 |
| C104 | 5.16017552e−38 | 3.11055245e−30 | 0 |
| C105 | 1.30887811e−40 | 8.41812594e−36 | 0 |
| C107 | 1.08604904e−39 | 7.7469187e−33 | 0 |
| C109 | 4.28513307e−39 | 1.21879325e−32 | 0 |
| C111 | 8.34074932e−39 | −6.262806e−32 | 0 |
| C113 | 8.89084695e−39 | −2.88292697e−31 | 0 |
| C115 | 6.12303433e−39 | −6.81118618e−31 | 0 |
| C117 | 3.29331725e−39 | −7.0452395e−31 | 0 |
| C119 | 4.85587891e−40 | −2.43594128e−31 | 0 |
| C121 | 4.2188167e−43 | 1.53572715e−36 | 0 |
| C123 | 2.4324299e−42 | −7.53625277e−36 | 0 |
| C125 | 6.75774304e−42 | −2.29876953e−34 | 0 |
| C127 | 1.07671213e−41 | −9.43774343e−34 | 0 |
| C129 | 1.02263161e−41 | −1.73631618e−33 | 0 |
| C131 | 5.96074699e−42 | −2.628547e−33 | 0 |
| C133 | 2.39193735e−42 | −2.9304751e−33 | 0 |
| C135 | 2.42057211e−43 | −6.02371961e−34 | 0 |
| C136 | −7.41800075e−46 | 4.48389771e−39 | 0 |
| C138 | −6.68889241e−45 | −3.30564593e−38 | 0 |
| C140 | −2.65690996e−44 | 4.11242391e−37 | 0 |
| C142 | −5.79200648e−44 | 4.15570507e−36 | 0 |
| C144 | −7.67227313e−44 | 1.28277521e−35 | 0 |
| C146 | −6.4258078e−44 | 2.39774859e−35 | 0 |
| C148 | −3.43925844e−44 | 3.45224439e−35 | 0 |
| C150 | −1.23729775e−44 | 2.88769432e−35 | 0 |
| C152 | −1.80030431e−45 | 9.78156794e−36 | 0 |

TABLE 3b for FIG. 14

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 3684.78921600 | −1890.00937500 | 1914.33801200 |
| C7 | −1.18441223e−07 | 4.82838464e−09 | 2.64819336e−07 |
| C9 | −7.56475041e−08 | 3.49378793e−07 | −6.38036447e−08 |
| C10 | 6.04878431e−11 | −1.84051484e−12 | 4.64197765e−11 |
| C12 | −2.23709381e−10 | 1.09280358e−10 | 6.18069921e−11 |
| C14 | 1.562198e−10 | −7.28651667e−10 | 7.83230576e−11 |
| C16 | 3.34028351e−14 | 2.38952065e−14 | 4.12679488e−13 |
| C18 | −3.00086748e−13 | −1.96777276e−13 | −4.32270063e−13 |
| C20 | 4.68219284e−13 | 1.35555146e−12 | 8.40087274e−14 |
| C21 | −4.0702865e−16 | 7.40532658e−18 | −8.81423887e−16 |
| C23 | −2.36288628e−16 | 1.00712117e−18 | 9.92956826e−16 |
| C25 | −4.97432802e−16 | 7.598711e−17 | −3.686827e−16 |
| C27 | 1.81191641e−15 | 7.88304423e−17 | −8.23646195e−17 |
| C29 | −2.06197001e−18 | 1.384685e−20 | −1.1842489e−18 |
| C31 | 1.13052156e−19 | −2.57856348e−19 | 1.96732721e−20 |
| C33 | −1.90139505e−18 | 4.80769598e−18 | 1.26971686e−18 |
| C35 | 3.95527556e−18 | 2.77912532e−17 | −7.90318924e−19 |
| C36 | −5.35303599e−21 | 1.69716842e−23 | −3.14125518e−21 |
| C38 | 7.68100312e−21 | −1.48206479e−22 | 1.43308149e−21 |
| C40 | −7.2244406e−22 | 3.42034323e−21 | −4.99750813e−21 |

TABLE 3b-continued for FIG. 14

| Coefficient | M5 | M4 | M3 |
|---|---|---|---|
| C42 | −2.4634504e−20 | 3.6436736e−20 | 7.70706811e−21 |
| C44 | −2.00431385e−21 | −2.45500848e−19 | 2.74487979e−21 |
| C46 | 5.18193203e−23 | −1.01297263e−25 | −1.44657698e−23 |
| C48 | 8.75679392e−23 | 4.79637256e−25 | 2.74117762e−24 |
| C50 | −3.53128094e−23 | 9.94327619e−24 | −1.03711253e−23 |
| C52 | −6.60467887e−23 | −5.22184057e−22 | −2.92843985e−23 |
| C54 | 1.51518204e−22 | 1.07459088e−21 | 1.12713962e−23 |
| C55 | 1.59948709e−25 | −8.20323086e−29 | −1.77185804e−26 |
| C57 | 1.77247597e−25 | −2.74918664e−27 | 3.96509337e−26 |
| C59 | −7.63267432e−26 | −1.97739674e−26 | −3.49426355e−26 |
| C61 | 4.43767655e−26 | −3.78630703e−25 | 3.46924008e−26 |
| C63 | 4.79776834e−25 | −9.93260359e−25 | −1.91536464e−25 |
| C65 | 2.33370237e−24 | 1.99117001e−24 | −2.90090272e−26 |
| C67 | −6.22107865e−28 | −3.47445925e−31 | 1.54529133e−29 |
| C69 | −2.80330445e−27 | 8.00579883e−30 | 2.22647601e−28 |
| C71 | −2.7708788e−28 | 8.66604501e−30 | −3.78783104e−28 |
| C73 | −4.70246478e−28 | 2.29017464e−27 | 3.59269229e−28 |
| C75 | 4.3527901e−27 | 5.39425603e−26 | 8.58505666e−28 |
| C77 | 1.12154448e−26 | −8.33422427e−26 | −2.07149081e−28 |
| C78 | −1.09052444e−30 | 8.02911291e−34 | 2.88900861e−31 |
| C80 | −7.89753097e−30 | 4.92272668e−32 | −7.56973433e−31 |
| C82 | −6.22313726e−30 | 7.30249575e−31 | −1.96564197e−31 |
| C84 | 4.94271486e−31 | 3.92211632e−30 | 2.72814487e−30 |
| C86 | −5.27875299e−30 | 5.30860827e−29 | −3.72111076e−30 |
| C88 | 1.13764862e−29 | 1.17646094e−28 | 2.94159718e−30 |
| C90 | 1.82757598e−29 | −1.25531699e−30 | −9.02850462e−31 |
| C92 | 0 | 7.83484698e−36 | 0 |
| C94 | 0 | 9.01532973e−35 | 0 |
| C96 | 0 | −4.79518858e−34 | 0 |
| C98 | 0 | −5.81406734e−34 | 0 |
| C100 | 0 | −2.90065241e−31 | 0 |
| C102 | 0 | −4.77939068e−30 | 0 |
| C104 | 0 | 2.48822193e−30 | 0 |
| C105 | 0 | −7.9516104e−39 | 0 |
| C107 | 0 | −3.36132761e−37 | 0 |
| C109 | 0 | −7.97463555e−36 | 0 |
| C111 | 0 | −7.1384024e−35 | 0 |
| C113 | 0 | −1.23920171e−34 | 0 |
| C115 | 0 | −6.7658379e−33 | 0 |
| C117 | 0 | −1.07711846e−32 | 0 |
| C119 | 0 | −6.20607675e−33 | 0 |
| C121 | 0 | −3.42863929e−41 | 0 |
| C123 | 0 | −1.19294188e−39 | 0 |
| C125 | 0 | −5.42537125e−39 | 0 |
| C127 | 0 | 9.13126811e−38 | 0 |
| C129 | 0 | −9.62175253e−37 | 0 |
| C131 | 0 | 1.28691362e−35 | 0 |
| C133 | 0 | 1.83991188e−34 | 0 |
| C135 | 0 | −5.1120586e−35 | 0 |
| C136 | 0 | 2.80529867e−44 | 0 |
| C138 | 0 | 7.81010551e−43 | 0 |
| C140 | 0 | 2.50483237e−41 | 0 |
| C142 | 0 | 4.37654706e−40 | 0 |
| C144 | 0 | 1.40349982e−39 | 0 |
| C146 | 0 | 1.49878457e−39 | 0 |
| C148 | 0 | 3.40726155e−37 | 0 |
| C150 | 0 | 1.41219028e−37 | 0 |
| C152 | 0 | 8.65494549e−37 | 0 |

TABLE 3c for FIG. 14

| Coefficient | M2 | M1 |
|---|---|---|
| KY | 0.00000000 | 0.00000000 |
| KX | 0.00000000 | 0.00000000 |
| RX | 1009.32816300 | −1839.19199100 |
| C7 | 1.15791194e−07 | −2.10330873e−08 |
| C9 | 2.81311304e−08 | 5.71004481e−08 |
| C10 | 4.01603347e−10 | 4.59920641e−11 |
| C12 | 8.47431965e−11 | 3.20362129e−11 |
| C14 | 9.19800647e−11 | −3.17268047e−10 |
| C16 | −1.8578156e−13 | −5.62526332e−14 |
| C18 | 1.88101838e−13 | −1.96202126e−13 |
| C20 | 3.44146806e−13 | 1.22222735e−12 |
| C21 | 1.15227647e−15 | 1.03457192e−16 |
| C23 | 3.0610184e−16 | 2.14948323e−16 |
| C25 | 1.98806887e−15 | 1.63315386e−15 |
| C27 | 3.999433e−16 | −1.33842851e−15 |
| C29 | −4.50764941e−18 | 1.51178198e−21 |

TABLE 3c-continued for FIG. 14

| Coefficient | M2 | M1 |
|---|---|---|
| C31 | −1.13520012e-18 | 6.18047072e-19 |
| C33 | 6.60379251e-18 | −1.12071413e-18 |
| C35 | −1.74979748e-18 | 1.14458337e-17 |
| C36 | 2.95341334e-21 | 1.98193002e-22 |
| C38 | 2.46269942e-21 | 7.84748626e-22 |
| C40 | 1.36636713e-20 | −5.27670983e-22 |
| C42 | 1.5532345e-20 | 2.44131348e-21 |
| C44 | −1.17688916e-21 | −6.42589825e-20 |
| C46 | −6.18840191e-23 | 2.95669522e-24 |
| C48 | −2.51133676e-23 | 2.00150274e-23 |
| C50 | 3.0813624e-23 | 4.43919683e-23 |
| C52 | −4.22236698e-23 | −1.64910744e-23 |
| C54 | 6.54578986e-23 | 4.32519192e-22 |
| C55 | 2.15112054e-25 | −9.51670115e-28 |
| C57 | 1.51154184e-25 | −1.86216769e-26 |
| C59 | 8.91248971e-26 | −4.4849987e-26 |
| C61 | 2.63763707e-25 | 4.12891153e-25 |
| C63 | 2.0115816e-25 | 2.46668429e-24 |
| C65 | 3.67076445e-25 | 7.34843371e-25 |
| C67 | −7.24836449e-28 | −5.59655462e-29 |
| C69 | −7.70098473e-28 | −7.11547944e-28 |
| C71 | −6.62633874e-28 | −3.24543794e-27 |
| C73 | 1.00156146e-27 | −1.97472208e-27 |
| C75 | 3.5914817e-27 | 3.23563967e-27 |
| C77 | 9.53490791e-28 | −9.64699548e-27 |
| C78 | −2.46263824e-30 | −2.12417285e-33 |
| C80 | 7.61167971e-32 | 2.7946236e-31 |
| C82 | 1.847629e-30 | 5.37219032e-31 |
| C84 | 2.28947077e-30 | −8.78841496e-30 |
| C86 | 2.84930933e-30 | −7.51226179e-29 |
| C88 | 9.09305572e-30 | −1.65688665e-28 |
| C90 | 1.09479255e-30 | −8.37782627e-29 |
| C92 | 0 | 7.67960769e-34 |
| C94 | 0 | 1.35391537e-32 |
| C96 | 0 | 9.00825477e-32 |
| C98 | 0 | 2.75308176e-31 |
| C100 | 0 | 1.2784506e-31 |
| C102 | 0 | −3.88159724e-31 |
| C104 | 0 | 2.07989087e-31 |
| C105 | 0 | 2.12255803e-37 |
| C107 | 0 | −1.4203208e-36 |
| C109 | 0 | 1.53126381e-36 |
| C111 | 0 | 2.08254131e-34 |
| C113 | 0 | 1.37075784e-33 |
| C115 | 0 | 5.11989116e-33 |
| C117 | 0 | 8.17509278e-33 |
| C119 | 0 | 3.7508084e-33 |
| C121 | 0 | −3.93652753e-39 |
| C123 | 0 | −9.55254973e-38 |
| C125 | 0 | −7.79678377e-37 |
| C127 | 0 | −3.53176885e-36 |
| C129 | 0 | −7.68950802e-36 |
| C131 | 0 | 1.02208584e-36 |
| C133 | 0 | 4.31237688e-36 |
| C135 | 0 | 4.47529766e-36 |
| C136 | 0 | −1.42825014e-42 |
| C138 | 0 | −7.8391962e-42 |
| C140 | 0 | −1.33765614e-40 |
| C142 | 0 | −1.8482486e-39 |
| C144 | 0 | −1.33522767e-38 |
| C146 | 0 | −5.18348707e-38 |
| C148 | 0 | −1.50711848e-37 |
| C150 | 0 | −1.3717832e-37 |
| C152 | 0 | −1.16771891e-37 |

TABLE 4a for FIG. 14

| Surface | DCX | DCY | DCZ |
|---|---|---|---|
| Stop plane | 0.00000000 | 0.00000000 | 0.00000000 |
| M8 | 0.00000000 | 0.00000000 | 764.87463088 |
| M7 | 0.00000000 | −158.53849802 | 113.21489784 |
| 0 | 0.00000000 | 0.00000000 | 764.87463088 |
| M6 | 0.00000000 | 86.34182753 | 1119.77576203 |
| M5 | 0.00000000 | 333.11529690 | 1400.28752103 |
| 0 | 0.00000000 | 537.84440339 | 1491.60942852 |
| M4 | 0.00000000 | 932.59477536 | 1667.69263218 |
| 0 | 0.00000000 | 500.55820963 | 1654.36759348 |
| M3 | 0.00000000 | −245.43161019 | 1631.35948722 |
| M2 | 0.00000000 | −754.40672617 | 1327.40237617 |
| Stop | 0.00000000 | −928.07425481 | 1016.19380735 |
| M1 | 0.00000000 | −1164.61229001 | 592.32260943 |
| Object | 0.00000000 | −1306.78021133 | 2164.11115577 |

TABLE 4b for FIG. 14

| Surface | TLA[deg] | TLB[deg] | TLC[deg] |
|---|---|---|---|
| Stop plane | −0.00000000 | 0.00000000 | −0.00000000 |
| M8 | −6.83676056 | 0.00000000 | −0.00000000 |
| M7 | −13.67352111 | 180.00000000 | 0.00000000 |
| 0 | −6.83676056 | 0.00000000 | −0.00000000 |
| M6 | 62.49377625 | 0.00000000 | −0.00000000 |
| M5 | 36.35045780 | 0.00000000 | 180.00000000 |
| 0 | −65.96015802 | 0.00000000 | −0.00000000 |
| M4 | −77.09678973 | 0.00000000 | −0.00000000 |
| 0 | −88.23342144 | 180.00000000 | 0.00000000 |
| M3 | 16.30599639 | 0.00000000 | 180.00000000 |
| M2 | 45.84102562 | 0.00000000 | −0.00000000 |
| Stop | 10.38881906 | 180.00000000 | 0.00000000 |
| M1 | −11.99751813 | 180.00000000 | 0.00000000 |
| Object | 0.16832671 | 0.00000000 | −0.00000000 |

TABLE 5 for FIG. 14

| Surface | Angle of incidence [deg] | Reflectivity |
|---|---|---|
| M8 | 6.80012089 | 0.66080000 |
| M7 | 0.10985487 | 0.66566394 |
| M6 | 76.22085727 | 0.82395733 |
| M5 | 77.73256209 | 0.84694751 |
| M4 | 11.29255719 | 0.65141292 |
| M3 | 75.41836224 | 0.81092646 |
| M2 | 74.78959663 | 0.80027009 |
| M1 | 17.00752705 | 0.63022445 |
| Overall transmis- | | 0.0818 |

TABLE 6 for FIG. 14

| X[mm] | Y[mm] | Z[mm] |
|---|---|---|
| 0.00000000 | 90.04906552 | 0.00000000 |
| 27.17672876 | 88.80427811 | 0.00000000 |
| 53.75800651 | 85.10509967 | 0.00000000 |
| 79.15063786 | 79.05636488 | 0.00000000 |
| 102.76711337 | 70.83014507 | 0.00000000 |
| 124.03168128 | 60.66119735 | 0.00000000 |
| 142.39118547 | 48.84039770 | 0.00000000 |
| 157.33281155 | 35.70702920 | 0.00000000 |
| 168.40917370 | 21.64080208 | 0.00000000 |
| 175.26797040 | 7.05330433 | 0.00000000 |
| 177.68020215 | −7.62340188 | 0.00000000 |
| 175.55982644 | −21.95350582 | 0.00000000 |
| 168.97007983 | −35.51873897 | 0.00000000 |

TABLE 6-continued for FIG. 14

| X[mm] | Y[mm] | Z[mm] |
|---|---|---|
| 158.11599180 | −47.94110633 | 0.00000000 |
| 143.32617194 | −58.90548689 | 0.00000000 |
| 125.02877485 | −68.18143822 | 0.00000000 |
| 103.72645526 | −75.64056189 | 0.00000000 |
| 79.97390644 | −81.26286617 | 0.00000000 |
| 54.35988096 | −85.12393131 | 0.00000000 |
| 27.49435009 | −87.35550229 | 0.00000000 |
| 0.00000000 | −88.08219552 | 0.00000000 |
| −27.49435009 | −87.35550229 | 0.00000000 |
| −54.35988096 | −85.12393131 | 0.00000000 |
| −79.97390644 | −81.26286617 | 0.00000000 |
| −103.72645526 | −75.64056189 | 0.00000000 |
| −125.02877485 | −68.18143822 | 0.00000000 |
| −143.32617194 | −58.90548689 | 0.00000000 |
| −158.11599180 | −47.94110633 | 0.00000000 |
| −168.97007983 | −35.51873897 | 0.00000000 |
| −175.55982644 | −21.95350582 | 0.00000000 |
| −177.68020215 | −7.62340188 | 0.00000000 |
| −175.26797040 | 7.05330433 | 0.00000000 |
| −168.40917370 | 21.64080208 | 0.00000000 |
| −157.33281155 | 35.70702920 | 0.00000000 |
| −142.39118547 | 48.84039770 | 0.00000000 |
| −124.03168128 | 60.66119735 | 0.00000000 |
| −102.76711337 | 70.83014507 | 0.00000000 |
| −79.15063786 | 79.05636488 | 0.00000000 |
| −53.75800651 | 85.10509967 | 0.00000000 |
| −27.17672876 | 88.80427811 | 0.00000000 |

The projection optical unit 24 has an image field dimension of two-times 13.0 mm in the x-direction and of 1.2 mm in the y-direction.

In the projection optical unit 24, an image-side numerical aperture is 0.55. A reduction factor is 4.00 ($\beta_x$) in the first imaging light plane xz and −8.00 ($\beta_y$) in the second imaging light plane yz. An object-side chief ray angle CRA is 4.9°. A pupil obscuration is at most 17%.

The projection optical unit 24 has an overall transmission of approximately 8%.

An object-image offset $d_{OIS}$ is approximately 1310 mm in the projection optical unit 24. The mirrors of the projection optical unit 24 can be accommodated in a cuboid having the xyz-edge lengths of 872 mm×2229 mm×1678 mm.

In the projection optical unit 24, the object plane 5 is tilted relative to the image plane 9 by 0.2° about the x-axis.

A working distance between the mirror M7 closest to the wafer and the image plane 9 is 80 mm. A mean wavefront aberration rms is approximately 7.7 mλ.

Some data of projection optical units described above are summarized again in tables I and II below. The respective first column serves to assign the data to the respective exemplary embodiment.

The following table I summarizes the optical parameters of numerical aperture (NA), image field extent in the x-direction (Fieldsize X), image field extent in the y-direction (Fieldsize Y), image field curvature (field curvature) and overall reflectivity or system transmission (transmission).

The following table II specifies the parameters "sequence of the mirror type" (mirror type order), "sequence of the mirror deflection effect" (mirror rotation order), "refractive power sequence in the xz-plane" (x power order) and "refractive power sequence in the yz-plane" (y power order). These sequences respectively start with the last mirror in the beam path, i.e. follow the reverse beam direction. The sequence "L0RRLLLR" relates to the deflection effect in the sequence M8 to M1, for example in the embodiment according to FIG. 2.

TABLE I

| FIG. | NA | FIELDSIZE X | FIELDSIZE Y | FIELD CURVATURE | TRANSMISSION % |
|---|---|---|---|---|---|
| 2 | 0.55 | 26 | 1 | 0.0123455 | 8.21 |
| 5 | 0.55 | 26 | 1.2 | 0.0123455 | 8.18 |
| 8 | 0.55 | 26 | 1.2 | 0.0123455 | 8.15 |
| 11 | 0.6 | 26 | 1 | 0.0123455 | 8.25 |
| 14 | 0.55 | 26 | 1.2 | 0.0123455 | 8.18 |

TABLE II

| FIG. | MIRROR TYPE ORDER | MIRROR ROTATION ORDER | xPOWER ORDER | yPOWER ORDER |
|---|---|---|---|---|
| 2 | NNGGNGGN | L0RRLLLR | +−−−+−−+ | +−+−++++ |
| 5 | NNGGNGGN | L0RRLLLR | +−−−+−−+ | +−++++++ |
| 8 | NNGGNGGN | L0RRLLLR | +−+−+−−+ | +−+−++++ |
| 11 | NNGGNGGN | L0RRLLLR | +−−−+−−+ | +−+−++++ |
| 14 | NNGGNGGN | L0RRLLLR | +−−−+−−+ | +−++++++ |

In the mirror type, the specification "N" relates to a normal incidence (NI) mirror and the designation "G" relates to a grazing incidence (GI) mirror. In the refractive power sequences, "+" represents a concave mirror surface and "−" represents a convex mirror surface. When comparing the refractive power sequences in x and y, it is possible to see that the embodiments according to FIGS. 2 and 11, for example, have identical refractive power sequences in x and y. The embodiments according to FIGS. 2, 5, 11, and 14 have identical refractive power sequences in x. The embodiments according to FIGS. 2, 8, and 11 have identical refractive power sequences in y. The embodiments according to FIGS. 5 and 14 have identical refractive power sequences in y. The refractive power sequence in x of the embodiment according to FIG. 8 differs from that of all other embodiments. Mirrors with different signs in the refractive power in x and y represent saddles or toric surfaces. To the extent that GI mirrors occur in one of the exemplary embodiments, these respectively occur at least in pairs, as can be gathered from the mirror type sequence in table II.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:
1. An imaging optical unit, comprising:
a plurality of mirrors configured to guide imaging light from an object field in an object plane into an image field in an image plane along an imaging light beam path,
wherein:
the object field is spanned by a first Cartesian object field coordinate along a first object field dimension;
the object field is spanned by a second Cartesian object field coordinate along a second object field dimension;
the first object field dimension is greater than the second object field dimension;
the plurality of mirrors comprises first, second and third mirrors;

the first mirror is configured so that, during use of the imaging optical unit, the imaging light is incident on the first mirror at an angle of incidence that is greater than 60°;

the second mirror is configured so that, during use of the imaging optical unit, the imaging light is incident on the second mirror at an angle of incidence that is greater than 60°;

the third mirror is configured so that, during use of the imaging optical unit, the imaging light is incident on the third mirror at an angle of incidence that is less than 45°;

the third mirror is between the first and second mirrors in the imaging light beam path;

the third mirror comprises a used reflection surface;

the used reflection surface of the third mirror has a first surface dimension along a first reflection surface coordinate;

the used reflection surface of the third mirror has a second surface dimension along a second reflection surface coordinate parallel to the second object field dimension; and the ratio of the first surface dimension to the second surface dimension is less than 4.5.

2. The imaging optical unit of claim 1, further comprising fourth and fifth mirrors,
wherein:
the fourth mirror is configured so that, during use of the imaging optical unit, the imaging light is incident on the fourth mirror at an angle of incidence that is greater than 60°; and
the fifth mirror is configured so that, during use of the imaging optical unit, the imaging light is incident on the fifth mirror at an angle of incidence that is greater than 60°.

3. The imaging optical unit of claim 2, wherein, for each of the first, second and fourth mirrors:
the mirror has a used reflection surface having a first surface dimension along a first reflection surface coordinate and a second surface dimension along a second reflection surface coordinate parallel to the second object field dimension; and
the aspect ratio of the first surface dimension to the second surface dimension is greater than one.

4. The imaging optical unit of claim 3, wherein a greatest diameter of a used reflection surface of each of the first, second, fourth and fifth mirrors is less than 400 mm.

5. The imaging optical unit of claim 4, wherein a greatest diameter of a used reflection surface of each mirror of the plurality of mirrors is less than 850 mm.

6. The imaging optical unit of claim 5, wherein the used reflection surfaces of the plurality of mirrors is accommodatable in a cuboid having an edge length in a direction of an image field coordinate that is less than 2000 mm, and the direction of the image field coordinate is parallel to the second Cartesian object field coordinate.

7. The imaging optical unit of claim 6, wherein the imaging optical unit has an image-side numerical aperture of at least 0.5.

8. The imaging optical unit of claim 1, further comprising fourth and fifth mirrors,
wherein:
the fourth mirror is configured so that, during use of the imaging optical unit, the imaging light is incident on the fourth mirror at an angle of incidence that is greater than 60°;

the fifth mirror is configured so that, during use of the imaging optical unit, the imaging light is incident on the fifth mirror at an angle of incidence that is greater than 60°; and a greatest diameter of a used reflection surface of each of the first, second, fourth and fifth mirrors is less than 400 mm.

9. The imaging optical unit of claim 1, further comprising fourth and fifth mirrors,
wherein:
the fourth mirror is configured so that, during use of the imaging optical unit, the imaging light is incident on the fourth mirror at an angle of incidence that is greater than 60°;

the fifth mirror is configured so that, during use of the imaging optical unit, the imaging light is incident on the fifth mirror at an angle of incidence that is greater than 60°; and a greatest diameter of a used reflection surface of each mirror of the plurality of mirrors is less than 850 mm.

10. The imaging optical unit of claim 1, further comprising fourth and fifth mirrors,
wherein:
the fourth mirror is configured so that, during use of the imaging optical unit, the imaging light is incident on the fourth mirror at an angle of incidence that is greater than 60°;

the fifth mirror is configured so that, during use of the imaging optical unit, the imaging light is incident on the fifth mirror at an angle of incidence that is greater than 60°;

the used reflection surfaces of the plurality of mirrors is accommodatable in a cuboid having an edge length in a direction of an image field coordinate that is less than 2000 mm; and the direction of the image field coordinate is parallel to the second Cartesian object field coordinate.

11. The imaging optical unit of claim 1, further comprising fourth and fifth mirrors,
wherein:
the fourth mirror is configured so that, during use of the imaging optical unit, the imaging light is incident on the fourth mirror at an angle of incidence that is greater than 60°;

the fifth mirror is configured so that, during use of the imaging optical unit, the imaging light is incident on the fifth mirror at an angle of incidence that is greater than 60°; and the imaging optical unit has an image-side numerical aperture of at least 0.5.

12. The imaging optical unit of claim 1, wherein:
a greatest diameter of a used reflection surface of each mirror of the plurality of mirrors is less than 850 mm;
the used reflection surfaces of the plurality of mirrors is accommodatable in a cuboid having an edge length in a direction of an image field coordinate that is less than 2000 mm; and
the direction of the image field coordinate is parallel to the second Cartesian object field coordinate.

13. The imaging optical unit of claim 1, further comprising a fourth mirror,
wherein:
the fourth mirror is configured so that, during use of the imaging optical unit, the imaging light is incident on the fourth mirror at an angle of incidence that is greater than 60°; and for each of the first, second and fourth mirrors:
the mirror has a used reflection surface having a first surface dimension along a first reflection surface coordinate and a surface dimension along a second reflection surface coordinate parallel to the second object field dimension; and
the aspect ratio of the first surface dimension to the second surface dimension is greater than one.

14. The imaging optical unit of claim 1, wherein a greatest diameter of a used reflection surface of each of the first and second mirrors is less than 400 mm.

15. The imaging optical unit of claim 1, wherein a greatest diameter of a used reflection surface of each mirror of the plurality of mirrors is less than 850 mm.

16. The imaging optical unit of claim 1, wherein the used reflection surfaces of the plurality of mirrors is accommodatable in a cuboid having an edge length in a direction of an image field coordinate that is less than 2000 mm, and the direction of the image field coordinate is parallel to the second Cartesian object field coordinate.

17. The imaging optical unit of claim 1, wherein the imaging optical unit has an image-side numerical aperture of at least 0.5.

18. An optical system, comprising:
an imaging optical unit according to claim 1; and
an illumination optical unit configured to illuminate the object field with illumination light.

19. An apparatus, comprising:
an imaging optical unit according to claim 1; and
an illumination optical unit configured to illuminate the object field with illumination light; and
a light source configured to provide the illumination light,
wherein the apparatus is a projection exposure apparatus.

20. A method of using a projection exposure apparatus comprising an illumination optical unit and an imaging optical unit, the method comprising:
using the illumination optical unit to illuminate a structure of a reticle; and
using the projection optical unit to project the illuminated structure of the reticle onto a light-sensitive material,
wherein the imaging optical unit is an imaging optical unit according to claim 1.

* * * * *